(12) United States Patent
Takeshita et al.

(10) Patent No.: US 8,486,605 B2
(45) Date of Patent: Jul. 16, 2013

(54) POSITIVE RESIST COMPOSITION AND METHOD OF FORMING RESIST PATTERN

(75) Inventors: Masaru Takeshita, Kawasaki (JP); Yasuhiro Yoshii, Kawasaki (JP); Jiro Yokoya, Kawasaki (JP); Hirokuni Saito, Kawasaki (JP); Tsuyoshi Nakamura, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 399 days.

(21) Appl. No.: 12/691,561

(22) Filed: Jan. 21, 2010

(65) Prior Publication Data

US 2010/0190108 A1 Jul. 29, 2010

(30) Foreign Application Priority Data

Jan. 26, 2009 (JP) .............................. P2009-014712

(51) Int. Cl.
*G03F 7/039* (2006.01)
*G03F 7/095* (2006.01)
*G03F 7/20* (2006.01)
*G03F 7/30* (2006.01)

(52) U.S. Cl.
USPC ........ 430/270.1; 430/311; 430/312; 430/326; 430/910; 430/914

(58) Field of Classification Search
None
See application file for complete search history.

(56) References Cited

U.S. PATENT DOCUMENTS

| | | | |
|---|---|---|---|
| 5,908,730 A | 6/1999 | Nitta et al. | |
| 5,945,517 A | 8/1999 | Nitta et al. | |
| 6,153,733 A | 11/2000 | Yukawa et al. | |
| 2004/0110085 A1 | 6/2004 | Iwai et al. | |
| 2009/0075204 A1* | 3/2009 | Takeshita et al. | 430/285.1 |
| 2009/0098489 A1 | 4/2009 | Iwai et al. | |
| 2009/0181325 A1* | 7/2009 | Takeshita | 430/285.1 |

FOREIGN PATENT DOCUMENTS

| | | |
|---|---|---|
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2003-241385 | 8/2003 |
| JP | A-2005-221552 | 8/2005 |
| JP | A-2005-234326 | 9/2005 |
| JP | A-2005-255742 | 9/2005 |
| JP | A-2006-139218 | 6/2006 |
| JP | A-2006-171118 | 6/2006 |
| JP | A-2008-003540 | 1/2008 |
| WO | WO 2004/074242 | 9/2004 |
| WO | WO 2007/138893 A1 * | 12/2007 |

OTHER PUBLICATIONS

Ebihara et al., Beyond $k_1$=0.25 lithography : 70nm L/S patterning using KrF scanners, Proceedings of SPIE, vol. 5256, 23rd Annual BACUS Symposium on Photomask Technology, pp. 985 to 994, (2003).

Borodovsky, Yan, "Marching to the beat of Moore's Law," Proceedings of SPIE, vol. 6153, pp. 615301-1 to 615301-19, (2006).

Notice of Allowance Issued on Mar. 5, 2013 in Japanese Patent Application No. 2009-014712.

* cited by examiner

*Primary Examiner* — Sin J. Lee

(74) *Attorney, Agent, or Firm* — Knobbe Martens Olson & Bear LLP

(57) ABSTRACT

A positive resist composition including:
  a base material component (A) which exhibits increased solubility in an alkali developing solution under the action of acid; and
  an acid generator component (B) which generates acid upon exposure; dissolved in an organic solvent (S),
  wherein the base material component (A) includes a resin component (A1) having 4 types of specific structural units, and
  the organic solvent (S) includes from 60 to 99% by weight of an alcohol-based organic solvent (S1) and from 1 to 40% by weight of at least one organic solvent (S2) selected from the group consisting of propylene glycol monomethyl ether acetate, propylene glycol monomethyl ether and cyclohexanone.

8 Claims, No Drawings

POSITIVE RESIST COMPOSITION AND METHOD OF FORMING RESIST PATTERN

BACKGROUND OF THE INVENTION

1. Field of the Invention

The present invention relates to a positive resist composition and a method for forming a resist pattern using the same.

Priority is claimed on Japanese Patent Application No. 2009-014712, filed Jan. 26, 2009, the contents of which is incorporated herein by reference.

2. Description of Related Art

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film. A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are now starting to be introduced in mass production. Furthermore, research is also being conducted into lithography techniques that use exposure light source having a wavelength shorter than these excimer lasers, such as $F_2$ excimer lasers, electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources. As a resist material which satisfies these conditions, a chemically amplified resist is used, which includes a base resin that exhibits a changed solubility in an alkali developing solution under the action of acid and an acid generator component that generates acid upon exposure dissolved in an organic solvent. For example, a chemically amplified positive resist includes, as a base resin, a resin that exhibits increased solubility in an alkali developing solution under the action of acid, and an acid generator component, dissolved in an organic solvent. In the formation of a resist pattern, when acid is generated from the acid generator upon exposure, the exposed portions become soluble in an alkali developing solution.

Until recently, polyhydroxystyrene (PHS) or derivative resins thereof in which the hydroxyl groups are protected with acid dissociable, dissolution inhibiting groups (PHS-based resins), which exhibit high transparency to a KrF excimer laser (248 nm), have been used as the base resin component of chemically amplified resists. However, because PHS-based resins contain aromatic rings such as benzene rings, their transparency is inadequate for light with wavelengths shorter than 248 nm, such as light of 193 nm. Accordingly, chemically amplified resists that use a PHS-based resin as the base resin component suffer from low levels of resolution in processes that use light of 193 nm.

As a result, resins that contain structural units derived from (meth)acrylate esters within the main chain (acrylic resins) are now widely used as base resins for resists that use ArF excimer laser lithography, as they exhibit excellent transparency in the vicinity of 193 nm (for example, see Patent Document 1).

Further, resist compositions in which the aforementioned acrylic resins are dissolved in an organic solvent, such as propylene glycol monomethyl ether acetate (PGMEA), propylene glycol monomethyl ether (PGME), cyclohexanone (CH), 2-heptanone and ethyl lactate (EL) are now widely used as resists that use ArF excimer laser lithography.

In the meantime, as the miniaturization of resist patterns has progressed in recent years, a double patterning process has been proposed, as one of the lithography techniques in order to further improve the resolution, in which a resist pattern is formed by conducting a patterning process twice or more (for example, refer to Non-Patent Documents 1 and 2).

According to the double patterning process, for example, a first resist pattern is formed on a substrate by forming a resist film using a first resist composition and patterning the resist film, followed by formation of a resist film using a second resist composition on the substrate on which the first resist pattern is formed, and patterning of the resist film. As a result, a resist pattern can be formed with a higher level of resolution than that of the resist pattern formed through one single patterning process.

However, in general, in the double patterning process, the first resist pattern is likely to be adversely affected during the application of the second resist composition. That is, problems such as the following arise. For example, a portion of, or all of the first resist pattern is dissolved by the solvent for the second resist composition, thereby causing thickness loss or the like, which deteriorates the shape of the resist pattern. Moreover, so-called mixing occurs in which the first resist pattern and the second resist composition dissolve within each other, making it impossible to form a resist pattern with an excellent shape.

It is thought that such problems can be solved by using a resist composition that uses an organic solvent in which the first resist pattern hardly dissolves, as the second resist composition. Accordingly, when using a positive resist composition as the first resist composition, a negative resist composition hitherto has been widely used as the second resist composition which has a low compatibility with the positive resist composition and which also uses an organic solvent, such as an alcohol-based organic solvent, thus providing excellent solubility for the resist materials.

DOCUMENTS OF THE RELATED ART

Patent Documents

[Patent Document 1] Japanese Unexamined Patent Application, First Publication No. 2003-241385

Non-Patent Documents

[Non-Patent Document 1] Proceedings of SPIE (U.S.), vol. 5256, pp. 985-994 (2003)

[Non-Patent Document 2] Proceedings of SPIE (U.S.), vol. 6153, pp. 1-19 (2006)

SUMMARY OF THE INVENTION

On the other hand, if a positive resist composition is used as the second resist composition as well as the first resist composition, the first resist pattern dissolves when a conventional positive resist composition is directly applied onto the first resist pattern. Therefore, it is necessary to protect the first resist pattern by using a freezing agent or the like, which results in the increased number of steps and poor workability as compared to the case where a negative resist composition is used.

As a countermeasure against such problems, the use of a positive resist composition as the second resist composition which uses an alcohol-based organic solvent has been considered.

However, when an alcohol-based organic solvent is used as an organic solvent for the conventional positive resist composition, resist materials such as the aforementioned acrylic resins exhibit unsatisfactory solubility in the solvent and precipitate over time, which results in the problems such as the deterioration of lithography properties.

Further, in order to perform a patterning process for forming fine resist patterns with high accuracy, one of the important challenges when forming a resist film on a substrate is to make the film thickness uniform.

However, the conventional positive resist composition in which an alcohol-based organic solvent is used as an organic solvent spreads poorly on a substrate surface, as compared to the positive resist composition in which, for example, a mixed solvent of PGMEA and PGME is used as an organic solvent. For this reason, problems such as the following arise. For example, it is required to make the rotation time of an applicator longer than that required in conventional cases, and streaks are formed on a resist film as a result of the application. According to the studies conducted by the present inventors, it has been confirmed that these streaks formed as a result of the application cause non-uniformity in the film thickness of a resist film.

The present invention takes the above circumstances into consideration, with an object of providing a positive resist composition which exhibits excellent solubility in an organic solvent and coatability to a substrate, and a method of forming a resist pattern that uses the positive resist composition.

For solving the above-mentioned problems, the present invention employs the following aspects.

Specifically, a first aspect of the present invention is a positive resist composition including: a base material component (A) which exhibits increased solubility in an alkali developing solution under the action of acid; and an acid generator component (B) which generates acid upon exposure; dissolved in an organic solvent (S), wherein the base material component (A) includes a resin component (A1) having a structural unit (a0) represented by general formula (a0-1) shown below, a structural unit (a1) derived from an acrylate ester containing an acid dissociable, dissolution inhibiting group, a structural unit (a2) derived from an acrylate ester containing a lactone-containing cyclic group and a structural unit (a5) represented by general formula (a5-1) shown below, and the organic solvent (S) includes an alcohol-based organic solvent (S1) and at least one organic solvent (S2) selected from the group consisting of propylene glycol monomethyl ether acetate, propylene glycol monomethyl ether and cyclohexanone, with the proviso that the amount of the component (S1) is from 60 to 99% by weight and the amount of the component (S2) is from 1 to 40% by weight within the component (S).

[Chemical Formula 1]

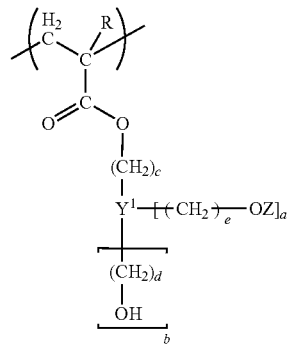

(a0-1)

[In formula (a0-1), R represents a hydrogen atom, a lower alkyl group of 1 to 5 carbon atoms or a halogenated lower alkyl group of 1 to 5 carbon atoms; $Y^1$ represents an aliphatic hydrocarbon group which may have a substituent; Z represents a monovalent organic group; a represents an integer of 1 to 3, and b represents an integer of 0 to 2, with the provision that a+b=1 to 3; and each of c, d and e independently represents an integer of 0 to 3.]

[Chemical Formula 2]

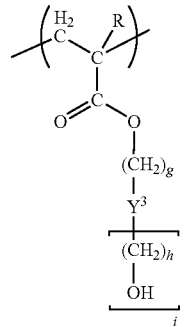

(a 5-1)

[In formula (a5-1), R represents a hydrogen atom, a lower alkyl group of 1 to 5 carbon atoms or a halogenated lower alkyl group of 1 to 5 carbon atoms; $Y^3$ represents an aliphatic hydrocarbon group which may have a substituent; each of g and h independently represents an integer of 0 to 3; and i represents an integer of 1 to 3.]

A second aspect of the present invention is a method of forming a resist pattern, including: applying a positive resist composition on a substrate to form a first resist film on the substrate; subjecting the first resist film to selective exposure and alkali developing to form a first resist pattern; applying the positive resist composition of the first aspect on the substrate on which the first resist pattern is formed to form a second resist film; and subjecting the second resist film to selective exposure and alkali developing to form a resist pattern.

In the present description and claims, the term "alkyl group" includes linear, branched or cyclic monovalent saturated hydrocarbon groups, unless otherwise specified.

The term "alkylene group" includes linear, branched or cyclic divalent saturated hydrocarbon groups, unless otherwise specified.

A "lower alkyl group" is an alkyl group of 1 to 5 carbon atoms.

A "halogenated alkyl group" is a group in which a part or all of the hydrogen atoms of an alkyl group are substituted with halogen atoms. Examples of the halogen atom include a fluorine atom, a chlorine atom, a bromine atom and an iodine atom.

A "halogenated lower alkyl group" is a group in which a part or all of the hydrogen atoms of an alkyl group of 1 to 5 carbon atoms are substituted with halogen atoms. Examples of the halogen atom include a fluorine atom, a chlorine atom, a bromine atom and an iodine atom.

The term "aliphatic" is a relative concept used in relation to the term "aromatic", and defines a group or compound that has no aromaticity.

The term "structural unit" refers to a monomer unit that contributes to the formation of a polymeric compound (namely, a polymer or copolymer).

The term "exposure" is used as a general concept that includes irradiation with any form of radiation.

The term "(meth)acrylic acid" is a generic term that includes either or both of acrylic acid having a hydrogen atom bonded to the α-position and methacrylic acid having a methyl group bonded to the α-position.

The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

According to the present invention, there are provided a positive resist composition which exhibits excellent solubility in an organic solvent and coatability to a substrate, and a method of forming a resist pattern that uses the positive resist composition.

PREFERRED EMBODIMENT

<<Positive Resist Composition>>

The positive resist composition of the present invention (hereinafter, frequently reffered to as simply "resist composition") includes a base material component (A) (hereafter, referred to as "component (A)") which exhibits increased solubility in an alkali developing solution under the action of acid and an acid generator component (B) which generates acid upon exposure, dissolved in an organic solvent (S).

When this positive resist composition is subjected to irradiation (exposure), acid is generated from the acid generator, and the action of that acid causes an increase in the solubility of the component (A) in an alkali developing solution. As a result, in the formation of a resist pattern, when a resist film obtained using the positive resist composition is subjected to selective exposure, the solubility of the exposed portions of the resist film in the alkali developing solution increases, whereas the solubility of the unexposed portions in the alkali developing solution remains unchanged, meaning of alkali developing can then be used to form a resist pattern.

<Component (A)>

In the present invention, the term "base material component" refers to an organic compound capable of forming a film.

As the base material component, an organic compound having a molecular weight of 500 or more can be preferably used.

When the organic compound has a molecular weight of 500 or more, the film-forming ability is improved, and a resist pattern of nano level can be readily formed.

The "organic compound having a molecular weight of 500 or more" which can be used as a base material component is broadly classified into non-polymers and polymers.

In general, as a non-polymer, any of those which have a molecular weight in the range of 500 to less than 4,000 is used. Hereafter, a non-polymer having a molecular weight in the range of 500 to less than 4,000 is referred to as a low molecular weight compound.

In general, as a polymer, any of those which have a molecular weight of 2,000 or more is used. Hereafter, a polymer having a molecular weight of 2,000 or more is referred to as a polymeric compound. With respect to a polymeric compound, the "molecular weight" is the weight average molecular weight in terms of the polystyrene equivalent value determined by gel permeation chromatography (GPC). Hereafter, a polymeric compound is frequently referred to simply as a "resin".

In the positive resist composition of the present invention, the component (A) includes a resin component (A1) (hereafter, referred to as "component (A1)") having a structural unit (a0) represented by the aforementioned general formula (a0-1), a structural unit (a1) derived from an acrylate ester containing an acid dissociable, dissolution inhibiting group, a structural unit (a2) derived from an acrylate ester containing a lactone-containing cyclic group and a structural unit (a5) represented by the aforementioned general formula (a5-1).

In the present descriptions and the claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. As the substituent, a lower alkyl group or a halogenated lower alkyl group can be mentioned.

With respect to the "structural unit derived from an acrylate ester", the "α-position (the carbon atom on the α-position)" refers to the carbon atom having the carbonyl group bonded thereto, unless specified otherwise.

In the acrylate ester, specific examples of the lower alkyl group for the substituent at the α-position include linear or branched lower alkyl groups such as a methyl group, an ethyl group, a propyl group, an isopropyl group, a n-butyl group, an isobutyl group, a tert-butyl group, a pentyl group, an isopentyl group, and a neopentyl group.

As the halogenated lower alkyl group, the lower alkyl groups specifically mentioned above in which at least one hydrogen atom has been substituted with a halogen atom can be used.

In the present invention, it is preferable that a hydrogen atom, a lower alkyl group or a halogenated lower alkyl group, and more preferably a hydrogen atom, a lower alkyl group or a fluorinated lower alkyl group, be bonded to the α-position of the acrylate ester. In terms of industrial availability, a hydrogen atom or a methyl group is particularly desirable.

[Component (A1)]

In the present invention, the component (A1) is a resin component including the structural units (a0), (a1), (a2) and (a5).

(Structural Unit (a0))

The structural unit (a0) is a structural unit represented by the aforementioned general formula (a0-1). When the component (A1) includes the structural unit (a0), the compatibility of the component (A1) with various organic solvents is improved, thereby improving the solubility of the positive resist composition in an organic solvent.

In the aforementioned general formula (a0-1), R represents a hydrogen atom, a lower alkyl group of 1 to 5 carbon atoms or a halogenated lower alkyl group of 1 to 5 carbon atoms.

The lower alkyl group and halogenated lower alkyl group for R are the same as the lower alkyl group and halogenated lower alkyl group which may be bonded to the α-position of the aforementioned acrylate ester.

As R, a hydrogen atom, a lower alkyl group or a fluorinated lower alkyl group is preferable, and a hydrogen atom or a methyl group is particularly desirable in terms of industrial availability.

In general formula (a0-1) above, $Y^1$ represents an aliphatic hydrocarbon group which may have a substituent.

The aliphatic hydrocarbon group for $Y^1$ may be either a saturated aliphatic hydrocarbon group, or an unsaturated aliphatic hydrocarbon group. Further, the aliphatic hydrocarbon group may be any of linear, branched or cyclic.

In the present descriptions and the claims, the term "aliphatic hydrocarbon group" refers to an aliphatic hydrocarbon group that has no aromaticity.

Further, the expression "may have a substituent" means that a part of the carbon atoms constituting the aliphatic hydrocarbon group may be substituted with a substituent group containing a hetero atom, or a part or all of the hydrogen atoms constituting the aliphatic hydrocarbon group may be substituted with a substituent group containing a hetero atom.

As the "hetero atom" for $Y^1$, there is no particular limitation as long as it is an atom other than a carbon atom and a hydrogen atom. Examples of hetero atoms include a halogen atom, an oxygen atom, a sulfur atom and a nitrogen atom.

Examples of halogen atoms include a fluorine atom, a chlorine atom, an iodine atom and a bromine atom.

The substituent group containing a hetero atom may consist solely of the aforementioned hetero atom, or may be a group containing the aforementioned hetero atom as well as an atom other than the aforementioned hetero atom.

Specific examples of the "substituent group containing a hetero atom" with which a part of the carbon atoms constituting the aliphatic hydrocarbon group is substituted include —O—, —C(=O)—O—, —C(=O)—, —O—C(=O)—O—, —C(=O)—NH—, —NR$^{04}$— (wherein R$^{04}$ represents an alkyl group, an acyl group or the like), —S—, —S(=O)$_2$— and —S(=O)$_2$—O—.

In the group —NR$^{04}$—, R$^{04}$ represents an alkyl group, an acyl group or the like, and the substituent group (namely, an alkyl group, an acyl group or the like) preferably has 1 to 10 carbon atoms, more preferably 1 to 8 carbon atoms, and most preferably 1 to 5 carbon atoms.

When the aliphatic hydrocarbon group is cyclic, the aliphatic hydrocarbon group may contain the "substituent group containing a hetero atom" in the ring structure.

Examples of the substituent group for substituting a part or all of the hydrogen atoms that constitute the aliphatic hydrocarbon group include an alkoxy group, a halogen atom, a halogenated alkyl group, a hydroxyl group, an oxygen atom (=O), a cyano group and an alkyl group.

The aforementioned alkoxy group is preferably an alkoxy group having 1 to 5 carbon atoms, more preferably a methoxy group, an ethoxy group, a n-propoxy group, an iso-propoxy group, a n-butoxy group or a tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Examples of the aforementioned halogenated alkyl group include a group in which a part or all of the hydrogen atoms within an alkyl group of 1 to 5 carbon atoms (e.g., a methyl group, an ethyl group, a propyl group, a n-butyl group or a tert-butyl group) have been substituted with the aforementioned halogen atoms.

Examples of the alkyl group include an alkyl group of 1 to 5 carbon atoms (namely, a lower alkyl group), such as a methyl group, an ethyl group, a propyl group, a n-butyl group or a tert-butyl group.

When $Y^1$ is a linear or branched aliphatic hydrocarbon group, the aliphatic hydrocarbon group preferably has 1 to 10 carbon atoms, more preferably 1 to 5 carbon atoms, and most preferably 1 to 3 carbon atoms. More specifically, a chain-like alkylene group can be used favorably.

When $Y^1$ is a cyclic aliphatic hydrocarbon group (namely, a aliphatic cyclic group), the basic ring of the aliphatic cyclic group exclusive of substituents (aliphatic ring) is not limited to be constituted from only carbon and hydrogen (not limited to hydrocarbon rings), and may include a hetero atom, such as an oxygen atom, or a group containing a hetero atom as well as an atom other than the hetero atom in the ring skeleton (aliphatic ring).

Further, the "hydrocarbon ring" may be either saturated or unsaturated, but in general, the hydrocarbon ring is preferably saturated.

The aliphatic cyclic group may be either a polycyclic group or a monocyclic group. Examples of aliphatic cyclic groups include groups in which two or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated alkyl group. Specific examples include groups in which two or more hydrogen atoms have been removed from a monocycloalkane such as cyclopentane and cyclohexane; and groups in which two or more hydrogen atoms have been removed from a polycycloalkane such as adamantane, norbornane, isobornane, tricyclodecane or tetracyclododecane.

Further, examples of the aliphatic cyclic groups also include groups in which two or more hydrogen atoms have been removed from tetrahydrofuran or tetrahydropyran which may or may not be substituted with a lower alkyl group, a fluorine atom or a fluorinated alkyl group.

The aliphatic cyclic group within the structural unit (a0) is preferably a polycyclic group, and a group in which two or more hydrogen atoms have been removed from adamantane is particularly desirable.

In general formula (a0-1) above, Z represents a monovalent organic group. In the present description and the claims, the term "organic group" refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for Z, for example, an aliphatic hydrocarbon group which may have a substituent, an aromatic hydrocarbon group which may have a substituent, and a group represented by formula -Q$^5$-R$^5$ (in the formula, Q$^5$ represents a divalent linking group, and R$^5$ represents an aliphatic hydrocarbon group which may have a substituent or an aromatic hydrocarbon group which may have a substituent) can be used. Hereafter, "monovalent saturated hydrocarbon groups" are frequently referred to as "alkyl groups".

In the organic group for Z, examples of the aliphatic hydrocarbon group include a linear, branched or cyclic, saturated hydrocarbon group of 1 to 20 carbon atoms and a linear or branched, aliphatic unsaturated hydrocarbon group of 2 to 20 carbon atoms.

Examples of linear alkyl groups include a methyl group, an ethyl group, a propyl group, a butyl group, a pentyl group, a hexyl group, a heptyl group, an octyl group, a nonyl group and a decanyl group.

Examples of branched alkyl groups include a 1-methylethyl group, a 1-methylpropyl group, a 2-methylpropyl group, a 1-methybutyl group, a 2-methylbutyl group, a 3-methylbutyl group, an 1-ethylbutyl group, an 2-ethylbutyl group, a 1-methylpentyl group, a 2-methylpentyl group, a 3-methylpentyl group and a 4-methylpentyl group.

The linear or branched alkyl group may have a substituent. Examples of the substituent include an alkoxy group, a halogen atom, a halogenated alkyl group, a hydroxyl group, an oxygen atom (=O), a cyano group and a carboxy group.

The alkoxy group as the substituent for the linear or branched alkyl group is preferably an alkoxy group having 1 to 5 carbon atoms, more preferably a methoxy group, an ethoxy group, a n-propoxy group, an iso-propoxy group, an n-butoxy group or a tert-butoxy group, and most preferably a methoxy group or an ethoxy group.

Examples of the halogen atom as the substituent for the linear or branched alkyl group include a fluorine atom, a chlorine atom, a bromine atom and an iodine atom, and a fluorine atom is preferable.

Examples of the halogenated alkyl group as the substituent for the linear or branched alkyl group include a group in which a part or all of the hydrogen atoms within an alkyl group of 1 to 5 carbon atoms (preferably, a methyl group, an ethyl group, a propyl group, a n-butyl group or a tert-butyl group) have been substituted with the aforementioned halogen atoms.

The cyclic alkyl group may be either a polycyclic group or a monocyclic group, and cyclic saturated hydrocarbon groups of 3 to 20 carbon atoms can be mentioned. Examples thereof include groups in which one hydrogen atom has been removed from a monocycloalkane or a polycycloalkane such as a bicycloalkane, tricycloalkane or tetracycloalkane. Specific examples include groups in which one hydrogen atom has been removed from a monocycloalkane such as a cyclopentane, a cyclohexane, a cycloheptane or a cyclooctane; and groups in which one hydrogen atom has been removed from a polycycloalkane such as an adamantane, a norbornane, an isobornane, a tricyclodecane or a tetracyclododecane.

The cyclic alkyl group may have a substituent. For example, a part of the carbon atoms constituting the ring within the cyclic alkyl group may be substituted with a hetero atom, or a hydrogen atom bonded to the ring within the cyclic alkyl group may be substituted with a substituent.

In the former example, a heterocycloalkane in which part of the carbon atoms constituting the ring within the aforementioned monocycloalkane or polycycloalkane has been substituted with a hetero atom such as an oxygen atom, a sulfur atom or a nitrogen atom, and one or more hydrogen atom has been removed therefrom, can be used. Further, the ring may contain an ester bond (—C(=O)—O—) in the structure. Specific examples include lactone-containing monocyclic groups such as groups in which one hydrogen atom has been removed from γ-butyrolactone, and lactone-containing polycyclic groups such as groups in which one hydrogen atom has been removed from a lactone ring-containing bicycloalkane, tricycloalkane or tetracycloalkane.

As the substituent in the latter example, the same groups as those which the linear or branched alkyl group may have as a substituent or alkyl groups of 1 to 5 carbon atoms can be used.

Examples of linear unsaturated hydrocarbon groups include a vinyl group, a propenyl group (an allyl group) and a butynyl group.

Examples of branched unsaturated hydrocarbon groups include a 1-methylpropenyl group and a 2-methylpropenyl group.

The linear or branched unsaturated hydrocarbon group may have a substituent. As the substituent, the same groups as those which the linear or branched alkyl group may have as a substituent can be used.

In the organic group for Z, an aromatic hydrocarbon group is a hydrocarbon group having an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms within a substituent(s) is not included in the number of carbon atoms of the aromatic hydrocarbon group.

The aromatic organic group may be a group having an aromatic hydrocarbon ring in which the aromatic ring skeleton is composed solely of carbon atoms, or a group having an aromatic heterocycle in which the aromatic ring skeleton includes a hetero atom other than a carbon atom.

Specific examples of the aromatic hydrocarbon group include aryl groups in which one hydrogen atom has been removed from an aromatic hydrocarbon ring such as a phenyl group, a biphenyl group, a fluorenyl group, a naphthyl group, an anthryl group or a phenanthryl group; heteroaryl groups in which some of the carbon atoms that constitute a ring of one of the above aryl groups have been substituted with a hetero atom such as an oxygen atom, a sulfur atom or a nitrogen atom; and arylalkyl groups such as a benzyl group, a phenethyl group, a 1-naphthylmethyl group, a 2-naphthylmethyl group, a 1-naphthylethyl group or a 2-naphthylethyl group. The number of carbon atoms within the alkyl chain of the arylalkyl group is preferably from 1 to 4, more preferably from 1 to 2, and is most preferably 1.

The aromatic hydrocarbon group may have a substituent. For example, some of the carbon atoms that constitute the aromatic ring of the aromatic hydrocarbon group may be substituted with a hetero atom, or a hydrogen atom bonded to the aromatic ring of the aromatic hydrocarbon group may be substituted with a substituent.

In the former example, a heteroaryl group in which a part of the carbon atoms constituting the ring within the aforementioned aryl group has been substituted with a hetero atom such as an oxygen atom, a sulfur atom or a nitrogen atom, and a heteroarylalkyl group in which a part of the carbon atoms constituting the ring within the aforementioned arylalkyl group has been substituted with the aforementioned hetero atom can be used.

In the latter example, as the substituent for the aromatic hydrocarbon group, an alkyl group, an alkoxy group, a halogen atom, a halogenated alkyl group, a hydroxyl group, an oxygen atom (=O), an acetyl group or the like can be used.

Examples of the alkyl groups, alkoxy groups, halogen atoms and halogenated alkyl groups as the substituents for the aromatic hydrocarbon group include the same groups as those mentioned above which the linear or branched alkyl group may have as a substituent, and alkyl groups of 1 to 5 carbon atoms.

In the group represented by the aforementioned formula -$Q^5$-$R^5$, $Q^5$ represents a divalent linking group, and $R^5$ represents an aliphatic hydrocarbon group which may have a substituent or an aromatic hydrocarbon group which may have a substituent.

Preferred examples of the divalent linking group for $Q^5$ include a divalent hydrocarbon group which may have a substituent, and a divalent linking group containing a hetero atom.

Divalent Hydrocarbon Group which May have a Substituent

With respect to $Q^5$, the description that the hydrocarbon group may "have a substituent" means that some or all of the hydrogen atoms of the hydrocarbon group may be substituted with groups or atoms other than hydrogen atoms.

The hydrocarbon group may be either an aliphatic hydrocarbon group, or an aromatic hydrocarbon group.

The aliphatic hydrocarbon group may be either saturated or unsaturated, but in general, the aliphatic hydrocarbon group is preferably saturated.

Specific examples of the aliphatic hydrocarbon groups include a linear or branched aliphatic hydrocarbon group and an aliphatic hydrocarbon group containing a ring in the structure thereof.

The linear or branched aliphatic hydrocarbon group preferably has 1 to 10 carbon atoms, more preferably 1 to 8 carbon atoms, still more preferably 1 to 5 carbon atoms, and most preferably 1 to 2 carbon atoms.

As the linear aliphatic hydrocarbon group, a linear alkylene group is preferable, and specific examples include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferable, and specific examples include alkylalkylene groups, e.g., alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; alkylethylene groups such as —$CH(CH_3)CH_2$—, —$CH(CH_3)CH(CH_3)$—, —$C(CH_3)_2CH_2$—, and —$CH(CH_2CH_3)CH_2$—, —$C(CH_2CH_3)_2$—$CH_2$—; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of substituents include a fluorine atom, a fluorinated lower alkyl group of 1 to 5 carbon atoms which is substituted by a fluorine atom, and an oxygen atom (=O).

As examples of the aliphatic hydrocarbon group containing a ring in the structure thereof, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group.

As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent.

Examples of substituents include a lower alkyl group of 1 to 5 carbon atoms, a fluorine atom, a fluorinated lower alkyl group of 1 to 5 carbon atoms which is substituted by a fluorine atom, and an oxygen atom (=O).

Examples of the aromatic hydrocarbon group include a divalent aromatic hydrocarbon group in which one hydrogen atom has been removed from a benzene nucleus of a monovalent aromatic hydrocarbon group such as a phenyl group, a biphenyl group, a fluorenyl group, a naphthyl group, an anthryl group or a phenanthryl group; an aromatic hydrocarbon group in which a part of the carbon atoms constituting the ring of the aforementioned divalent aromatic hydrocarbon group has been substituted with a hetero atom such as an oxygen atom, a sulfur atom or a nitrogen atom; and an aromatic hydrocarbon group in which one hydrogen atom has been removed from a benzene nucleus of an arylalkyl group such as a benzyl group, a phenethyl group, a 1-naphthylmethyl group, a 2-naphthylmethyl group, a 1-naphthylethyl group or a 2-naphthylethyl group.

The aromatic hydrocarbon group may or may not have a substituent. Examples of substituents include a lower alkyl group of 1 to 5 carbon atoms, a fluorine atom, a fluorinated lower alkyl group of 1 to 5 carbon atoms which is substituted by a fluorine atom, and an oxygen atom (=O).

Divalent Linking Group Containing a Hetero Atom

With respect to $Q^5$, a hetero atom in the expression "divalent linking group containing a hetero atom" refers to an atom other than a carbon atom or hydrogen atom, and examples thereof include an oxygen atom, a nitrogen atom, a sulfur atom and a halogen atom.

Specific examples of the divalent linking groups containing a hetero atom include —O—, —C(=O)—, —C(=O)—O—, a carbonate bond (—O—C(=O)—O—), —NH—, —$NR^{05}$— (wherein $R^{05}$ represents an alkyl group, an acyl group or the like), —NH—C(=O)—, =N—, —S—, —S(=O)$_2$— and —S(=O)$_2$—O—. Further, a combination of any of these "divalent linking groups containing a hetero atom" with a divalent hydrocarbon group can also be used. As the divalent hydrocarbon group, the same groups as those described above for the hydrocarbon group which may have a substituent can be used, and a linear or branched aliphatic hydrocarbon group is preferable.

In the group —$NR^{05}$—, $R^{05}$ represents an alkyl group, an acyl group or the like, and the substituent group (namely, an alkyl group, an acyl group or the like) preferably has 1 to 10 carbon atoms, more preferably 1 to 8 carbon atoms, and most preferably 1 to 5 carbon atoms.

$Q^5$ may or may not have an acid dissociable portion in the structure thereof.

An "acid dissociable portion" refers to a portion within the structure of $Q^5$ which is dissociated from the structure by action of acid generated upon exposure. When $Q^5$ group has an acid dissociable portion, it preferably has an acid dissociable portion having a tertiary carbon atom.

In the present invention, as the divalent linking group for $Q^5$, a divalent linking group containing a hetero atom is preferable.

As the group $R^5$, the same as those described above in relation to the aliphatic hydrocarbon groups which may have a substituent and aromatic hydrocarbon groups which may have a substituent in the aforementioned group Z can be used.

Among the examples described above, as the organic group for Z, because the solubility of the component (A1) in an organic solvent is improved when a resist composition is prepared, a group containing an "aliphatic hydrocarbon group which may have a substituent" is preferable, and a group represented by formula -Q$^5$-R$^{5'}$ (in the formula, Q$^5$ represents the same divalent linking group as defined above, and R$^{5'}$ represents an aliphatic hydrocarbon group which may have a substituent among those defined above for R$^5$) is more preferable. More specifically, preferable examples thereof include a tertiary alkyl group-containing group and an alkoxyalkyl group.

(Tertiary Alkyl Group-Containing Group)

In the present description and the claims, the term "tertiary alkyl group" refers to an alkyl group having a tertiary carbon atom. As mentioned above, the term "alkyl group" refers to a monovalent saturated hydrocarbon group, and includes chain-like (linear or branched) alkyl groups and cyclic alkyl groups.

The term "tertiary alkyl group-containing group" refers to a group which includes a tertiary alkyl group in the structure thereof. The tertiary alkyl group-containing group may be either constituted of only a tertiary alkyl group, or constituted of a tertiary alkyl group and an atom or group other than a tertiary alkyl group.

Examples of the "atom or group other than a tertiary alkyl group" which constitutes the tertiary alkyl group-containing group with a tertiary alkyl group include a carbonyloxy group, a carbonyl group, an alkylene group and an oxygen atom.

As the tertiary alkyl group-containing group for Z, a tertiary alkyl group-containing group which does not have a ring structure, and a tertiary alkyl group-containing group which has a ring structure can be mentioned.

A tertiary alkyl group-containing group which does not have a ring structure is a group which has a branched tertiary alkyl group as the tertiary alkyl group, and has no ring in the structure thereof.

As the branched tertiary alkyl group, for example, a group represented by general formula (I) shown below may be mentioned.

[Chemical Formula 3]

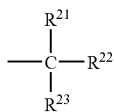
(I)

In formula (I), each of R$^{21}$ to R$^{23}$ independently represents a linear or branched alkyl group. The number of carbon atoms within the alkyl group is preferably from 1 to 5, and more preferably from 1 to 3.

Further, in the group represented by general formula (I), the total number of carbon atoms is preferably from 4 to 7, more preferably from 4 to 6, and most preferably 4 or 5.

Preferable examples of groups represented by general formula (I) include a tert-butyl group and a tert-pentyl group, and a tert-butyl group is more preferable.

Examples of tertiary alkyl group-containing groups which do not have a ring structure include the aforementioned branched tertiary alkyl group; a tertiary alkyl group-containing, chain-like alkyl group in which the aforementioned branched tertiary alkyl group is bonded to a linear or branched alkylene group; a tertiary alkyloxycarbonyl group which has the aforementioned branched tertiary alkyl group as the tertiary alkyl group; and a tertiary alkyloxycarbonylalkyl group which has the aforementioned branched tertiary alkyl group as the tertiary alkyl group.

As the alkylene group within the tertiary alkyl group-containing, chain-like alkyl group, an alkylene group of 1 to 5 carbon atoms is preferable, an alkylene group of 1 to 4 carbon atoms is more preferable, and an alkylene group of 1 or 2 carbon atoms is the most desirable.

As a chain-like tertiary alkyloxycarbonyl group, for example, a group represented by general formula (II) shown below can be mentioned. In general formula (II), R$^{21}$ to R$^{23}$ are the same as defined for R$^{21}$ to R$^{23}$ in general formula (I) above. As the chain-like tertiary alkyloxycarbonyl group, a tert-butyloxycarbonyl group (t-boc) and a tert-pentyloxycarbonyl group are preferable.

[Chemical Formula 4]

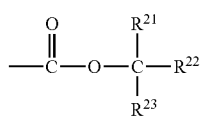
(II)

As a chain-like tertiary alkyloxycarbonylalkyl group, for example, a group represented by general formula (III) shown below can be mentioned. In general formula (III), R$^{21}$ to R$^{23}$ are the same as defined for R$^{21}$ to R$^{23}$ in general formula (I) above. f represents an integer of 1 to 3, and is preferably 1 or 2. As the chain-like tertiary alkyloxycarbonylalkyl group, a tert-butyloxycarbonylmethyl group and a tert-butyloxycarbonylethyl group are preferable.

Among these, as the tertiary alkyl group-containing group which does not have a ring structure, a tertiary alkyloxycarbonyl group or a tertiary alkyloxycarbonylalkyl group is preferable, a tertiary alkyloxycarbonyl group is more preferable, and a tert-butyloxycarbonyl group (t-boc) is the most preferable.

[Chemical Formula 5]

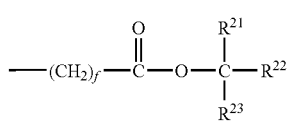
(III)

A tertiary alkyl group-containing group which has a ring structure is a group which contains a tertiary carbon atom and a ring in the structure thereof.

In the tertiary alkyl group-containing group which has a ring structure, the ring structure preferably has 4 to 12 carbon atoms which constitute the ring, more preferably 5 to 10 carbon atoms, and most preferably 6 to 10 carbon atoms. As the ring structure, for example, groups in which one or more hydrogen atoms have been removed from a monocycloalkane or a polycycloalkane such as a bicycloalkane, tricycloalkane or tetracycloalkane may be mentioned. Preferable examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the tertiary alkyl group-containing group which has a ring structure, for example, a group having the following group (1) or (2) as the tertiary alkyl group can be mentioned.

(1) A group in which a linear or branched alkyl group is bonded to a carbon atom which constitutes the ring of a cyclic alkyl group (cycloalkyl group), so that the carbon atom becomes a tertiary carbon atom.

(2) A group in which an alkylene group (branched alkylene group) having a tertiary carbon atom is bonded to a carbon atom constituting the ring of a cycloalkyl group.

In the aforementioned group (1), the linear or branched alkyl group preferably has 1 to 5 carbon atoms, more preferably 1 to 4 carbon atoms, and most preferably 1 to 3 carbon atoms.

Examples of the group (1) include a 2-methyl-2-adamantyl group, a 2-ethyl-2-adamantyl group, a 1-methyl-1-cycloalkyl group and a 1-ethyl-1-cycloalkyl group.

In the aforementioned group (2), the cycloalkyl group having a branched alkylene group bonded thereto may have a substituent. Examples of substituents include a fluorine atom, a fluorinated lower alkyl group of 1 to 5 carbon atoms which is substituted by a fluorine atom, and an oxygen atom (=O).

As an example of the group (2), a group represented by general chemical formula (IV) shown below may be mentioned.

[Chemical Formula 6]

$$-\overset{R^{25}}{\underset{R^{26}}{\overset{|}{C}}}-R^{24} \quad (IV)$$

In general formula (IV), $R^{24}$ represents a cycloalkyl group which may or may not have a substituent. Examples of the substituent which the cycloalkyl group may have include a fluorine atom, a fluorinated alkyl group of 1 to 5 carbon atoms which is substituted by a fluorine atom, and an oxygen atom (=O).

Each of $R^{25}$ and $R^{26}$ independently represents a linear or branched alkyl group. As the alkyl group, the same alkyl groups as those described above for $R^{21}$ to $R^{23}$ in general formula (I) may be mentioned.

(Alkoxyalkyl Group)

As the alkoxyalkyl group for Z, for example, a group represented by general formula (V) shown below may be mentioned.

[Chemical Formula 7]

$$-R^{42}-O-R^{41} \quad (V)$$

In formula (V), $R^{41}$ represents a linear, branched or cyclic alkyl group.

When $R^{41}$ represents a linear or branched alkyl group, it is preferably an alkyl group of 1 to 5 carbon atoms, more preferably an ethyl group or a methyl group, and an ethyl group is particularly desirable.

When $R^{41}$ represents a cyclic alkyl group, it preferably has 4 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, tricycloalkane or tetracycloalkane, and which may or may not be substituted with a fluorine atom or a fluorinated alkyl group, may be mentioned. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

$R^{42}$ represents a linear or branched alkylene group. The alkylene group preferably has 1 to 5 carbon atoms, more preferably 1 to 3 carbon atoms, and most preferably 1 or 2 carbon atoms.

As the alkoxyalkyl group for Z, a group represented by general formula (VI) shown below is particularly desirable.

[Chemical Formula 8]

$$-\overset{R^{43}}{\underset{R^{44}}{\overset{|}{C}}}-O-R^{41} \quad (VI)$$

In general formula (VI), $R^{41}$ is the same as defined above, and each of $R^{43}$ and $R^{44}$ independently represents a linear or branched alkyl group or a hydrogen atom.

With respect to $R^{43}$ and $R^{44}$, the alkyl group preferably has 1 to 15 carbon atoms, and may be either linear or branched. The alkyl group for $R^{43}$ and $R^{44}$ is preferably an ethyl group or a methyl group, and is most preferably a methyl group. It is particularly desirable that either one of $R^{43}$ and $R^{44}$ be a hydrogen atom, and the other be a methyl group.

Among the above-mentioned examples, as Z, a tertiary alkyl group-containing group is preferable, a group represented by general formula (II) above is more preferable, and a tert-butyloxycarbonyl group (t-boc) is most preferable.

In the aforementioned general formula (a0-1), a represents an integer of 1 to 3, and b represents an integer of 0 to 2, with the provision that a+b=1 to 3.

a is preferably 1.
b is preferably 0.
a+b is preferably 1.

c represents an integer of 0 to 3, preferably 0 or 1, and more preferably 0.

d represents an integer of 0 to 3, preferably 0 or 1, and more preferably 0.

e represents an integer of 0 to 3, preferably 0 or 1, and more preferably 0.

Among the examples described above, as the structural unit (a0), a structural unit represented by general formula (a0-1-1) or (a0-1-2) shown below is particularly desirable.

[Chemical Formula 9]

(a0-1-1)

[In the formula, R, Z, b, c, d and e are respectively the same as defined above.]

[Chemical Formula 10]

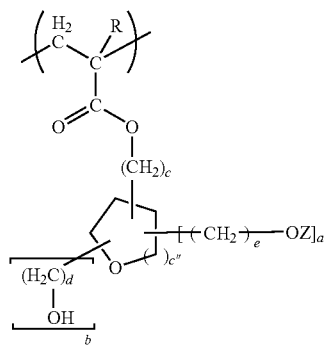

(a0-1-2)

[In the formula, R, Z, a, b, c, d and e are respectively the same as defined above, and c" represents an integer of 1 to 3.]

In the aforementioned formula (a0-1-2), c" represents an integer of 1 to 3, preferably 1 or 2, and more preferably 1.

When c in the aforementioned formula (a0-1-2) represents 0, the terminal oxygen atom of the carbonyloxy group (—C(=O)—O—) within the acrylate ester is preferably not bonded to a carbon atom bonded to the oxygen atom within the cyclic group. In other words, when c represents 0, it is preferable that 2 or more carbon atoms are present between the terminal oxygen atom and the oxygen atom within the cyclic group (excluding the case where the number of such carbon atom is one (i.e., the case where an acetal bond is formed)).

Specific examples of structural units represented by the aforementioned general formulas (a0-1-1) and (a0-1-2) are shown below.

[Chemical Formula 11]

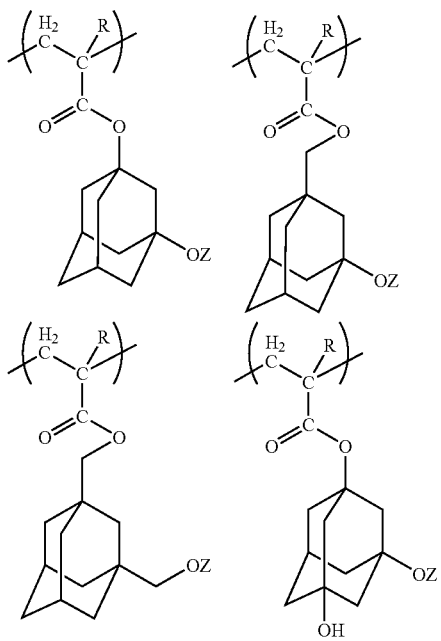

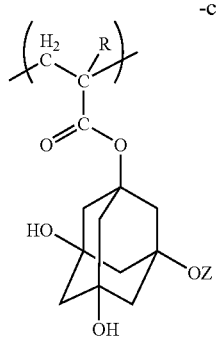

[In the formulas, R and Z are respectively the same as defined above.]

[Chemical Formula 12]

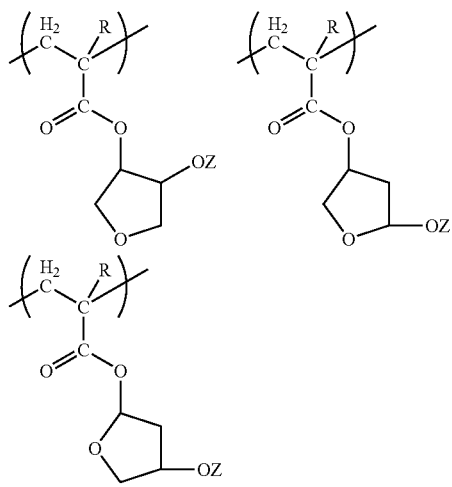

[In the formulas, R and Z are respectively the same as defined above.]

Further, preferable examples of the structural unit (a0) also include structural units represented by general formulas shown below.

[Chemical Formula 13]

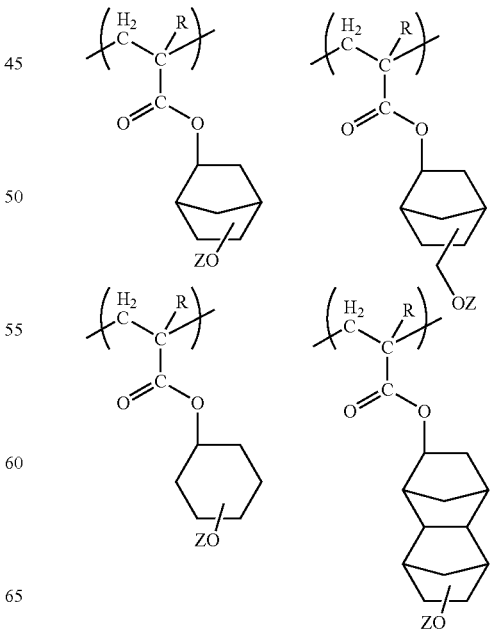

-continued

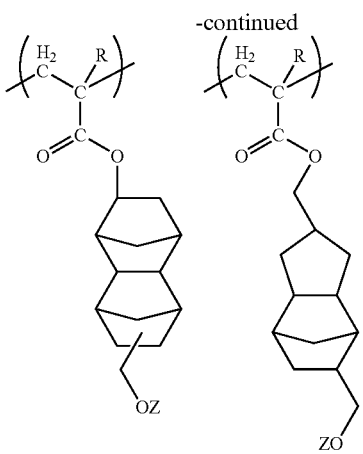

[In the formulas, R and Z are respectively the same as defined above.]

A monomer for deriving the structural unit (a0) can be synthesized, for example, by protecting part or all of the hydroxyl groups within a compound represented by general formula (a0-1') shown below (namely, an acrylate ester containing an aliphatic cyclic group having 1 to 3 alcoholic hydroxyl groups) with an organic group (preferably a tertiary alkyl group-containing group or an alkoxyalkyl group) by a conventional method.

[Chemical Formula 14]

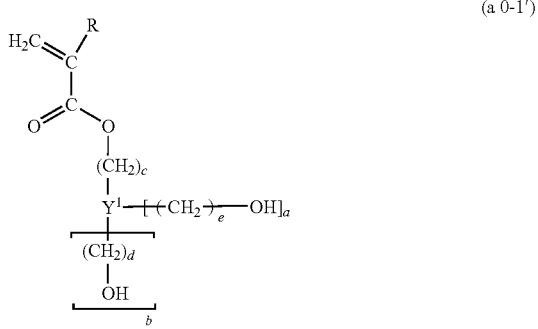

[In the formula, R, $Y^1$, a, b, c, d and e are respectively the same as defined above.]

As the structural unit (a0), one type of structural unit may be used alone, or two or more types of structural units may be used in combination.

In the component (A1), the amount of the structural unit (a0) based on the combined total of all structural units constituting the component (A1) is preferably 10 to 50 mol %, more preferably 10 to 40 mol %, still more preferably 10 to 30 mol %, and most preferably 10 to 25 mol %. By making the amount of the structural unit (a0) at least as large as the lower limit of the above-mentioned range, the solubility of the component (A1) in an organic solvent is improved. On the other hand, by making the amount of the structural unit (a0) no more than the upper limit of the above-mentioned range, a good balance can be achieved with the other structural units.

(Structural Unit (a1))

The structural unit (a1) is a structural unit (a1) derived from an acrylate ester having an acid dissociable, dissolution inhibiting group.

As the acid dissociable, dissolution inhibiting group in the structural unit (a1), any of the groups that have been proposed as acid dissociable, dissolution inhibiting groups for the base resins of chemically amplified resists can be used, provided the group has an alkali dissolution-inhibiting effect that renders the entire component (A1) insoluble in an alkali developing solution prior to dissociation, and then following dissociation by the action of acid, increases the solubility of the entire component (A1) in the alkali developing solution. Generally, groups that form either a cyclic or chain-like tertiary alkyl ester with the carboxyl group of the (meth)acrylic acid or the like, and acetal-type acid dissociable, dissolution inhibiting groups such as alkoxyalkyl groups are widely known.

Here, a "tertiary alkyl ester" describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom of the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

In the present description and claims, the term "aliphatic branched" refers to a structure having no aromaticity.

The "aliphatic branched, acid dissociable, dissolution inhibiting group" is not limited to be constituted of only carbon and hydrogen (not limited to hydrocarbon groups), but is preferably a hydrocarbon group.

Further, the "hydrocarbon group" may be either saturated or unsaturated, but in general, the hydrocarbon group is preferably saturated.

Examples of aliphatic branched, acid dissociable, dissolution inhibiting groups include tertiary alkyl groups of 4 to 8 carbon atoms, and specific examples include a tert-butyl group, a tert-pentyl group and a tert-heptyl group.

The term "aliphatic cyclic group" refers to a monocyclic group or polycyclic group that has no aromaticity.

The "aliphatic cyclic group" within the structural unit (a1) may or may not have a substituent. Examples of substituents include a lower alkyl group of 1 to 5 carbon atoms, a lower alkoxy group of 1 to 5 carbon atoms, a fluorine atom, a fluorinated lower alkyl group of 1 to 5 carbon atoms which is substituted by a fluorine atom, and an oxygen atom (═O).

The basic ring of the "aliphatic cyclic group" exclusive of substituents that substitute part or all of the hydrogen atoms constituting the cyclic group is not limited to be constituted from only carbon and hydrogen (not limited to hydrocarbon groups), but is preferably a hydrocarbon group.

Further, the "hydrocarbon group" may be either saturated or unsaturated, but in general, the hydrocarbon group is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, a tricycloalkane or a tetracycloalkane which may or may not be substituted with a lower alkyl group, a fluorine atom or a fluorinated lower alkyl group, may be mentioned. Specific examples include groups in which one or more hydrogen atoms have been removed from a monocycloalkane such as a cyclopentane and a cyclohexane; and groups in which one or more hydrogen atoms have been removed from a polycycloalkane such as an adamantane, a norbornane, an isobornane, a tricyclodecane or tetracyclododecane.

As the aliphatic cyclic group-containing acid dissociable, dissolution inhibiting group, for example, a group which has a tertiary carbon atom on the ring structure of the cyclic alkyl group can be mentioned. Specific examples include a 2-methyl-2-adamantyl group and an 2-ethyl-2-adamantyl group. Alternatively, groups having an aliphatic cyclic group such as an adamantyl group, a cyclohexyl group, a cyclopentyl group, a norbornyl group, a tricyclodecanyl group or a tetracyclododecanyl group, and a branched alkylene group having a tertiary carbon atom bonded to the aliphatic cyclic group, such as the groups bonded to the terminal oxygen atom of the carbonyloxy group (—C(O)—O—) in the structural units represented by general formulas (a1"-1) to (a1"-6) shown below, may also be mentioned.

[Chemical Formula 15]

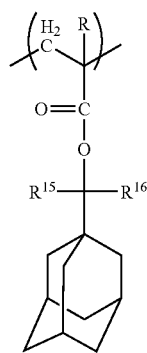
(a1"-1)

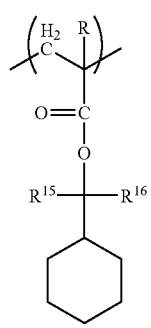
(a1"-2)

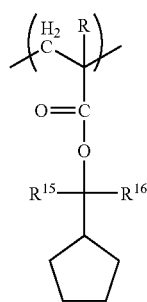
(a-1"3)

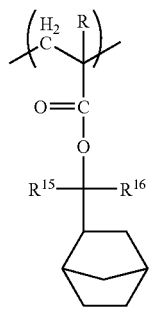
(a-1"-4)

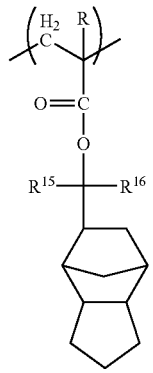
(a1"-5)

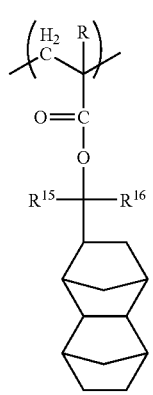
(a1"-6)

[In the formulas, R represents a hydrogen atom, a lower alkyl group of 1 to 5 carbon atoms or a halogenated lower alkyl group of 1 to 5 carbon atoms; and $R^{15}$ and $R^{16}$ each represents an alkyl group (which may be linear or branched, and preferably has 1 to 5 carbon atoms).]

In general formulas (a1"-1) to (a1"-6) above, the lower alkyl group or halogenated lower alkyl group for R is the same as the lower alkyl group or halogenated lower alkyl group which may be bonded to the α-position of the aforementioned acrylate ester.

An "acetal-type acid dissociable, dissolution inhibiting group" generally substitutes a hydrogen atom at the terminal of an alkali-soluble group such as a carboxyl group or a hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 16]

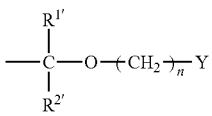

(p1)

[In the formula, $R^{1\prime}$ and $R^{2\prime}$ each independently represents a hydrogen atom or a lower alkyl group; n represents an integer of 0 to 3; and Y represents a lower alkyl group or an aliphatic cyclic group.]

In general formula (p1) above, n is preferably an integer of 0 to 2, more preferably 0 or 1, and most preferably 0.

As the lower alkyl group for $R^{1\prime}$ and $R^{2\prime}$, the same as the lower alkyl groups for R above can be mentioned. As the lower alkyl group for $R^{1\prime}$ and $R^{2\prime}$, a methyl group or an ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable, dissolution inhibiting group (p1) be a group represented by general formula (p1-1) shown below.

[Chemical Formula 17]

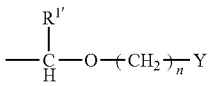

(p 1-1)

[In the formula, $R^{1\prime}$, n and Y are the same as defined above.]

As the lower alkyl group for Y, the same as the lower alkyl groups for R above can be mentioned.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be mentioned.

Further, as the acetal-type, acid dissociable, dissolution inhibiting group, groups represented by general formula (p2) shown below can also be mentioned.

[Chemical Formula 18]

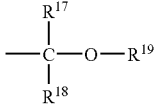

(p 2)

[In the formula, $R^{17}$ and $R^{18}$ each independently represents a linear or branched alkyl group or a hydrogen atom; and $R^{19}$ represents a linear, branched or cyclic alkyl group; or $R^{17}$ and $R^{19}$ each independently represents a linear or branched alkylene group, wherein the terminal of $R^{17}$ may be bonded to the terminal of $R^{19}$ to form a ring.]

With respect to $R^{17}$ and $R^{18}$, the alkyl group preferably has 1 to 15 carbon atoms, and may be either linear or branched. The alkyl group for $R^{17}$ and $R^{18}$ is preferably an ethyl group or a methyl group, and is most preferably a methyl group. It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or a methyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms.

As examples of the cyclic alkyl group, groups in which one or more hydrogen atoms have been removed from a monocycloalkane or a polycycloalkane such as a bicycloalkane, a tricycloalkane or a tetracycloalkane, and which may or may not be substituted with a fluorine atom or a fluorinated alkyl group, may be mentioned. Specific examples include groups in which one or more hydrogen atoms have been removed from a monocycloalkane such as a cyclopentane or a cyclohexane, and groups in which one or more hydrogen atoms have been removed from a polycycloalkane such as adamantane, a norbornane, an isobornane, a tricyclodecane or a tetracyclododecane. Of these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto and the carbon atom having the oxygen atom and $R^{17}$ bonded thereto. Such a cyclic group is preferably a 4 to 7-membered ring, and more preferably a 4 to 6-membered ring. Specific examples of the cyclic group include a tetrahydropyranyl group and a tetrahydrofuranyl group.

As the structural unit (a1), it is preferable to use at least one member selected from the group consisting of structural units represented by general formula (a1-0-1) shown below and structural units represented by general formula (a1-0-2) shown below.

[Chemical Formula 19]

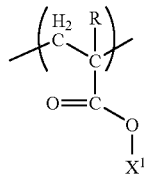

(a 1-0-1)

[In the formula, R represents a hydrogen atom, a lower alkyl group of 1 to 5 carbon atoms or a halogenated lower alkyl group of 1 to 5 carbon atoms; and $X^1$ represents an acid dissociable, dissolution inhibiting group.]

[Chemical Formula 20]

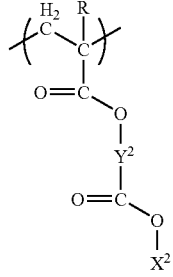

(a 1-0-2)

[In the formula, R represents a hydrogen atom, a lower alkyl group of 1 to 5 carbon atoms or a halogenated lower alkyl group of 1 to 5 carbon atoms; $X^2$ represents an acid dissociable, dissolution inhibiting group; and $Y^2$ represents a divalent linking group.]

In general formula (a1-0-1) shown above, the lower alkyl group and halogenated lower alkyl group for R are the same as the lower alkyl group and halogenated lower alkyl group which may be bonded to the α-position of the aforementioned acrylate ester.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is the same as defined above. $X^2$ is the same as $X^1$ in general formula (a1-0-1).

As the divalent linking group for $Y^2$, an alkylene group, a divalent aliphatic cyclic group, or a divalent linking group containing a hetero atom can be used.

As the aliphatic cyclic group, the same groups as those mentioned above in connection with the explanation of the "aliphatic cyclic group" can be used, with the exception that two hydrogen atoms have been removed therefrom.

When $Y^2$ represents an alkylene group, it preferably has 1 to 10 carbon atoms, more preferably 1 to 6 carbon atoms, still more preferably 1 to 4 carbon atoms, and most preferably 1 to 3 carbon atoms.

When $Y^2$ represents a divalent aliphatic cyclic group, it is particularly desirable that the divalent aliphatic cyclic group be a group in which two or more hydrogen atoms have been removed from cyclopentane, cyclohexane, norbornane, isobornane, adamantane, tricyclodecane or tetracyclododecane.

When $Y^2$ represents a divalent linking group containing a hetero atom, for example, —O—, —C(=O)—O—, —C(=O)—, —O—C(=O)—O—, —C(=O)—NH—, —$NR^{03}$— (wherein $R^{03}$ represents an alkyl group, an acyl group or the like), —S—, —$S(=O)_2$—, —$S(=O)_2$—O—, or -A-O—B— (wherein each of A and B independently represents a divalent hydrocarbon group which may have a substituent, and O is an oxygen atom) can be used.

When $Y^2$ represents a group —$NR^{03}$—, the substituent $R^{03}$ (an alkyl group, an acyl group or the like) preferably has 1 to 10 carbon atoms, more preferably 1 to 8 carbon atoms, and most preferably 1 to 5 carbon atoms.

When $Y^2$ is "A-O—B", each of A and B independently represents a divalent hydrocarbon group which may have a substituent.

When a hydrocarbon "has a substituent", it means that a part or all of the hydrogen atoms within the hydrocarbon group are substituted with groups or atoms other than hydrogen atoms.

The hydrocarbon group for A may be either an aliphatic hydrocarbon group, or an aromatic hydrocarbon group. An "aliphatic hydrocarbon group" refers to a hydrocarbon group that has no aromaticity.

The aliphatic hydrocarbon group for A may be either saturated or unsaturated. In general, the aliphatic hydrocarbon group is preferably saturated.

As specific examples of the aliphatic hydrocarbon group for A, a linear or branched aliphatic hydrocarbon group, and an aliphatic hydrocarbon group having a ring in the structure thereof can be given.

The linear or branched aliphatic hydrocarbon group preferably has 1 to 10 carbon atoms, more preferably 1 to 8 carbon atoms, still more preferably 2 to 5 carbon atoms, and most preferably 2 carbon atoms.

As the linear aliphatic hydrocarbon group, a linear alkylene group is preferable, and specific examples include a methylene group, an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferable, and specific examples include alkylalkylene groups, e.g., alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; alkylethylene groups such as —$CH(CH_3)CH_2$—, —$CH(CH_3)CH(CH_3)$—, —$C(CH_3)_2CH_2$—, and —$CH(CH_2CH_3)CH_2$—; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of substituents include a fluorine atom, a fluorinated lower alkyl group of 1 to 5 carbon atoms which is substituted by a fluorine atom, and an oxygen atom (=O).

As examples of the aliphatic hydrocarbon group containing a ring, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group.

As the monocyclic group, a group in which two hydrogen atoms have been removed from a monocycloalkane of 3 to 6 carbon atoms is preferable. Examples of the monocycloalkane include a cyclopentane and a cyclohexane.

As the polycyclic group, a group in which two hydrogen atoms have been removed from a polycycloalkane of 7 to 12 carbon atoms is preferable. Examples of the polycycloalkane include an adamantane, a norbornane, an isobornane, a tricyclodecane and tetracyclododecane.

The cyclic aliphatic hydrocarbon group may or may not have a substituent.

Examples of substituents include a lower alkyl group of 1 to 5 carbon atoms, a fluorine atom, a fluorinated lower alkyl group of 1 to 5 carbon atoms which is substituted by a fluorine atom, and an oxygen atom (=O).

As A, a linear aliphatic hydrocarbon group is preferable, more preferably a linear alkylene group, still more preferably a linear alkylene group of 2 to 5 carbon atoms, and most preferably an ethylene group.

As the hydrocarbon group for B, the same divalent hydrocarbon groups as those described above for A can be used.

As B, a linear or branched aliphatic hydrocarbon group is preferable, and a methylene group or an alkylmethylene group is particularly desirable.

The alkyl group within the alkylmethylene group is preferably a linear alkyl group of 1 to 5 carbon atoms, more preferably a linear alkyl group of 1 to 3 carbon atoms, and most preferably a methyl group.

Specific examples of the structural unit (a1) include structural units represented by general formulas (a1-1) to (a1-4) shown below.

[Chemical Formula 21]

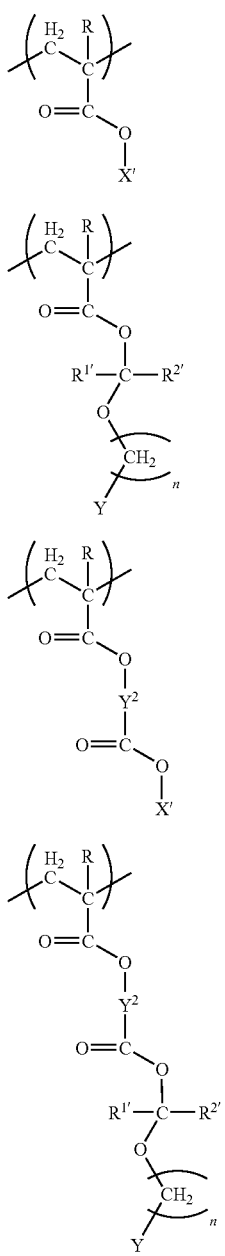

(a1-1)
(a1-2)
(a1-3)
(a1-4)

[In the formulas, X' represents a tertiary alkyl ester-type acid dissociable, dissolution inhibiting group; Y represents a lower alkyl group of 1 to 5 carbon atoms or an aliphatic cyclic group; n represents an integer of 0 to 3; $Y^2$ represents a divalent linking group; R is the same as defined above; and each of $R^{1\prime}$ and $R^{2\prime}$ independently represents a hydrogen atom or a lower alkyl group of 1 to 5 carbon atoms.]

In the above formulas, examples of the tertiary alkyl ester-type acid dissociable, dissolution inhibiting group for X' include the same tertiary alkyl ester-type acid dissociable, dissolution inhibiting groups as those described above for $X^1$.

As $R^{1\prime}$, $R^{2\prime}$, n and Y, the same as $R^{1\prime}$, $R^{2\prime}$, n and Y defined for general formula (p1) described above in connection with the "acetal-type acid dissociable, dissolution inhibiting group" may be used.

As examples of $Y^2$, the same groups as those described above for $Y^2$ in general formula (a1-0-2) can be given.

Specific examples of structural units represented by the aforementioned general formula (a1-1) to (a1-4) are shown below.

In the formulas shown below, $R^\alpha$ represents a hydrogen atom, a methyl group or a trifluoromethyl group.

[Chemical Formula 22]

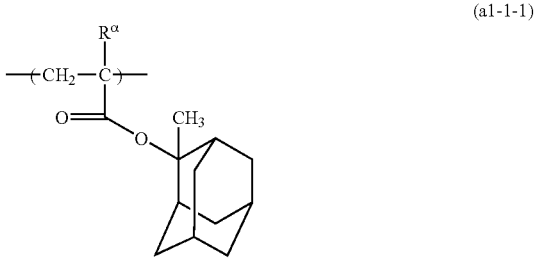

(a1-1-1)

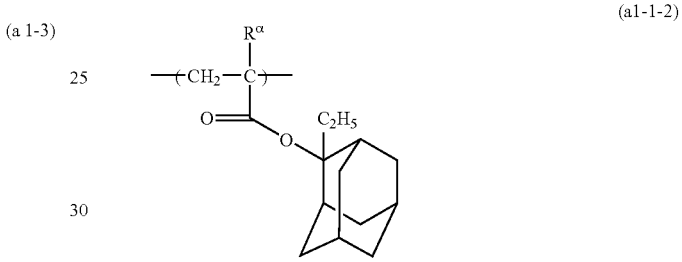

(a1-1-2)

(a1-1-3)

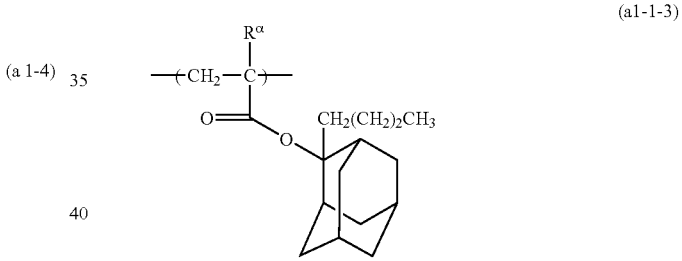

(a1-1-4)

(a1-1-5)

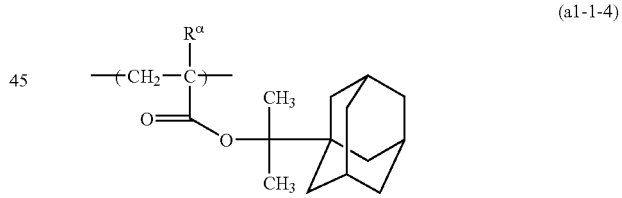

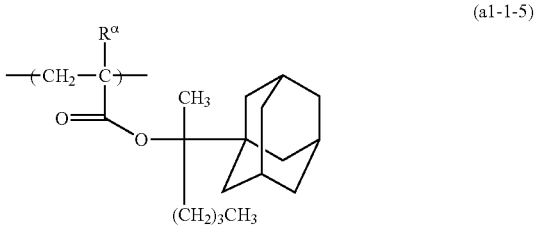

(a1-1-6)

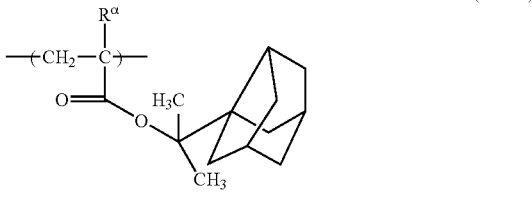

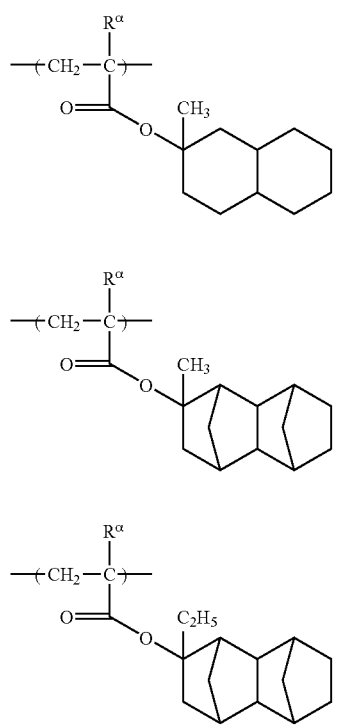
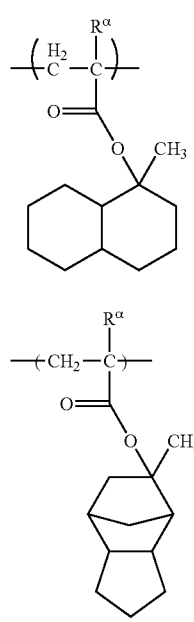
[Chemical Formula 23]
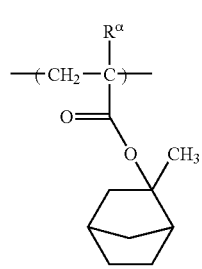
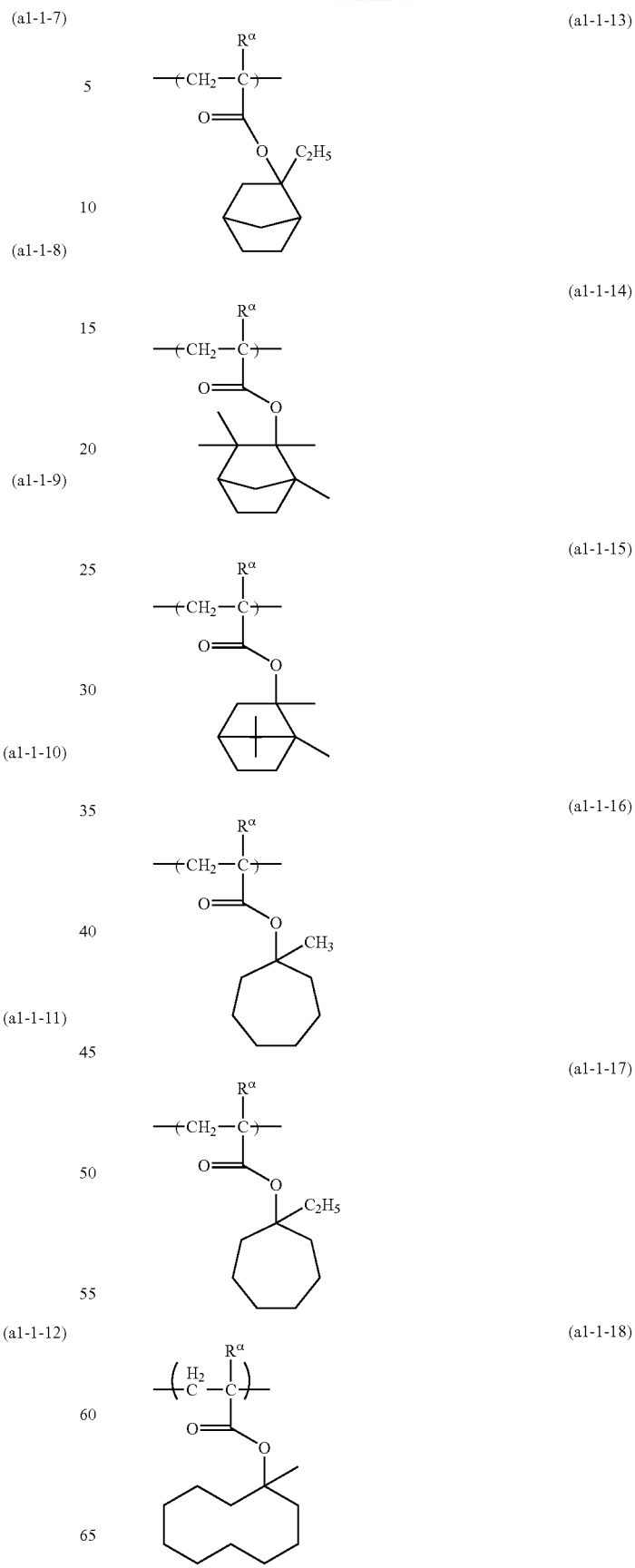

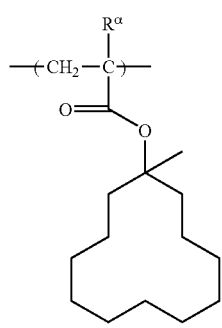
(a1-1-19)
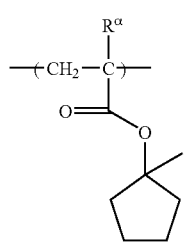
(a1-1-20)
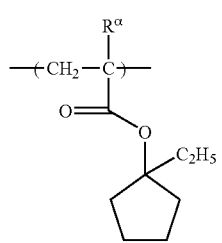
(a1-1-21)
[Chemical Formula 24]
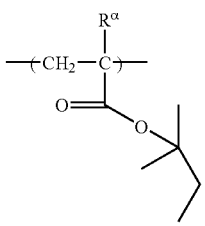
(a1-1-22)
(a1-1-23)
(a1-1-24)
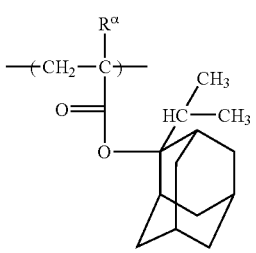
(a1-1-25)
(a1-1-26)
(a1-1-27)
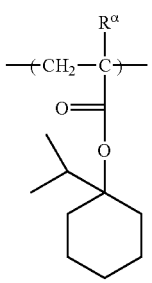
(a1-1-28)
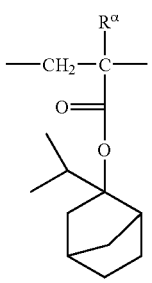
(a1-1-29)
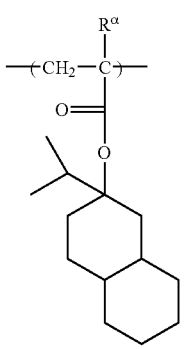

(a1-1-30)
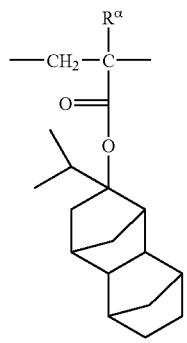
(a1-1-31)
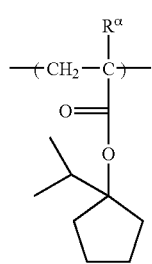
[Chemical Formula 25]
(a1-2-1)
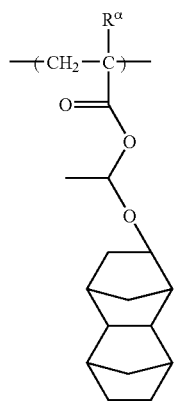
(a1-2-2)
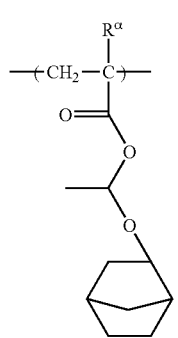
(a1-2-3)
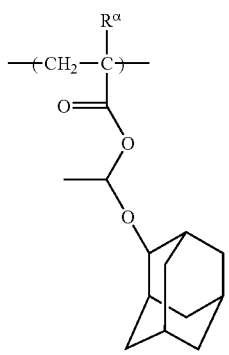
(a1-2-4)
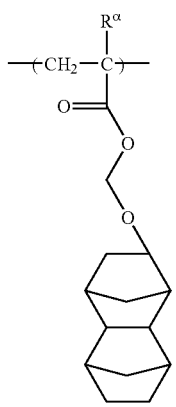
(a1-2-5)
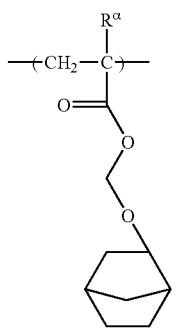
(a1-2-6)
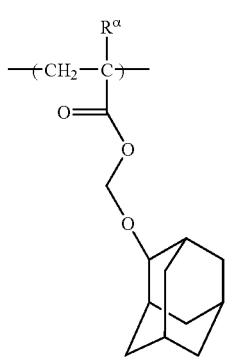

(a1-2-7)
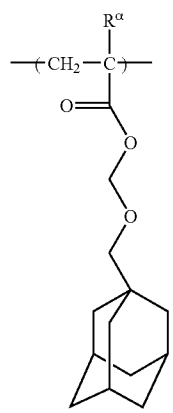
(a1-2-8)
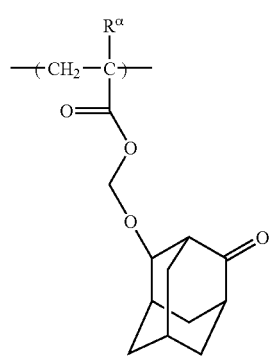
(a1-2-9)
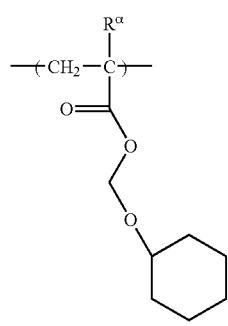
(a1-2-10)
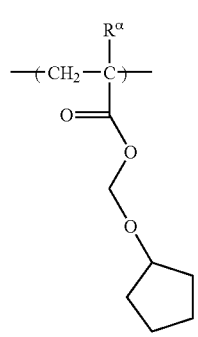
(a1-2-11)
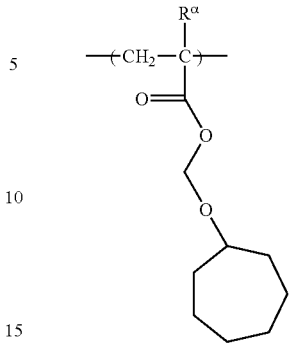
(a1-2-12)
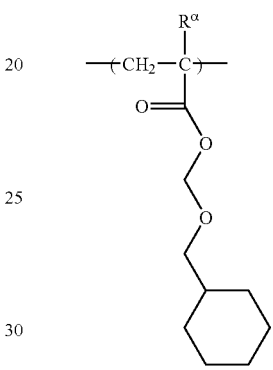
(a1-2-13)
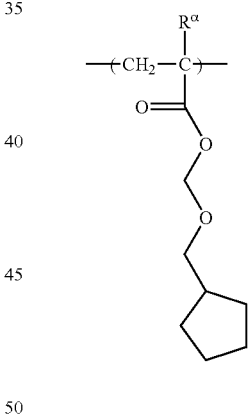
(a1-2-14)
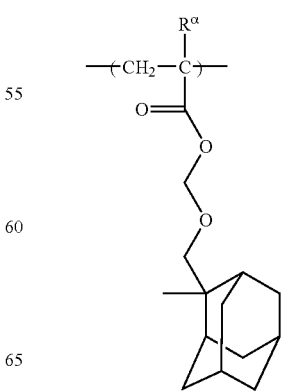

(a1-2-15)
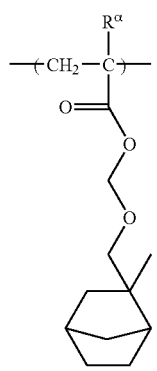
(a1-2-16)
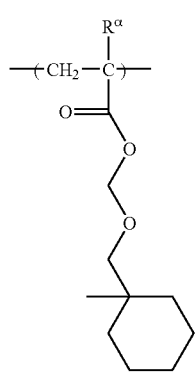
(a1-2-17)
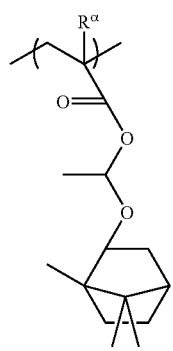
(a1-2-18)
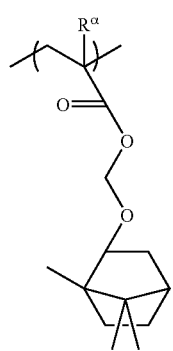
(a1-2-19)
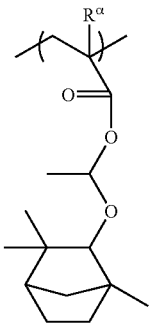
(a1-2-20)
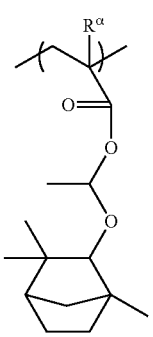
(a1-2-21)
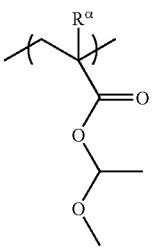
(a1-2-22)
(a1-2-23)
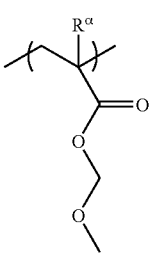

(a1-2-24)
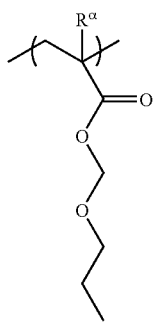
[Chemical Formula 26]
(a1-3-1)
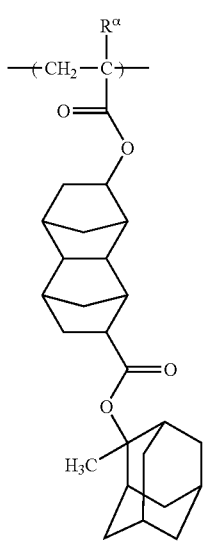
(a1-3-2)
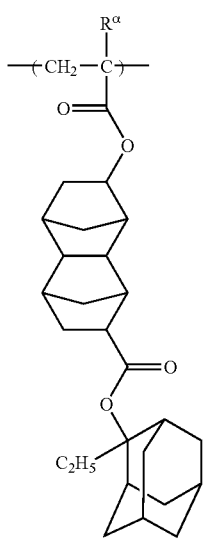
(a1-3-3)
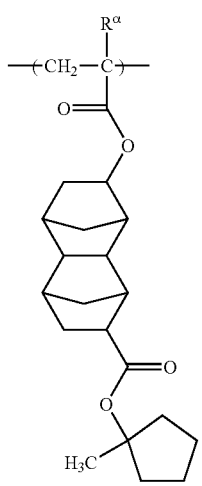
(a1-3-4)
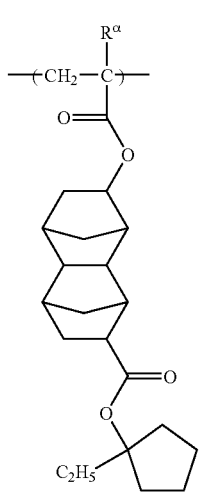
(a1-3-5)
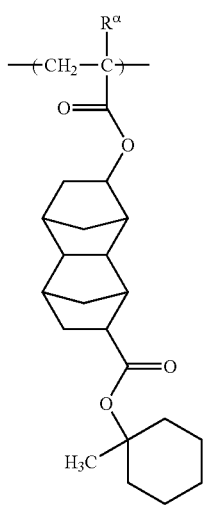

(a1-3-6)
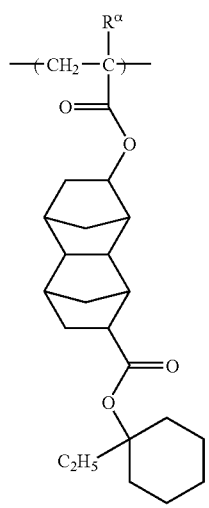
(a1-3-7)
(a1-3-8)
(a1-3-9)
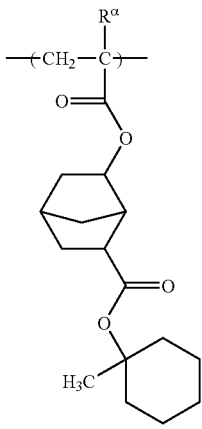
(a1-3-10)
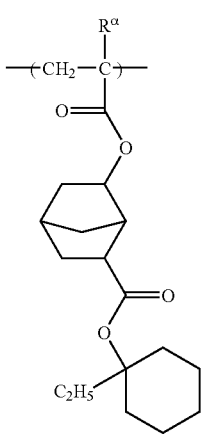
(a1-3-11)
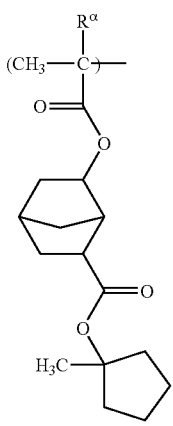

(a1-3-12)
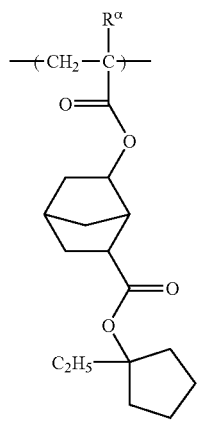
(a1-3-13)
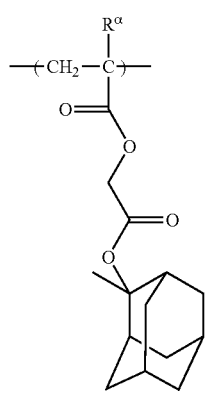
(a1-3-14)
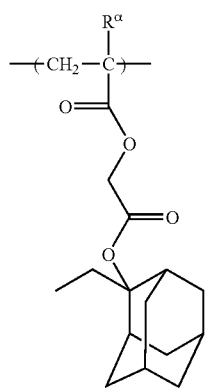
(a1-3-15)
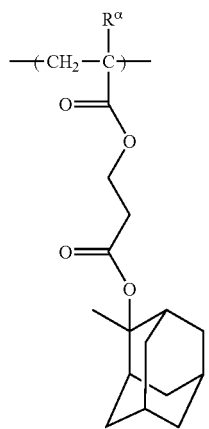
(a1-3-16)
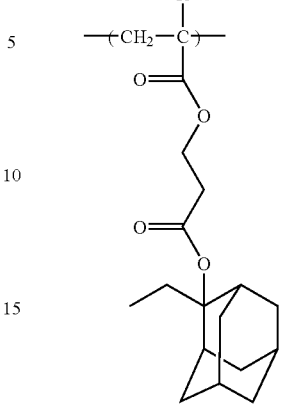
(a1-3-17)
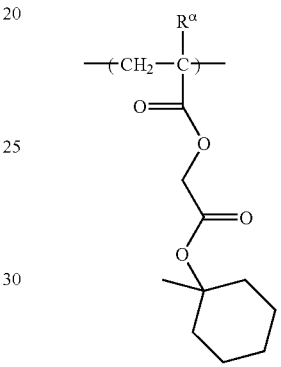
(a1-3-18)
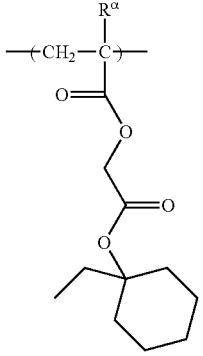
[Chemical Formula 27]
(a1-3-19)
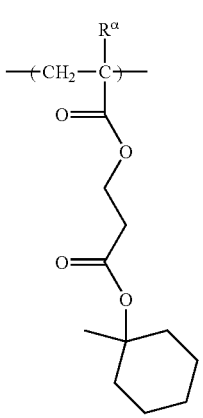

(a1-3-20)
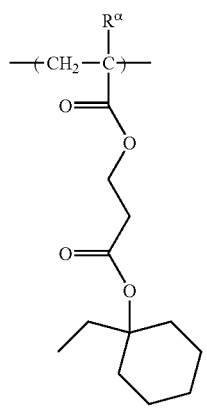
(a1-3-21)
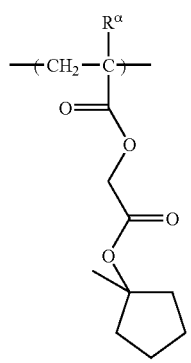
(a1-3-22)
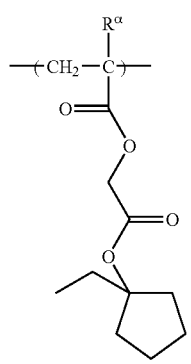
(a1-3-23)
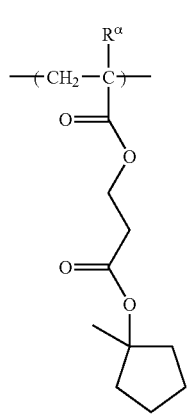
(a1-3-24)
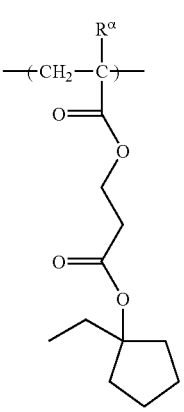
[Chemical Formula 28]
(a1-3-25)
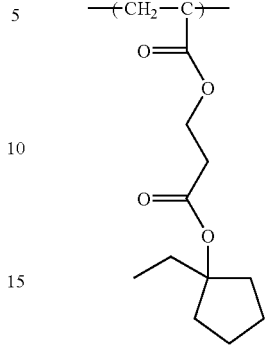
(a1-3-26)
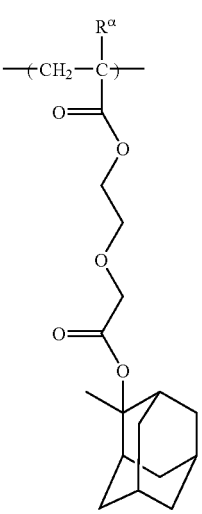

(a1-3-27)
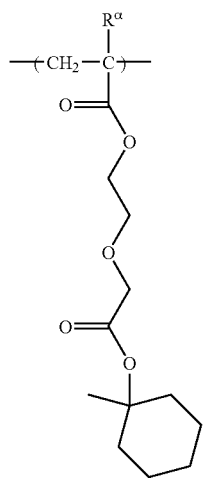
(a1-3-28)
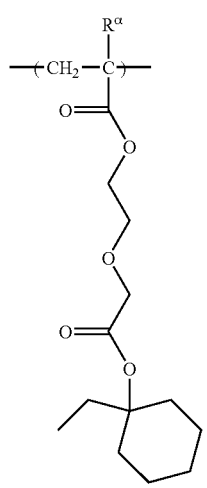
(a1-3-29)
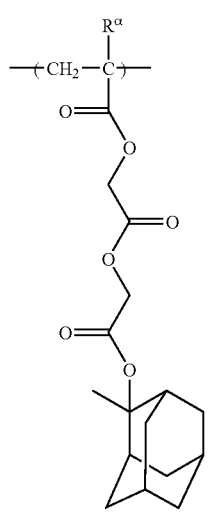
(a1-3-30)
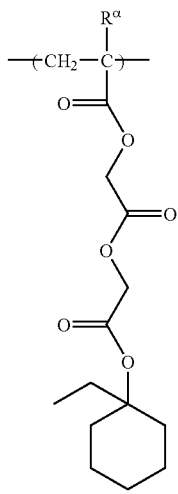
(a1-3-31)
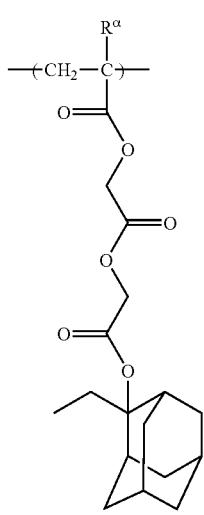
(a1-3-32)
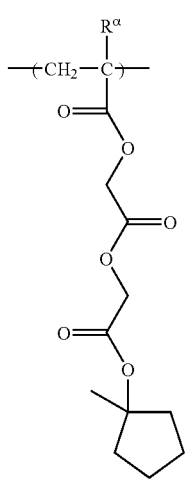

[Chemical Formula 29]
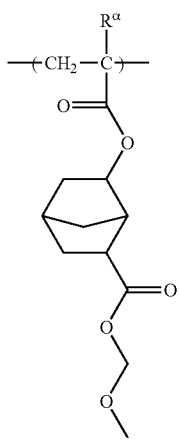 (a1-4-1)
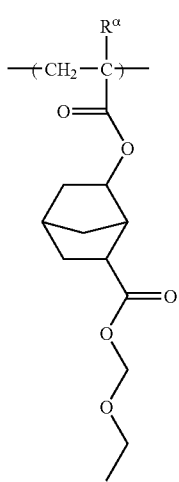 (a1-4-2)
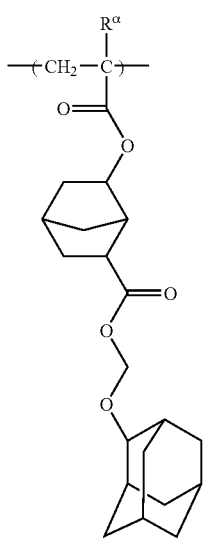 (a1-4-3)
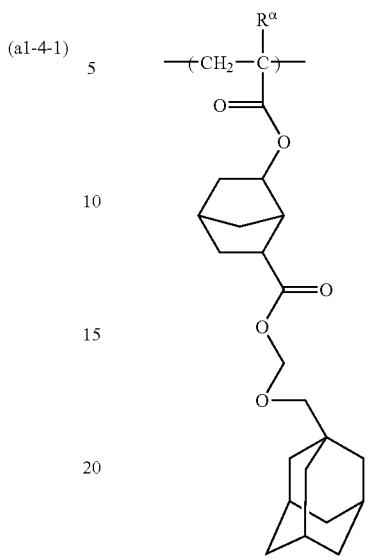 (a1-4-4)
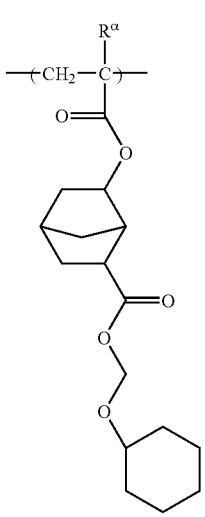 (a1-4-5)
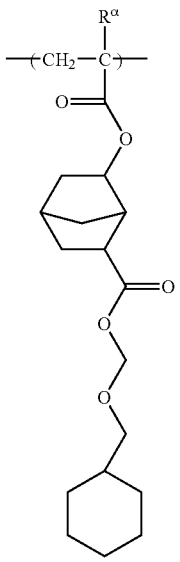 (a1-4-6)

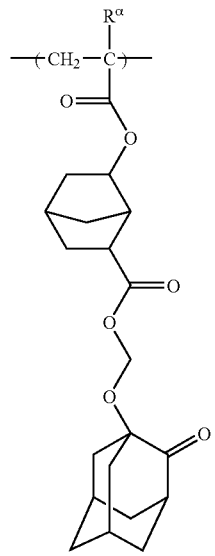
(a1-4-7)
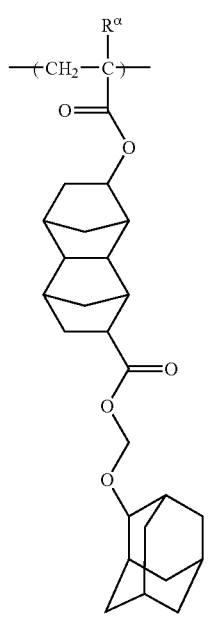
(a1-4-9)
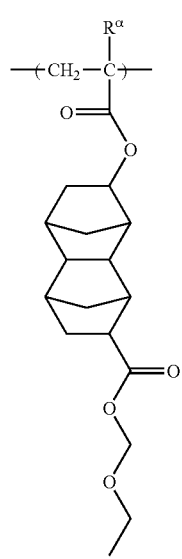
(a1-4-8)
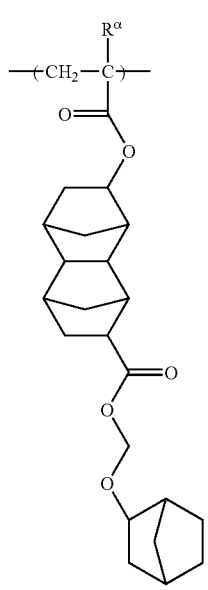
(a1-4-10)

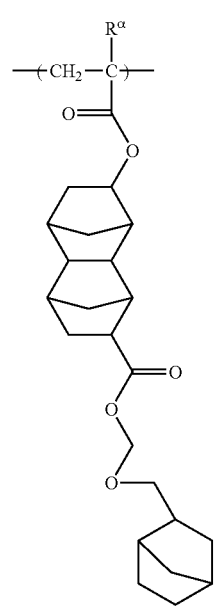
(a1-4-11)
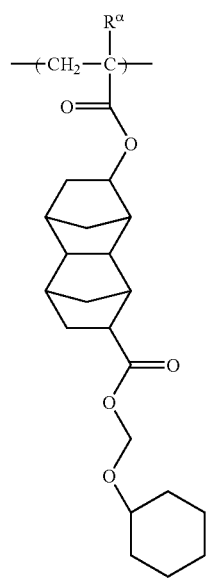
(a1-4-13)
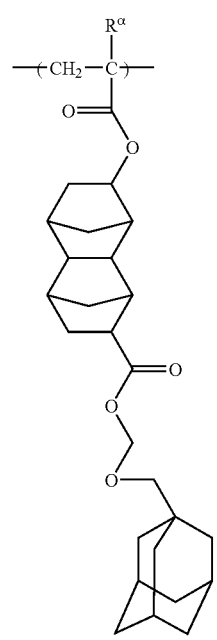
(a1-4-12)
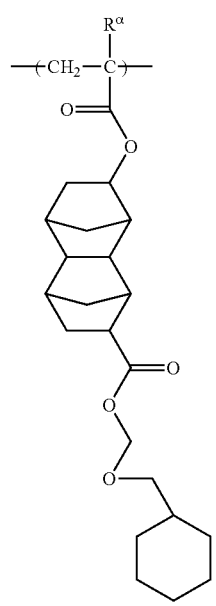
(a1-4-14)

-continued (a1-4-15)

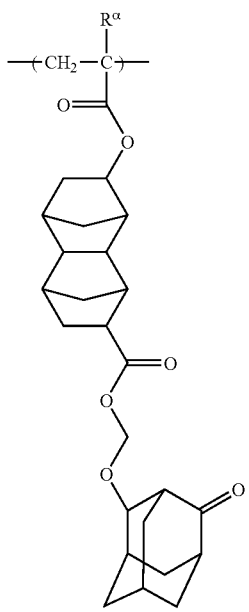

As the structural unit (a1), one type of structural unit may be used alone, or two or more types of structural units may be used in combination.

Among these, structural units represented by general formula (a1-1) or (a1-3) are preferable. More specifically, it is more preferable to use at least one structural unit selected from the group consisting of structural units represented by formulas (a1-1-1) to (a1-1-4), (a1-1-20) to (a1-1-23) and (a1-3-25) to (a1-3-28).

Further, as the structural unit (a1), structural units represented by general formula (a1-1-01) shown below which includes the structural units represented by formulas (a1-1-1) to (a1-1-3), structural units represented by general formula (a1-1-02) shown below which includes the structural units represented by formulas (a1-1-16) to (a1-1-17) and (a1-1-20) to (a1-1-23), structural units represented by general formula (a1-3-01) shown below which includes the structural units represented by formulas (a1-3-25) to (a1-3-26), and structural units represented by general formula (a1-3-02) shown below which includes the structural units represented by formulas (a1-3-27) to (a1-3-28) are also preferable.

[Chemical Formula 30]

(a1-1-01)

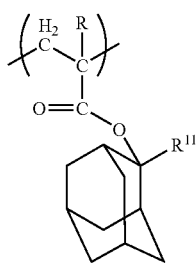

[In the formula, R represents a hydrogen atom, a lower alkyl group of 1 to 5 carbon atoms or a halogenated lower alkyl group of 1 to 5 carbon atoms; and represents a lower alkyl group.]

[Chemical Formula 31]

(a1-1-02)

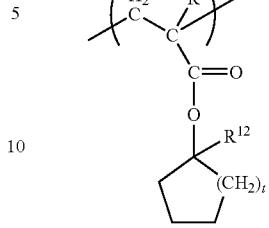

[In the formula, R represents a hydrogen atom, a lower alkyl group of 1 to 5 carbon atoms or a halogenated lower alkyl group of 1 to 5 carbon atoms; $R^{12}$ represents a lower alkyl group; and t represents an integer of 1 to 6.]

In general formula (a1-1-01), R is the same as defined above.

The lower alkyl group for $R^{11}$ is the same as the lower alkyl group for R above, and is preferably a methyl group or an ethyl group.

In general formula (a1-1-02), R is the same as defined above.

The lower alkyl group for $R^{12}$ is the same as the lower alkyl group for R above. $R^{12}$ is preferably a methyl group or an ethyl group, and most preferably an ethyl group.

t is preferably 1 or 2, and most preferably 2.

[Chemical Formula 32]

(a1-3-01)

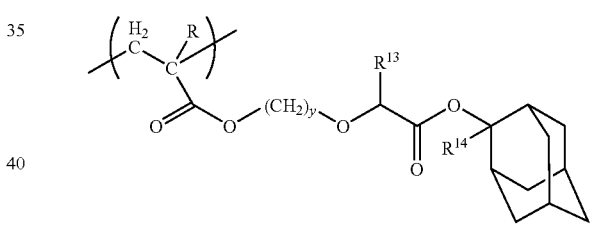

[In the formula, R represents a hydrogen atom, a lower alkyl group of 1 to 5 carbon atoms or a halogenated lower alkyl group of 1 to 5 carbon atoms; $R^{14}$ represents a lower alkyl group; $R^{13}$ represents a hydrogen atom or a methyl group; and y represents an integer of 1 to 10.]

[Chemical Formula 33]

(a1-3-02)

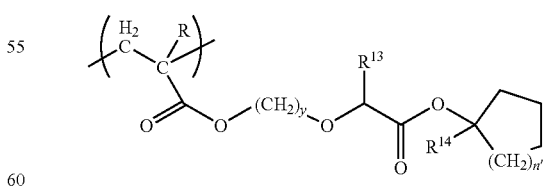

[In the formula, R represents a hydrogen atom, a lower alkyl group of 1 to 5 carbon atoms or a halogenated lower alkyl group of 1 to 5 carbon atoms; $R^{14}$ represents a lower alkyl group; $R^{13}$ represents a hydrogen atom or a methyl group; y represents an integer of 1 to 10; and n' represents an integer of 1 to 6.]

In the aforementioned general formulas (a1-3-01) and (a1-3-02), R is the same as defined above.

$R^{13}$ is preferably a hydrogen atom.

The lower alkyl group for $R^{14}$ is the same as the lower alkyl group for R, and is preferably a methyl group or an ethyl group.

y is preferably an integer of 1 to 8, more preferably an integer of 2 to 5, and most preferably 2.

In the component (A1), the amount of the structural unit (a1) based on the combined total of all structural units constituting the component (A1) is preferably 10 to 60 mol %, more preferably 20 to 60 mol %, and still more preferably 30 to 55 mol %. When the amount of the structural unit (a1) is at least as large as the lower limit of the above-mentioned range, a pattern can be easily formed using a resist composition prepared from the component (A1). On the other hand, when the amount of the structural unit (a1) is no more than the upper limit of the above-mentioned range, a good balance can be achieved with the other structural units.

The monomers for deriving the structural units represented by general formulas (a1-3-01) and (a1-3-02) above (hereafter, these monomers are collectively referred to as "monomers W") can be produced by a production method shown below.

Production Method of Monomer W:

A compound represented by general formula (X-2) shown below is added to a compound represented by general formula (X-1) shown below dissolved in a reaction solvent, in the presence of a base, and a reaction is effected to obtain a compound represented by general formula (X-3) shown below (hereafter, referred to as "compound (X-3)"). Then, a compound represented by general formula (X-4) shown below is added to the resulting solution having the compound (X-3) dissolved therein, in the presence of a base, and a reaction is effected to thereby obtain a monomer W.

Examples of the base include inorganic bases such as sodium hydride, $K_2CO_3$ and $Cs_2CO_3$, and organic bases such as triethylamine, 4-dimethylaminopyridine (DMAP) and pyridine.

As the reaction solvent, any reaction solvent capable of dissolving the compounds (X-1) and (X-2) as raw materials can be used, and specific examples include tetrahydrofuran (THF), acetone, dimethylformamide (DMF), dimethylacetamide, dimethyl sulfoxide (DMSO) and acetonitrile.

[Chemical Formula 34]

 (X-1)

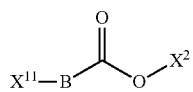 (X-2)

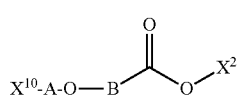 (X-3)

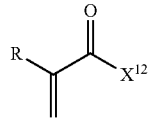 (X-4)

[In the formulas, R represents a hydrogen atom, a lower alkyl group of 1 to 5 carbon atoms or a halogenated lower alkyl group of 1 to 5 carbon atoms; each of A and B independently represents a divalent hydrocarbon group which may have a substituent; X2 represents an acid dissociable, dissolution inhibiting group; each of $X^{10}$ and $X^{12}$ independently represents a hydroxyl group or a halogen atom, with the provision that either one of $X^{10}$ and $X^{12}$ represents a hydroxyl group and the other represents a halogen atom; and $X^{11}$ represents a halogen atom.]

In formulas (X-1) to (X-4) above, R, $X^2$, A and B are the same as defined above.

Examples of halogen atoms for $X^{10}$, $X^{11}$ and $X^{12}$ include a bromine atom, a chlorine atom, an iodine atom and a fluorine atom.

As the halogen atom for $X^{10}$ or $X^{12}$, in terms of reactivity, a chlorine atom or a bromine atom is preferable.

As $X^{11}$, in terms of reactivity, a bromine atom or a chlorine atom is preferable, and a bromine atom is particularly desirable.

(Structural Unit (a2))

The structural unit (a2) is a structural unit derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include a group in which one hydrogen atom has been removed from a 4- to 6-membered lactone ring, such as a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 35]

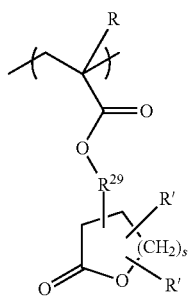 (a2-1)

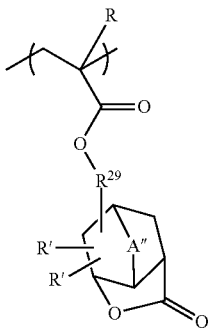
(a2-2)

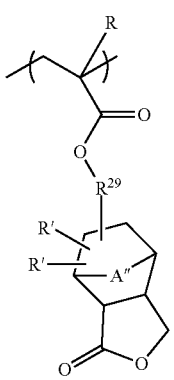
(a2-3)

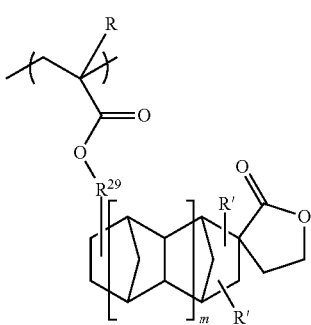
(a2-4)

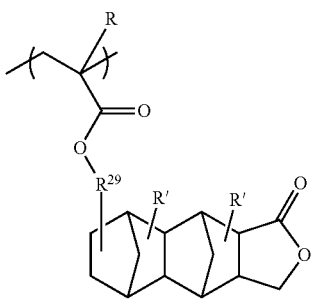
(a2-5)

[In the formulas, R represents a hydrogen atom, a lower alkyl group of 1 to 5 carbon atoms or a halogenated lower alkyl group of 1 to 5 carbon atoms; each R' independently represents a hydrogen atom, an alkyl group of 1 to 5 carbon atoms, an alkoxy group of 1 to 5 carbon atoms or —COOR", wherein R" represents a hydrogen atom or an alkyl group; $R^{29}$ represents a single bond or a divalent linking group; s" represents an integer of 0 to 2; A" represents an alkylene group of 1 to 5 carbon atoms which may contain an oxygen atom or a sulfur atom or A" represents an oxygen atom or a sulfer atom; and m represents an integer of 0 or 1.]

In general formulas (a2-1) to (a2-5), the lower alkyl group and halogenated lower alkyl group for R are the same as the lower alkyl group and halogenated lower alkyl group which may be bonded to the α-position of the aforementioned acrylate ester.

As R, a hydrogen atom, a lower alkyl group or a fluorinated lower alkyl group is preferable, and a hydrogen atom or a methyl group is particularly desirable in terms of industrial availability.

Examples of the alkyl group of 1 to 5 carbon atoms for R' include a methyl group, an ethyl group, a propyl group, a n-butyl group and a tert-butyl group.

Examples of the alkoxy group of 1 to 5 carbon atoms for R' include a methoxy group, an ethoxy group, a n-propoxy group, an iso-propoxy group, a n-butoxy group and a tert-butoxy group.

When R" is a linear or branched alkyl group, it preferably has 1 to 10 carbon atoms, and more preferably 1 to 5 carbon atoms.

When R" is a cyclic alkyl group, it preferably has 3 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, a tricycloalkane or a tetracycloalkane, and which may or may not be substituted with a fluorine atom or a fluorinated alkyl group, may be used. Specific examples of such groups include groups in which one or more hydrogen atoms have been removed from a monocycloalkane such as a cyclopentane or a cyclohexane; and groups in which one or more hydrogen atoms have been removed from a polycycloalkane such as an adamantane, a norbornane, an isobornane, a tricyclodecane or a tetracyclododecane.

In terms of industrial availability, R' is preferably a hydrogen atom.

As A", an alkylene group of 1 to 5 carbon atoms or —O— is preferable, more preferably an alkylene group of 1 to 5 carbon atoms, and most preferably a methylene group.

$R^{29}$ represents a single bond or a divalent linking group. Examples of divalent linking groups include the same divalent linking groups as those described above for $Y^2$ in general formula (a1-0-2). Among these, an alkylene group, an ester bond (—C(=O)—O—) or a combination thereof is preferable. The alkylene group as a divalent linking group for $R^{29}$ is preferably a linear or branched alkylene group. Specific examples include the same linear alkylene groups and branched alkylene groups as those described above for the aliphatic hydrocarbon group A in $Y^2$.

s" is preferably 1 or 2.

Specific examples of structural units represented by the aforementioned general formulas (a2-1) to (a2-5) are shown below. In the formulas shown below, $R^\alpha$ represents a hydrogen atom, a methyl group or a trifluoromethyl group.

[Chemical Formula 36]

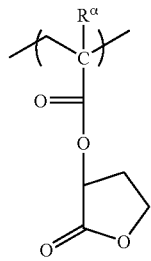
(a2-1-1)

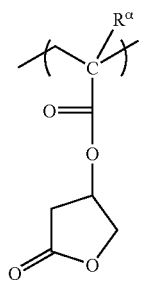
(a2-1-2)
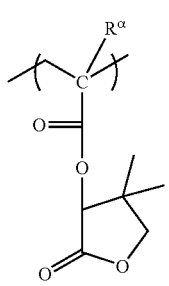
(a2-1-3)
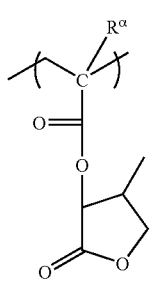
(a2-1-4)
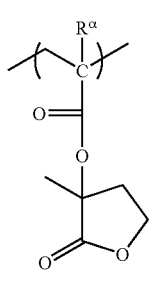
(a2-1-5)
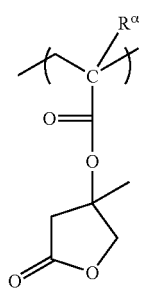
(a2-1-6)
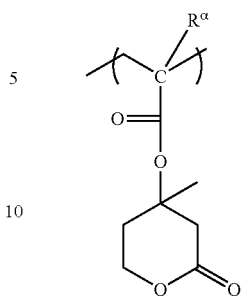
(a2-1-7)
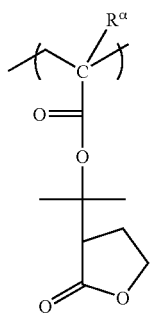
(a2-1-8)
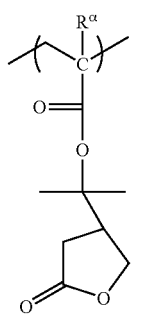
(a2-1-9)
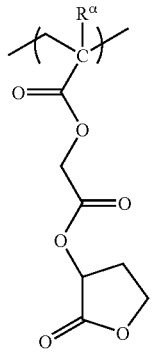
(a2-1-10)
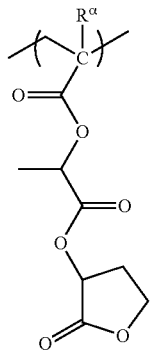
(a2-1-11)

(a2-1-12)
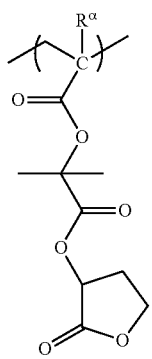
(a2-1-13)
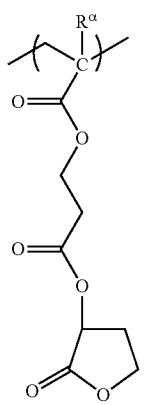
[Chemical Formula 37]
(a2-2-1)
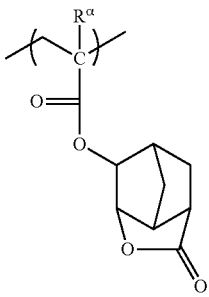
(a2-2-2)
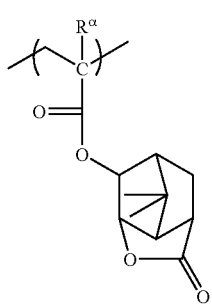
(a2-2-3)
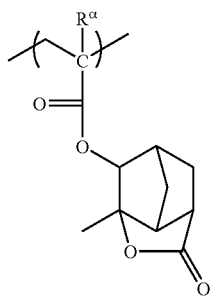
(a2-2-4)
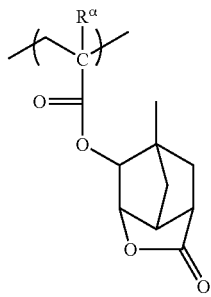
(a2-2-5)
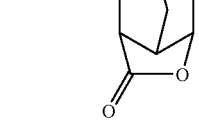
(a2-2-6)
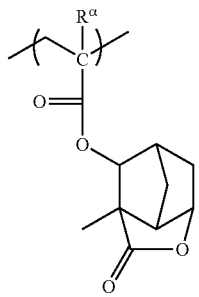
(a2-2-7)
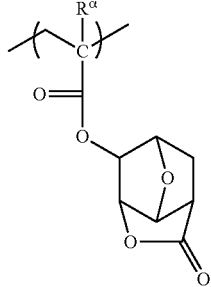

(a2-2-8)
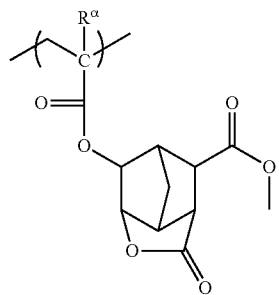
(a2-2-9)
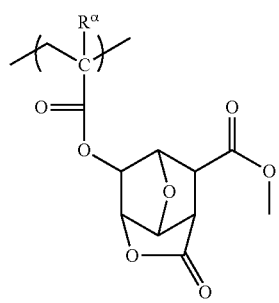
(a2-2-10)
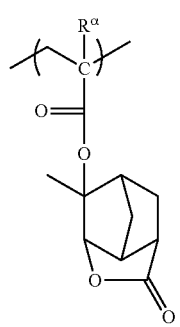
(a2-2-11)
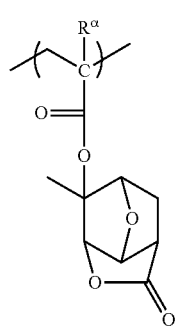
(a2-2-12)
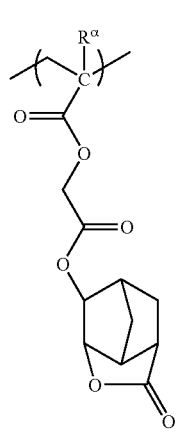
(a2-2-13)
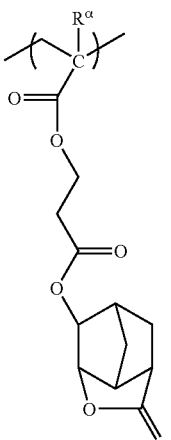
(a2-2-14)
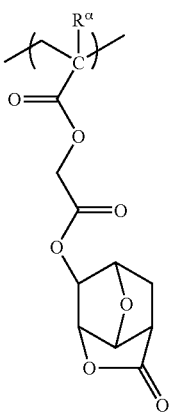
(a2-2-15)
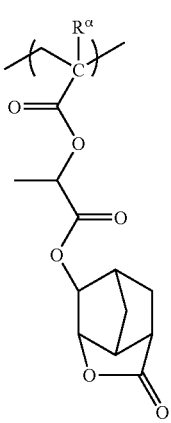

-continued
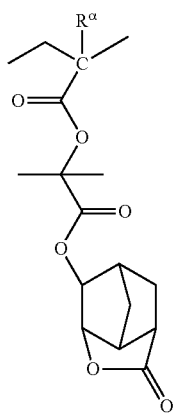
(a2-2-16)
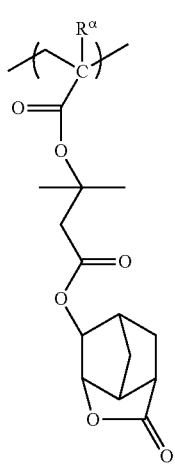
(a2-2-17)
[Chemical Formula 38]
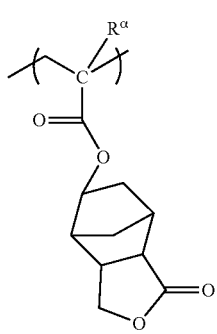
(a2-3-1)
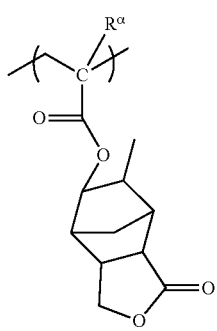
(a2-3-2)
-continued
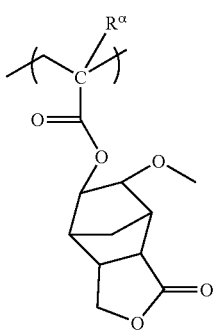
(a2-3-3)
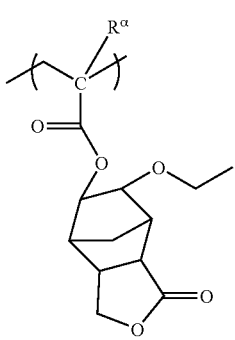
(a2-3-4)
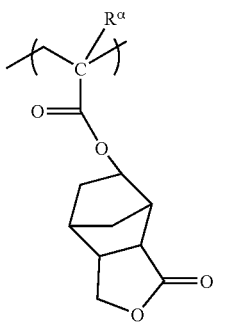
(a2-3-5)
[Chemical Formula 39]
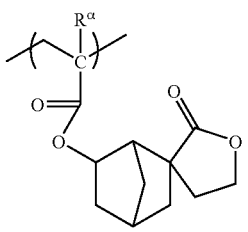
(a2-4-1)
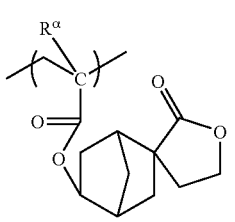
(a2-4-2)

(a2-4-3)
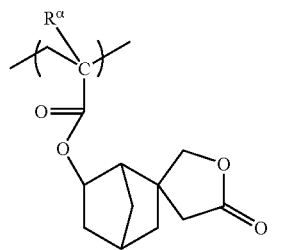
(a2-4-4)
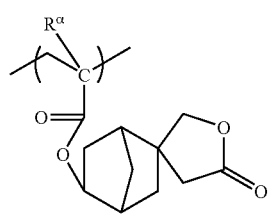
(a2-4-5)
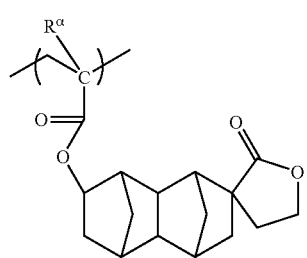
(a2-4-6)
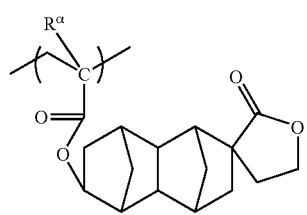
(a2-4-7)
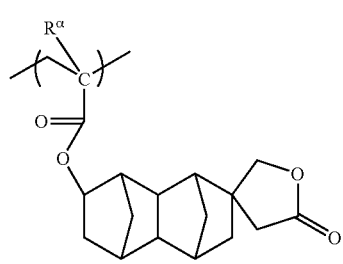
(a2-4-8)
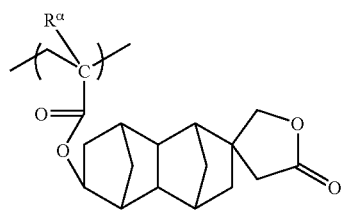
(a2-4-9)
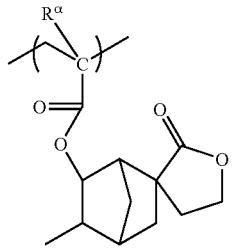
(a2-4-10)
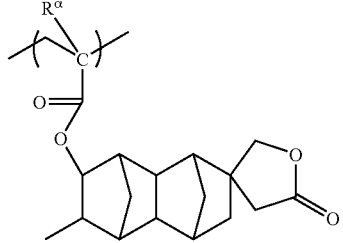
(a2-4-11)
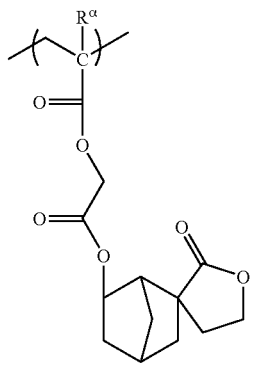
(a2-4-12)
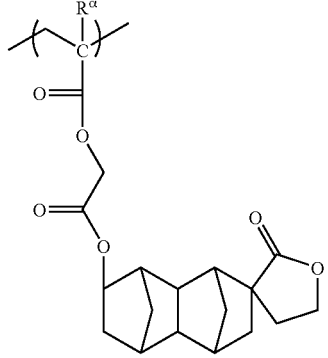

-continued

[Chemical Formula 40]

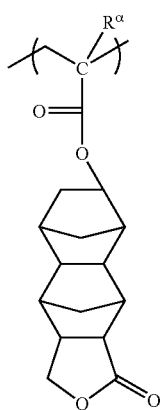
(a2-5-1)

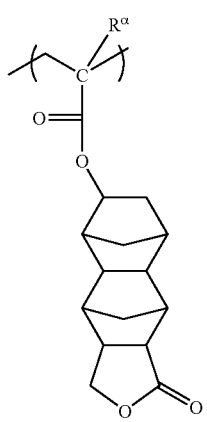
(a2-5-2)

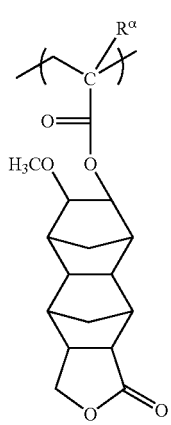
(a2-5-3)

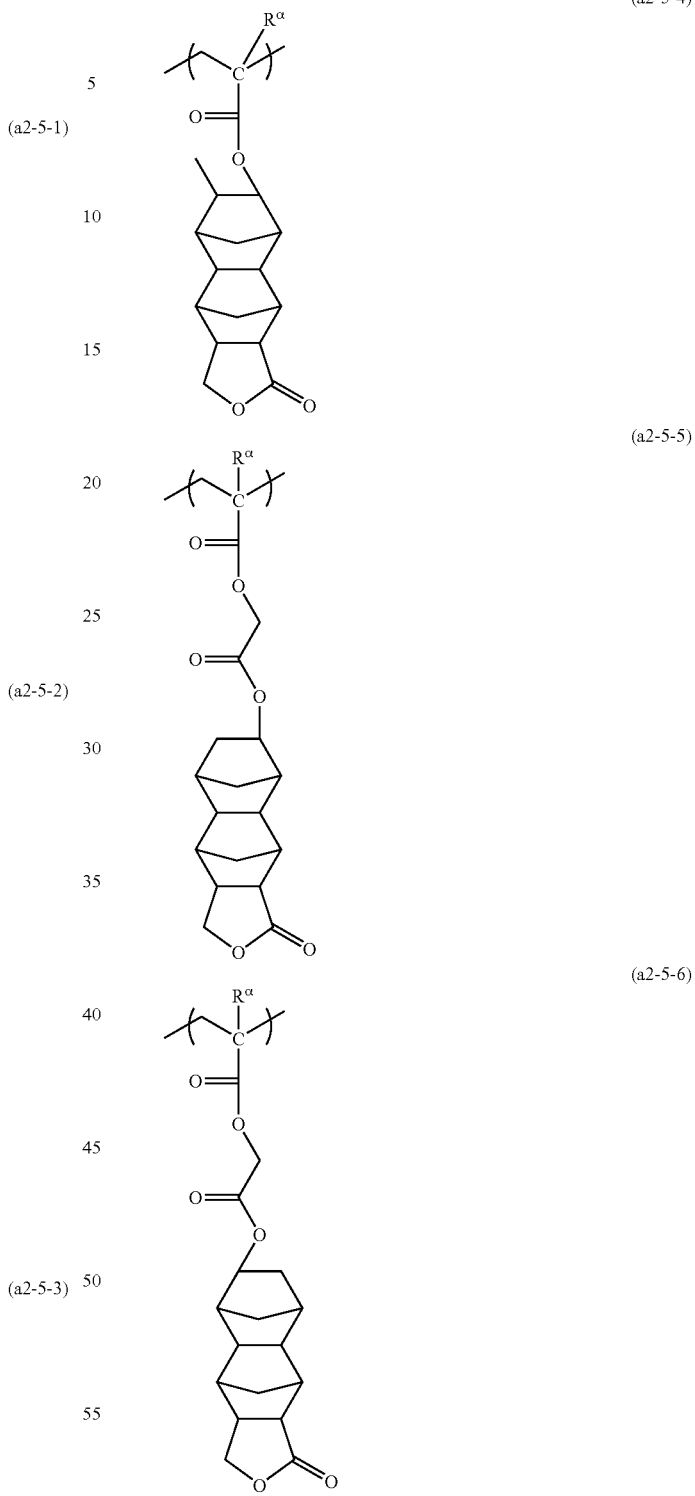

As the structural unit (a2), one type of structural unit may be used alone, or two or more types of structural units may be used in combination.

Among the above-mentioned examples, as the structural unit (a2), at least one structural unit selected from the group consisting of structural units represented by the aforementioned general formulas (a2-1) to (a2-5) is preferable, and at least one structural unit selected from the group consisting of structural units represented by general formulas (a2-1) to (a2-3) is more preferable. Of these, it is particularly desirable to use at least one structural unit selected from the group consisting of structural units represented by chemical formulas (a2-1-1), (a2-1-2), (a2-2-1), (a2-2-7), (a2-3-1) and (a2-3-5).

In the component (A1), the amount of the structural unit (a2) based on the combined total of all structural units constituting the component (A1) is preferably within a range from 5 to 35 mol %, more preferably from 10 to 35 mol %, and still more preferably from 15 to 35 mol %. By making the amount of the structural unit (a2) at least as large as the lower limit of the above-mentioned range, the effect of using the structural unit (a2) can be satisfactorily achieved. On the other hand, by making the amount of the structural unit (a2) no more than the upper limit of the above-mentioned range, the solubility of the component (A1) in an organic solvent is enhanced, and a good balance can also be achieved with the other structural units. Furthermore, superior effects can be achieved in suppressing pattern collapse and improving the pattern shape.

(Structural Unit (a5))

The structural unit (a5) is a structural unit represented by general formula (a5-1) shown below.

[Chemical Formula 41]

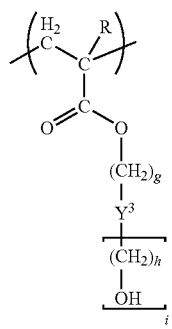

(a5-1)

[In formula (a5-1), R represents a hydrogen atom, a lower alkyl group of 1 to 5 carbon atoms or a halogenated lower alkyl group of 1 to 5 carbon atoms; $Y^3$ represents an aliphatic hydrocarbon group which may have a substituent; each of g and h independently represents an integer of 0 to 3; and i represents an integer of 1 to 3.]

In the aforementioned general formula (a5-1), R represents a hydrogen atom, a lower alkyl group of 1 to 5 carbon atoms or a halogenated lower alkyl group of 1 to 5 carbon atoms.

The lower alkyl group and halogenated lower alkyl group for R are the same as the aforementioned lower alkyl group and halogenated lower alkyl group which may be bonded to the α-position of the acrylate ester.

As R, a hydrogen atom, a lower alkyl group or a fluorinated lower alkyl group is preferable, and a hydrogen atom or a methyl group is particularly desirable in terms of industrial availability.

In general formula (a5-1) above, $Y^3$ represents an aliphatic hydrocarbon group which may have a substituent. As examples of $Y^3$, the same divalent groups as those described above in the explanation of $Y^1$ in formula (a0-1) can be mentioned. Of the various possibilities, $Y^3$ is preferably an alkylene group or an aliphatic cyclic group.

As the alkylene group for $Y^3$, for example, an alkylene group of 1 to 10 carbon atoms can be used.

As the aliphatic cyclic group for $Y^3$, the same groups as those described above for the aliphatic cyclic group for $Y^1$ in general formula (a0-1) can be mentioned. It is preferable that the structure of the basic ring (aliphatic ring) in $Y^3$ be the same as that in $Y^1$.

In general formula (a5-1) above, g represents an integer of 0 to 3, preferably 0 or 1, and more preferably 0.

h represents an integer of 0 to 3, preferably 0 or 1, and more preferably 0.

i represents an integer of 1 to 3, and preferably 1.

As the structural unit (a5), a structural unit represented by general formula (a5-1-1) shown below is preferable, and a structural unit in which one of the i groups of —$(CH_2)_h$—OH is bonded to the 3rd position of the 1-adamantyl group is particularly desirable.

[Chemical Formula 42]

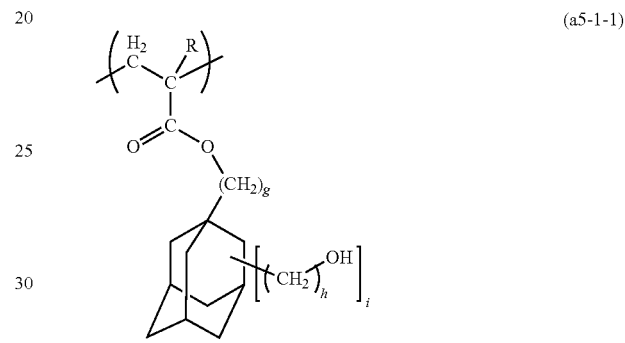

(a5-1-1)

[In the formula, R, g, h and i are respectively the same as defined above.]

As the structural unit (a5), one type of structural unit may be used alone, or two or more types of structural units may be used in combination.

In the component (A1), the amount of the structural unit (a5) based on the combined total of all structural units constituting the component (A1) is preferably 10 to 30 mol %, more preferably 10 to 25 mol %, and most preferably 10 to 20 mol %. When the amount of the structural unit (a5) is at least as large as the lower limit of the above-mentioned range, a resist pattern having a high level of resolution and excellent shape can be formed. On the other hand, when the amount of the structural unit (a5) is no more than the upper limit of the above-mentioned range, a good balance can be achieved with the other structural units.

(Other Structural Units)

The component (A1) may also have a structural unit other than the above-mentioned structural units (a0), (a1), (a2) and (a5), as long as the effects of the present invention are not impaired.

As such a structural unit, any other structural unit which cannot be classified as one of the above structural units (a0), (a1), (a2) and (a5) can be used without any particular limitations, and any of the multitude of conventional structural units used within resist resins for ArF excimer lasers or KrF excimer lasers (and particularly for ArF excimer lasers) can be used.

As such a structural unit, for example, a structural unit (a3) derived from an acrylate ester containing a polar group-containing aliphatic hydrocarbon group, a structural unit (a4) derived from an acrylate ester containing a non-acid-dissociable aliphatic polycyclic group, or the like is preferable.

Structural Unit (a3)

The structural unit (a3) is a structural unit derived from an acrylate ester containing a polar group-containing aliphatic hydrocarbon group. However, it should be noted that the structural unit (a3) does not include the structural units represented by the aforementioned general formulas (a0-1) and (a5-1).

When the component (A1) includes the structural unit (a3), the hydrophilicity of the component (A) is enhanced, and hence, the compatibility of the component (A) with the developing solution is improved. As a result, the alkali solubility of the exposed portions improves, which contributes to favorable improvements in the resolution.

Examples of the polar group include a hydroxyl group, a cyano group, a carboxyl group, or a hydroxyalkyl group in which a part of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group that contains a hydroxyl group, a cyano group, a carboxyl group or a hydroxyalkyl group in which some of the hydrogen atoms of the alkyl group have been substituted with fluorine atoms are particularly desirable. Examples of the polycyclic groups include groups in which two or more hydrogen atoms have been removed from a bicycloalkane, a tricycloalkane, a tetracycloalkane or the like. Specific examples include groups in which two or more hydrogen atoms have been removed from a polycycloalkane such as an adamantane, a norbornane, an isobornane, a tricyclodecane or a tetracyclododecane. Of these polycyclic groups, groups in which two or more hydrogen atoms have been removed from adamantane, groups in which two or more hydrogen atoms have been removed from norbornane, and groups in which two or more hydrogen atoms have been removed from tetracyclododecane are preferred industrially.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by general formulas (a3-1) and (a3-2) shown below are preferable.

[Chemical Formula 43]

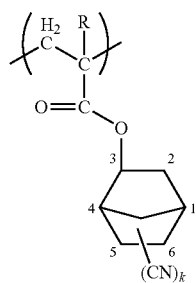

(a3-1)

-continued

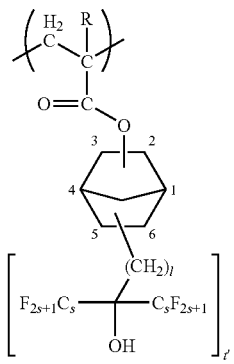

(a3-2)

[In the formulas, R is the same as defined above; k represents an integer of 1 to 3; t' represents an integer of 1 to 3; 1 represents an integer of 1 to 5; and s represents an integer of 1 to 3.]

In general formula (a3-1), k is preferably 1. The cyano group is preferably bonded to the 5th or 6th position of the norbornyl group.

In formula (a3-2), t' is preferably 1, 1 is preferably 1 and s is preferably 1. Further, it is preferable that a 2-norbonyl group or 3-norbornyl group be bonded to the terminal of the carboxyl group of the acrylic acid. The fluorinated alkyl alcohol is preferably bonded to the 5th or 6th position of the norbornyl group.

As the structural unit (a3), one type of structural unit may be used alone, or two or more types of structural units may be used in combination.

In the component (A1), the amount of the structural unit (a3) based on the combined total of all structural units constituting the component (A1) is preferably 1 to 40 mol %, more preferably 5 to 35 mol %, and still more preferably 10 to 35 mol %. By making the amount of the structural unit (a3) at least as large as the lower limit of the above-mentioned range, the effect of using the structural unit (a3) can be satisfactorily achieved. On the other hand, by making the amount of the structural unit (a3) no more than the upper limit of the above-mentioned range, a good balance can be achieved with the other structural units.

Structural Unit (a4)

The structural unit (a4) is a structural unit derived from an acrylate ester that contains a non-acid dissociable, aliphatic polycyclic group.

Examples of this polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, an adamantyl group, a tetracyclododecanyl group, an isobornyl group and a norbornyl group is particularly desirable. These polycyclic groups may be substituted with a linear or branched alkyl group of 1 to 5 carbon atoms.

Specific examples of the structural unit (a4) include structural units with structures represented by general formulas (a4-1) to (a4-5) shown below.

[Chemical Formula 44]

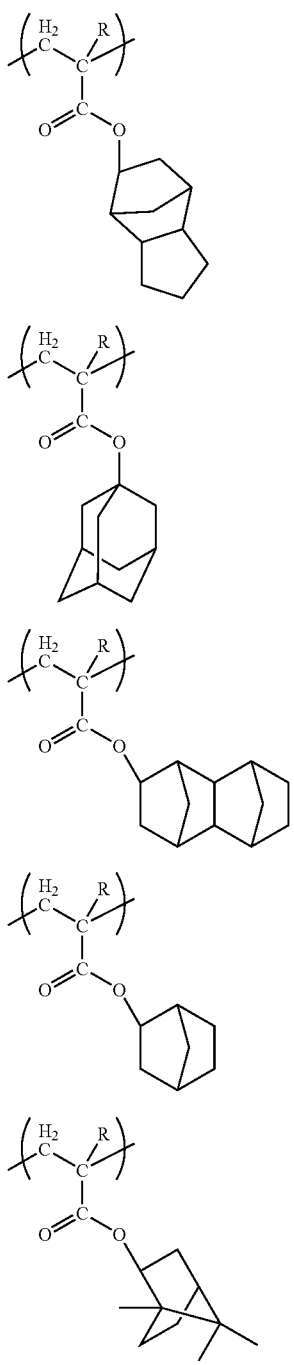

[In the formulas, R is the same as defined above.]

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

In the present invention, the component (A1) is a resin component having the structural units (a0), (a1), (a2) and (a5). As such resin components, a polymeric compound having the structural units (a0), (a1), (a2) and (a5) is preferable.

Examples of such polymeric compounds include a copolymer consisting of the structural units (a0), (a1), (a2) and (a5); a copolymer consisting of the structural units (a0), (a1), (a2), (a5) and (a3); a copolymer consisting of the structural units (a0), (a1), (a2), (a5) and (a4); a copolymer consisting of the structural units (a0), (a1), (a2), (a5), (a3) and (a4).

In the present invention, as the component (A1), polymeric compounds (A1-1) and (A1-2) that include a combination of structural units such as that shown below are particularly desirable.

[Chemical Formula 45]

Polymeric compound (A1-1)

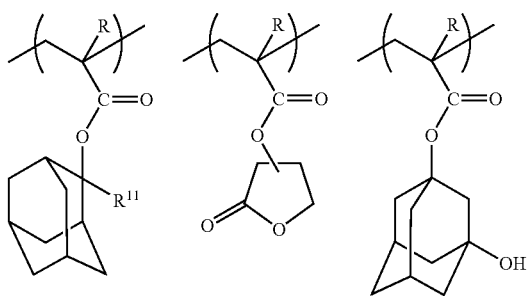

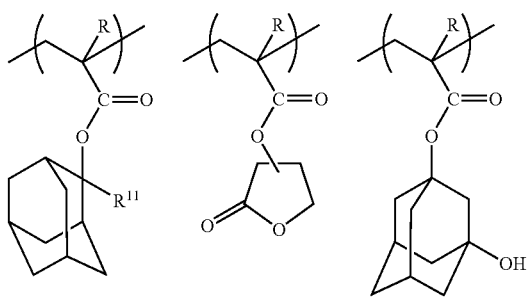

Polymeric compound (A1-2)

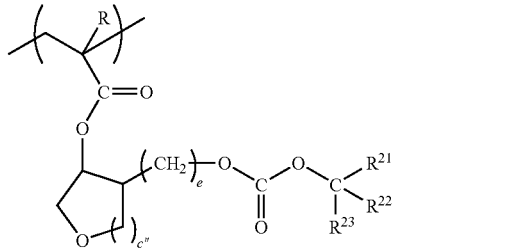

[In formulas, R is the same as defined above, and the plurality of R may be either the same or different from each other; $R^{11}$ is the same as defined for $R^{11}$ in formula (a1-1-01) above; $R^{21}$ to $R^{23}$ are the same as defined for $R^{21}$ to $R^{23}$ in formula (II) above; e is the same as defined for e in formula (a0-1) above; and c" is the same as defined for c" in formula (a0-1-2) above.]

In the polymeric compounds (A1-1) and (A1-2), $R^{11}$ is preferably a methyl group or an ethyl group.

It is preferable that each of $R^{21}$ to $R^{23}$ independently represent an alkyl group of 1 to 5 carbon atoms, more preferably an alkyl group of 1 to 3 carbon atoms, and it is particularly desirable that all of $R^{21}$ to $R^{23}$ represent methyl groups so as to form a tert-butyl group.

e is preferably 0 or 1, and more preferably 0.

In the polymeric compound (A1-2), c'' is preferably 1 or 2, and more preferably 1.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), for example, by using a chain transfer agent such as HS—$CH_2$—$CH_2$—$CH_2$—C$(CF_3)_2$—OH during the polymerization, a —C$(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

The weight average molecular weight (Mw) (the polystyrene equivalent value determined by gel permeation chromatography) of the component (A1) is not particularly limited, but is preferably 2,000 to 50,000, more preferably 3,000 to 30,000, and most preferably 5,000 to 20,000. By ensuring that the weight average molecular weight is no more than the upper limit of the above-mentioned range, the component (A1) exhibits satisfactory solubility in a resist solvent when used as a resist. On the other hand, by ensuring that the weight average molecular weight is at least as large as the lower limit of the above-mentioned range, the dry etching resistance and cross-sectional shape of the resist pattern become satisfactory.

Further, the dispersity (Mw/Mn) is preferably 1.0 to 5.0, more preferably 1.0 to 3.0, and most preferably 1.2 to 2.5. Here, Mn is the number average molecular weight.

In the component (A), as the component (A1), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties are improved. Furthermore, the solubility of the base material component (A) in an organic solvent is improved.

In the positive resist composition of the present invention, the component (A) may contain a base material component which exhibits increased solubility in an alkali developing solution under the action of acid other than the component (A1) (hereafter, referred to as "component (A')").

The component (A') is not particularly limited, and any of the multitude of conventional base material components used within chemically amplified positive resist compositions (e.g., base resins used within chemically amplified resist compositions for ArF excimer lasers or KrF excimer lasers, preferably ArF excimer lasers) can be used. For example, as a base resin for ArF excimer laser, a resin component having the aforementioned structural unit (a1) as an essential component, and optionally the aforementioned structural units (a2) to (a5) can be used. Further, the component (A) may contain a low molecular weight compound (A2) (hereafter, referred to as "component (A2)") which is a non-polymer having a molecular weight of 500 to less than 4,000. The component (A2) is the same as the component (A2') described later, and examples of the component (A2) are also the same as those for the component (A2').

As the component (A'), one type may be used alone, or two or more types may be used in combination.

In the positive resist composition of the present invention, the amount of the component (A) can be appropriately adjusted depending on the thickness of the resist film to be formed, and the like.

<Component (B)>

In the present invention, as an acid generator component (B) (hereafter, referred to as "component (B)"), there is no particular limitation, and any of the known acid generators used in conventional chemically amplified resist compositions can be used.

Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator, for example, a compound represented by general formula (b-1) or (b-2) shown below can be used.

[Chemical Formula 46]

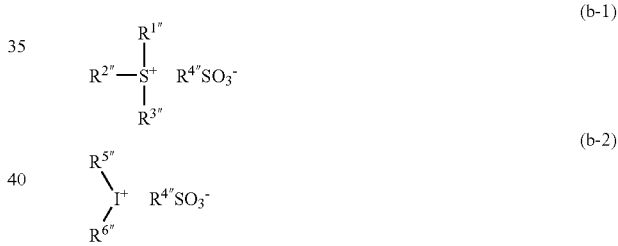

[In the formulas, $R^{1'''}$ to $R^{3'''}$, $R^{5'''}$ and $R^{6'''}$ each independently represents an aryl group or an alkyl group, wherein two of $R^{1'''}$ to $R^{3'''}$ in formula (b-1) may be bonded to each other to form a ring with the sulfur atom in the formula; and $R^{4'''}$ represents an alkyl group, a halogenated alkyl group, an aryl group or an alkenyl group which may have a substituent; with the proviso that at least one of $R^{1'''}$ to $R^{3'''}$ represents an aryl group, and at least one of $R^{5'''}$ and $R^{6'''}$ represents an aryl group.]

In formula (b-1), $R^{1'''}$ to $R^{3'''}$ each independently represents an aryl group or an alkyl group. In formula (b-1), two of $R^{1'''}$ to $R^{3'''}$ may be bonded to each other to form a ring with the sulfur atom in the formula.

Further, among $R^{1'''}$ to $R^{3'''}$, at least one group represents an aryl group. Among $R^{1'''}$ to $R^{3'''}$, two or more groups are preferably aryl groups, and it is particularly desirable that all of $R^{1'''}$ to $R^{3'''}$ are aryl groups.

The aryl group for $R^{1'''}$ to $R^{3'''}$ is not particularly limited. For example, an aryl group having 6 to 20 carbon atoms may be used in which part or all of the hydrogen atoms of the aryl group may or may not be substituted with alkyl groups, alkoxy groups, halogen atoms or hydroxyl groups.

The aryl group is preferably an aryl group having 6 to 10 carbon atoms because it can be synthesized at a low cost.

Specific examples thereof include a phenyl group and a naphthyl group.

The alkyl group, with which hydrogen atoms of the aryl group may be substituted, is preferably an alkyl group having 1 to 5 carbon atoms, and more preferably a methyl group, an ethyl group, a propyl group, a n-butyl group, or a tert-butyl group.

The alkoxy group, with which hydrogen atoms of the aryl group may be substituted, is preferably an alkoxy group having 1 to 5 carbon atoms, and more preferably a methoxy group, an ethoxy group, a n-propoxy group, an iso-propoxy group, a n-butoxy group or a tert-butoxy group, and most preferably a methoxy group or an ethoxy group.

The halogen atom, with which hydrogen atoms of the aryl group may be substituted, is preferably a fluorine atom.

The alkyl group for $R^{1''}$ to $R^{3''}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, a n-propyl group, an isopropyl group, a n-butyl group, an isobutyl group, a n-pentyl group, a cyclopentyl group, a hexyl group, a cyclohexyl group, a nonyl group, and a decanyl group, and a methyl group is most preferable because it is excellent in resolution and can be synthesized at a low cost.

When two of $R^{1''}$ to $R^{3''}$ in formula (b-1) are bonded to each other to form a ring with the sulfur atom in the formula, it is preferable that the two of $R^{1''}$ to $R^{3''}$ form a 3 to 10-membered ring including the sulfur atom, and it is particularly desirable that the two of $R^{1''}$ to $R^{3''}$ form a 5 to 7-membered ring including the sulfur atom.

When two of $R^{1''}$ to $R^{3''}$ in formula (b-1) are bonded to each other to form a ring with the sulfur atom in the formula, the remaining one of $R^{1''}$ to $R^{3''}$ is preferably an aryl group. As examples of the aryl group, the same as the above-mentioned aryl groups for $R^{1''}$ to $R^{3''}$ can be given.

As preferable examples of the cation moiety for the compound represented by general formula (b-1), those represented by formulas (I-1-1) to (I-1-10) shown below can be given. Among these, a cation moiety having a triphenylmethane skeleton, such as a cation moiety represented by any one of formulas (I-1-1) to (I-1-8) shown below is particularly desirable.

In formulas (I-1-9) and (I-1-10) shown below, each of $R^9$ and $R^{10}$ independently represents a phenyl group or a naphthyl group which may have a substituent, an alkyl group of 1 to 5 carbon atoms, an alkoxy group or a hydroxyl group.

u is an integer of 1 to 3, and most preferably 1 or 2.

[Chemical Formula 47]

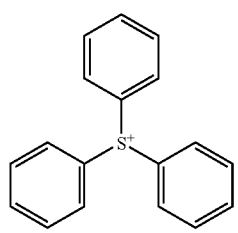
(I-1-1)

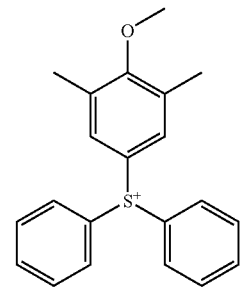
(I-1-2)

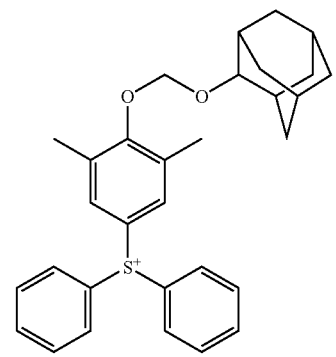
(I-1-3)

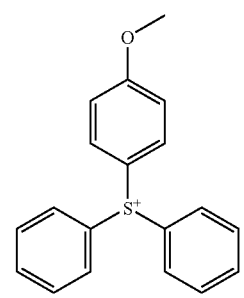
(I-1-4)

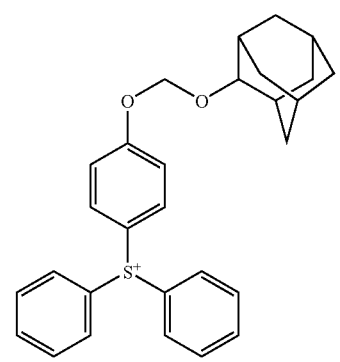
(I-1-5)

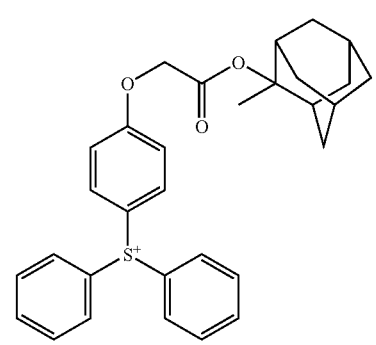
(I-1-6)

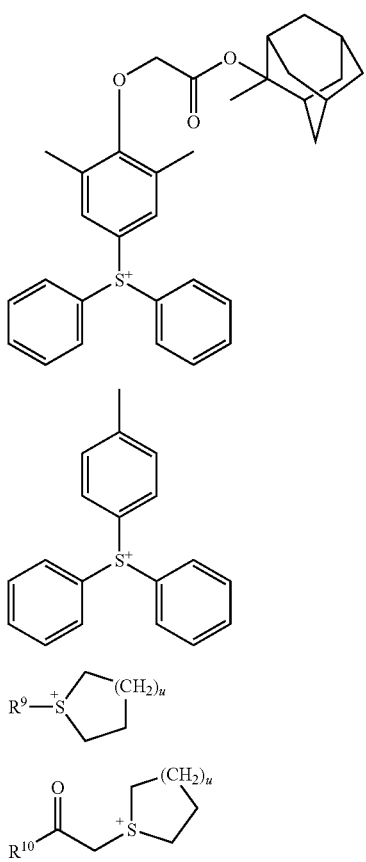

$R^{4''}$ represents an alkyl group, a halogenated alkyl group, an aryl group or an alkenyl group which may have a substituent.

The alkyl group for $R^{4''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group is preferably has 4 to 15 carbon atoms, more preferably 4 to 10 carbon atoms, and most preferably 6 to 10 carbon atoms.

As an example of the halogenated alkyl group for $R^{4''}$, a group in which part of or all of the hydrogen atoms of the aforementioned linear, branched or cyclic alkyl group have been substituted with halogen atoms can be given. Examples of the halogen atom include a fluorine atom, a chlorine atom, a bromine atom and an iodine atom, and a fluorine atom is particularly desirable.

In the halogenated alkyl group, the ratio of the number of halogen atoms relative to the combined total of halogen atoms and hydrogen atoms within the halogenated alkyl group (namely, the halogenation ratio (%)) is preferably 10 to 100%, more preferably 50 to 100%, and is most preferably 100% (i.e., a halogenated alkyl group in which all of the hydrogen atoms have been substituted with halogen atoms is most preferable). Higher halogenation ratios are preferable, as they result in increased acid strength.

The aryl group for $R^{4''}$ is preferably an aryl group of 6 to 20 carbon atoms.

The alkenyl group for $R^{4''}$ is preferably an alkenyl group of 2 to 10 carbon atoms.

With respect to $R^{4''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4''}$ may have one substituent, or two or more substituents.

Examples of the substituent include a halogen atom, a hetero atom, an alkyl group, and a group represented by formula X-$Q^1$- [in the formula, $Q^1$ represents a divalent linking group containing an oxygen atom; and X represents a hydrocarbon group of 3 to 30 carbon atoms which may have a substituent].

Examples of the halogen atom and alkyl group include the same halogen atoms and alkyl groups as those described above with respect to the halogenated alkyl group for $R^{4''}$.

Examples of the hetero atom include an oxygen atom, a nitrogen atom, and a sulfur atom.

In the group represented by formula X-$Q^1$-, $Q^1$ represents a divalent linking group containing an oxygen atom.

$Q^1$ may contain an atom other than an oxygen atom. Examples of the atom other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amide bond (—C(=O)—NH—), a carbonyl group (—C(=O)—) and a carbonate group (—O—C(=O)—O—); and combinations of the aforementioned non-hydrocarbon, oxygen atom-containing linking groups with an alkylene group.

Specific examples of the combinations of the aforementioned non-hydrocarbon, oxygen atom-containing linking groups and an alkylene group include —$R^{91}$—O—, —$R^{92}$—O—C(=O)— and —C(=O)—O—$R^{93}$—O—C(=O)— (in the formula, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5 carbon atoms, and most preferably 1 to 3 carbon atoms.

Specific examples of the alkylene group include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$—, and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

As $Q^1$, a divalent linking group containing an ester bond or an ether bond is preferable, and a group —$R^{91}$—O—, —$R^{92}$—O—C(=O)— or —C(=O)—O—$R^{93}$—O—C(=O)— is particularly desirable.

In the group represented by formula X-$Q^1$-, the hydrocarbon group for X may be either an aromatic hydrocarbon group or an aliphatic hydrocarbon group.

An aromatic hydrocarbon group is a hydrocarbon group having an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms within a substituent(s) is not included in the number of carbon atoms of the aromatic hydrocarbon group.

Specific examples of the aromatic hydrocarbon group include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an arylalkyl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atoms, more preferably 1 or 2 carbon atoms, and most preferably 1 carbon atom.

The aromatic hydrocarbon group may have a substituent. For example, a part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which a part of the carbon atoms constituting the ring within the aforementioned aryl group has been substituted with a hetero atom such as an oxygen atom, a sulfur atom or a nitrogen atom, and a heteroarylalkyl group in which a part of the carbon atoms constituting the aromatic hydrocarbon ring within the aforementioned arylalkyl group has been substituted with the aforementioned hetero atom can be used.

In the latter example, as the substituent for the aromatic hydrocarbon group, an alkyl group, an alkoxy group, a halogen atom, a halogenated alkyl group, a hydroxyl group, an oxygen atom (═O) or the like can be used.

The alkyl group as the substituent for the aromatic hydrocarbon group is preferably an alkyl group of 1 to 5 carbon atoms, and a methyl group, an ethyl group, a propyl group, a n-butyl group or a tert-butyl group is particularly desirable.

The alkoxy group as the substituent for the aromatic hydrocarbon group is preferably an alkoxy group having 1 to 5 carbon atoms, more preferably a methoxy group, an ethoxy group, a n-propoxy group, an iso-propoxy group, a n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Examples of the halogenated alkyl group as the substituent for the aromatic hydrocarbon group include a group in which a part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be any of linear, branched or cyclic.

In the aliphatic hydrocarbon group for X, a part of the carbon atoms constituting the aliphatic hydrocarbon group may be substituted with a substituent group containing a hetero atom, or a part or all of the hydrogen atoms constituting the aliphatic hydrocarbon group may be substituted with a substituent group containing a hetero atom.

As the "hetero atom" for the aliphatic hydrocarbon group, there is no particular limitation as long as it is an atom other than a carbon atom and a hydrogen atom. Examples of hetero atoms include a halogen atom, an oxygen atom, a sulfur atom and a nitrogen atom. Examples of halogen atoms include a fluorine atom, a chlorine atom, an iodine atom and a bromine atom.

The substituent group containing a hetero atom may consist solely of the aforementioned hetero atom, or may be a group containing a group or atom other than the aforementioned hetero atom.

Specific examples of the substituent group for substituting a part of the carbon atoms include —O—, —C(═O)—O—, —C(═O)—, —O—C(═O)—O—, —C(═O)—NH—, —NR$^{06}$— wherein R$^{06}$ represents an alkyl group, an acyl group or the like), —S—, —S(═O)$_2$— and —S(═O)$_2$—O—. When the aliphatic hydrocarbon group is cyclic, the aliphatic hydrocarbon group may contain any of these substituent groups in the ring structure.

In the group —NR$^{06}$—, R$^{06}$ represents an alkyl group, an acyl group or the like, and the substituent group (namely, an alkyl group, an acyl group or the like) preferably has 1 to 10 carbon atoms, more preferably 1 to 8 carbon atoms, and most preferably 1 to 5 carbon atoms.

Specific examples of the substituent group for substituting a part or all of the hydrogen atoms include an alkoxy group, a halogen atom, a halogenated alkyl group, a hydroxyl group, an oxygen atom (═O) and a cyano group.

The aforementioned alkoxy group is preferably an alkoxy group having 1 to 5 carbon atoms, more preferably a methoxy group, an ethoxy group, a n-propoxy group, an iso-propoxy group, a n-butoxy group or a tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Examples of the aforementioned halogenated alkyl group include a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15 carbon atoms, and most preferably 1 to 10 carbon atoms. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15 carbon atoms, and most preferably 3 to 10 carbon atoms. Specific examples include a 1-methylethyl group, a 1-methylpropyl group, a 2-methylpropyl group, a 1-methylbutyl group, a 2-methylbutyl group, a 3-methylbutyl group, an 1-ethylbutyl group, an 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

As the aliphatic cyclic group, a group in which one or more hydrogen atoms have been removed from a monocycloalkane or a polycycloalkane such as a bicycloalkane, a tricycloalkane or a tetracycloalkane can be used. Specific examples include groups in which one or more hydrogen atoms have been removed from a monocycloalkane such as a cyclopentane or a cyclohexane; and groups in which one or more hydrogen atoms have been removed from a polycycloalkane such as an adamantane, a norbornane, an isobornane, a tricyclodecane or a tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formula 48]

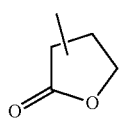
(L1)

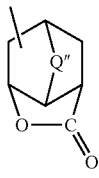
(L2)

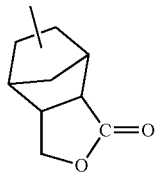
(L3)

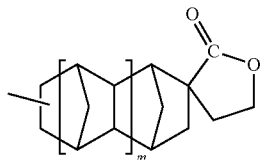
(L5)

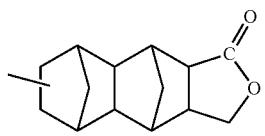
(S1)

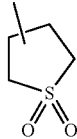
(S2)

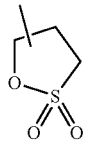
(S3)

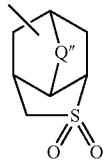
(S4)

[In the formula, Q″ represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms); and m represents an integer of 0 or 1.]

In the formula, as the alkylene group for Q″, R$^{94}$ and R$^{95}$, the same alkylene groups as those described above for R$^{91}$ to R$^{93}$ can be used.

In these aliphatic cyclic groups, a part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, a n-butyl group or a tert-butyl group is particularly desirable.

As the alkoxy group and the halogen atom, the same groups as the aforementioned substituent groups for substituting a part or all of the hydrogen atoms can be used.

Among the examples described above, as X, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and the aforementioned groups represented by formulas (L2) to (L5), (S3) and (S4) are preferable.

Further, in the present invention, it is particularly desirable that X have a polar moiety, because it results in improved lithographic properties and resist pattern shape.

Specific examples of X having a polar moiety include those in which a part of the carbon atoms constituting the aliphatic hydrocarbon group for X is substituted with a substituent group containing a hetero atom such as —O—, —C(=O)—O—, —C(=O)—, —O—C(=O)—O—, —C(=O)—NH—, —NR$^{06}$— (wherein R$^{06}$ represents an alkyl group, an acyl group or the like), —S—, —S(=O)$_2$— and —S(=O)$_2$—O—.

In the present invention, R$^{4"}$ preferably has a group represented by formula X-Q$^1$- as a substituent. In this case, R$^{4"}$ is preferably a group represented by formula X-Q$^1$-Y$^4$— [in the formula, Q$^1$ and X are the same as defined above; and Y$^4$ represents an alkylene group of 1 to 4 carbon atoms which may have a substituent, or a fluorinated alkylene group of 1 to 4 carbon atoms which may have a substituent].

In the group represented by formula X-Q$^1$-Y$^4$—, as the alkylene group for Y$^4$, the same alkylene group as those described above for Q$^1$ in which the number of carbon atoms is 1 to 4 can be used.

As the fluorinated alkylene group for Y$^4$, groups in which part of or all of the hydrogen atoms in the alkylene group are substituted with fluorine atoms can be used.

Specific examples of Y$^4$ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, and —C(CF$_3$)(CF$_2$CF$_3$)—; —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, and —C(CF$_3$)$_2$CH$_2$—, —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)—, and —C(CH$_3$)(CH$_2$CH$_3$)—.

Y$^4$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, and —CF(CF$_2$CF$_3$)CF$_2$—; —CH$_2$CF$_2$—, —CH$_2$CH$_2$CF$_2$—, and —CH$_2$CF$_2$CF$_2$—; —CH$_2$CH$_2$CH$_2$CF$_2$—, —CH$_2$CH$_2$CF$_2$CF$_2$—, and —CH$_2$CF$_2$CF$_2$CF$_2$—.

Among these, —CF$_2$—, —CF$_2$CF$_2$—, —CF$_2$CF$_2$CF$_2$—, and CH$_2$CF$_2$CF$_2$— are preferable, —CF$_2$—, —CF$_2$CF$_2$— and —CF$_2$CF$_2$CF$_2$— are more preferable, and —CF$_2$— is particularly desirable.

The alkylene group or fluorinated alkylene group for Y$^4$ may have a substituent. The alkylene group or fluorinated alkylene group "has a substituent" means that part or all of the hydrogen atoms or fluorine atoms in the alkylene group or fluorinated alkylene group have been substituted with atoms or groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

In the above formula (b-2), R$^{5"}$ and R$^{6"}$ each independently represents an aryl group or an alkyl group. At least one of R$^{5"}$ and R$^{6"}$ represents an aryl group. It is preferable that both of R$^{5"}$ and R$^{6"}$ represent an aryl group.

As the aryl group for R$^{5"}$ and R$^{6"}$, the same as the aryl groups for R$^{1"}$ to R$^{3"}$ can be mentioned.

As the alkyl group for R$^{5"}$ and R$^{6"}$, the same as the alkyl groups for R$^{1"}$ to R$^{3"}$ can be mentioned.

It is particularly desirable that both of R$^{5"}$ and R$^{6"}$ represent a phenyl group.

As R$^{4"}$ in formula (b-2), the same as those mentioned above for R$^{4"}$ in formula (b-1) can be used.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by an alkyl sulfonate such as a methanesulfonate, a n-propanesulfonate, a n-butanesulfonate, or an n-octanesulfonate.

Furthermore, onium salts in which the anion moiety of these onium salts is replaced by an anion moiety represented by any one of formulas (b1) to (b8) shown below can also be used.

[Chemical Formula 49]

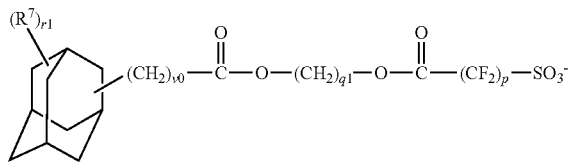

(b1)

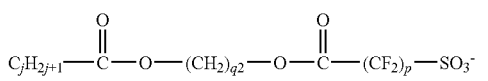

(b2)

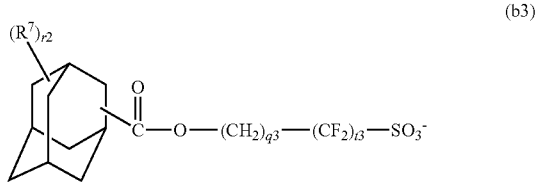

(b3)

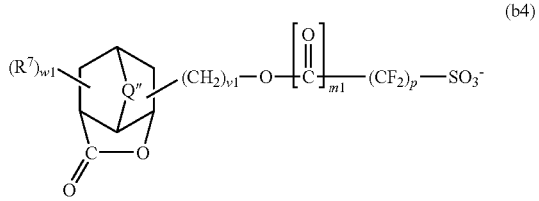

(b4)

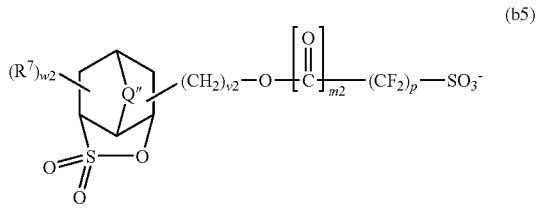

(b5)

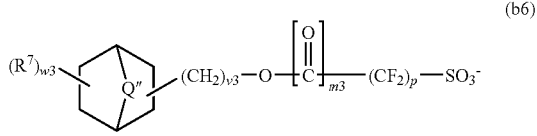

(b6)

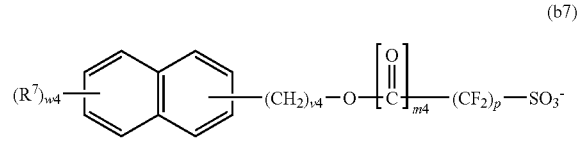

(b7)

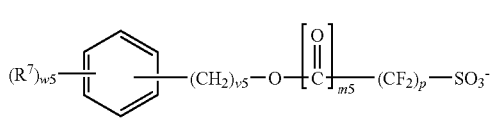

(b8)

[In the formulas, p represents an integer of 1 to 3; each of q1 and q2 independently represents an integer of 1 to 5; q3 represents an integer of 1 to 12; t3 represents an integer of 1 to 3; each of r1 and r2 independently represents an integer of 0 to 3; j represents an integer of 1 to 20; $R^7$ represents a substituent; each of m1 to m5 independently represents 0 or 1; each of v0 to v5 independently represents an integer of 0 to 3; each of w1 to w5 independently represents an integer of 0 to 3; and Q" is the same as defined above.]

As the substituent for $R^7$, the same groups as those which the aforementioned aliphatic hydrocarbon group or an aromatic hydrocarbon group for X may have as a substituent can be used.

When the subscripts (r1 and r2, and w1 to w5) of $R^7$ represent an integer of 2 or more, the plurality of $R^7$ within the compound may be the same or different from each other.

Further, as an onium salt-based acid generator, onium salt-based acid generators in which the anion moiety in the aforementioned general formula (b-1) or (b-2) is replaced by an anion moiety represented by general formula (b-3) or (b-4) shown below (the cation moiety is the same as the cation moiety represented in formula (b-1) or (b-2)) may also be used.

[Chemical Formula 50]

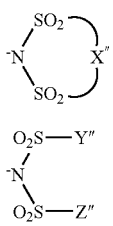

(b-3)

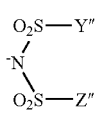

(b-4)

[In the formulas, X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.]

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group for X" or those of the alkyl group for Y" and Z" within the above-mentioned range of the number of carbon atoms, the more preferable since the solubility in a resist solvent is improved.

Further, in the alkylene group for X" or the alkyl group for Y" and Z", it is preferable that the number of hydrogen atoms substituted with fluorine atoms be as large as possible because the acid strength increases and the transparency to high energy radiation of 200 nm or less or electron beam is improved.

The percentage of the fluorine atoms within the alkylene group or alkyl group, i.e., the fluorination ratio is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

Furthermore, as an onium salt-based acid generator, a sulfonium salt having a cation moiety represented by general formula (b-5) or (b-6) shown below may be used.

[Chemical Formula 51]

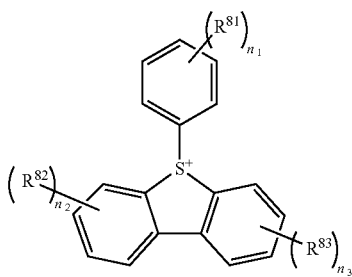

(b-5)

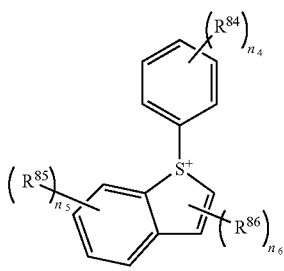

(b-6)

[In the formulas, each of $R^{81}$ to $R^{86}$ independently represents an alkyl group, an acetyl group, an alkoxy group, a carboxyl group, a hydroxyl group or a hydroxyalkyl group; each of $n_1$ to $n_5$ independently represents an integer of 0 to 3; and $n_6$ represents an integer of 0 to 2.]

With respect to $R^{81}$ to $R^{86}$, the alkyl group is preferably an alkyl group of 1 to 5 carbon atoms, more preferably a linear or branched alkyl group, and most preferably a methyl group, an ethyl group, a propyl group, an isopropyl group, a n-butyl group or a tert butyl group.

The alkoxy group is preferably an alkoxy group of 1 to 5 carbon atoms, more preferably a linear or branched alkoxy group, and most preferably a methoxy group or an ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

When the subscripts $n_1$ to $n_6$ of $R^{81}$ to $R^{86}$ represent an integer of 2 or more, the plurality of $R^{81}$ to $R^{86}$ may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used. Examples of such anion moieties include fluorinated alkylsulfonic acid ions such as anion moieties ($R^{4"}SO_3^-$) for onium salt-based acid generators represented by general formula (b-1) or (b-2) shown above; and anion moieties represented by general formula (b-3) or (b-4) shown above.

In the present description, an oximesulfonate-based acid generator is a compound having at least one group represented by general formula (B-1) shown below, and has a feature of generating acid by irradiation (exposure). Such oximesulfonate-based acid generators are widely used for a chemically amplified resist composition, and can be selected as appropriate.

[Chemical Formula 52]

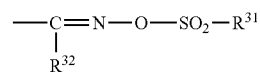

(B-1)

[In formula (B-1), $R^{31}$ and $R^{32}$ each independently represents an organic group.]

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, an aryl group, or a cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferable examples of the oxime sulfonate-based acid generator include compounds represented by general formula (B-2) or (B-3) shown below.

[Chemical Formula 53]

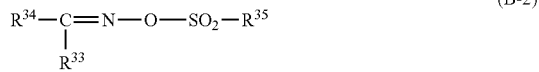

(B-2)

[In formula (B-2), $R^{33}$ represents a cyano group, an alkyl group having no substituent or a halogenated alkyl group; $R^{34}$ represents an aryl group; and $R^{35}$ represents an alkyl group having no substituent or a halogenated alkyl group.]

[Chemical Formula 54]

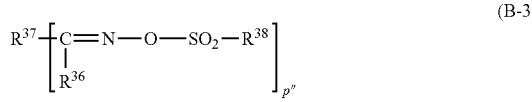

(B-3)

[In formula (B-3), $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.]

In general formula (B-2) above, the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom or a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3) above, the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same alkyl groups having no substituent or the halogenated alkyl groups mentioned above for $R^{35}$ can be used.

p" is preferably 2.

Specific examples of suitable oxime sulfonate-based acid generators include
α-(p-toluenesulfonyloxyimino)benzyl cyanide,
α-(p-chlorobenzenesulfonyloxyimino)benzyl cyanide,
α-(4-nitrobenzenesulfonyloxyimino)benzyl cyanide,
α-(4-nitro-2-trifluoromethylbenzenesulfonyloxyimino)benzyl cyanide,
α-(benzenesulfonyloxyimino)-4-chlorobenzyl cyanide,
α-(benzenesulfonyloxyimino)-2,4-dichlorobenzyl cyanide,
α-(benzenesulfonyloxyimino)-2,6-dichlorobenzyl cyanide,
α-(benzenesulfonyloxyimino)-4-methoxybenzyl cyanide,
α-(2-chlorobenzenesulfonyloxyimino)-4-methoxybenzyl cyanide,
α-(benzenesulfonyloxyimino)thien-2-ylacetonitrile,
α-(4-dodecylbenzenesulfonyloxyimino)benzyl cyanide,
α-[(p-toluenesulfonyloxyimino)-4-methoxyphenyl]acetonitrile,
α-[(dodecylbenzenesulfonyloxyimino)-4-methoxyphenyl] acetonitrile,
α-(tosyloxyimino)-4-thienyl cyanide, α-(methylsulfonyloxyimino)-1-cyclopentenyl acetonitrile, α-(methylsulfonyloxyimino)-1-cyclohexenylacetonitrile,
α-(methylsulfonyloxyimino)-1-cycloheptenylacetonitrile,
α-(methylsulfonyloxyimino)-1-cyclooctenylacetonitrile,
α-(trifluoromethylsulfonyloxyimino)-1-cyclopentenylacetonitrile,
α-(trifluoromethylsulfonyloxyimino)cyclohexylacetonitrile,
α-(ethylsulfonyloxyimino)ethylacetonitrile,
α-(propylsulfonyloxyimino)propylacetonitrile,
α-(cyclohexylsulfonyloxyimino)cyclopentylacetonitrile,
α-(cyclohexylsulfonyloxyimino)cyclohexylacetonitrile,
α-(cyclohexylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile,
α-(n-butylsulfonyloxyimino)-1-cyclohexenylacetonitrile,
α-(methylsulfonyloxyimino)phenylacetonitrile,
α-(methylsulfonyloxyimino)-p-methoxyphenylacetonitrile,
α-(trifluoromethylsulfonyloxyimino)phenylacetonitrile,
α-(trifluoromethylsulfonyloxyimino)-p-methoxyphenylacetonitrile,
α-(ethylsulfonyloxyimino)-p-methoxyphenylacetonitrile,
α-(propylsulfonyloxyimino)-p-methylphenylacetonitrile, and
α-(methylsulfonyloxyimino)-p-bromophenylacetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described on pages 65 to 85) may be preferably used.

Furthermore, as preferable examples, the following can be mentioned.

[Chemical Formula 55]

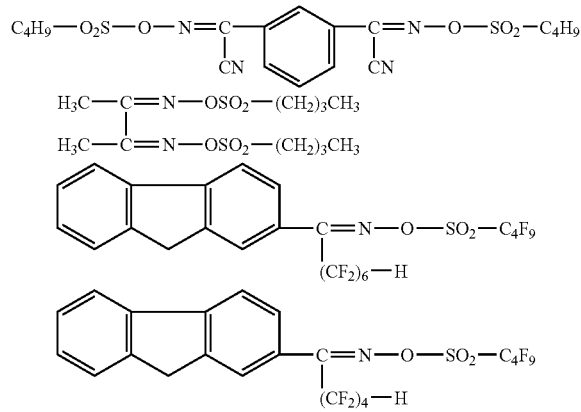

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis (phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis (cyclohexylsulfonyldiazomethylsulfonyl)ethane, 1,3-bis (cyclohexylsulfonyldiazomethylsulfonyl)propane, 1,6-bis (cyclohexylsulfonyldiazomethylsulfonyl)hexane, and 1,10-bis(cyclohexylsulfonyldiazomethylsulfonyl)decane, may be given.

As the component (B), one type of these acid generators may be used alone, or two or more types may be used in combination.

In the present invention, as the component (B), it is particularly desirable to use an onium salt-based acid generator having a fluorinated alkylsulfonic acid ion as the anion moiety.

The amount of the component (B) within the positive resist composition according to the present invention is preferably from 0.5 to 50 parts by weight, and more preferably from 1 to 40 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Component (S)>

In the positive resist composition of the present invention, an organic solvent (S) (hereafter, referred to as "component (S)") includes an alcohol-based organic solvent (S1) (hereafter, referred to as "component (S1)") and at least one organic solvent (S2) (hereafter, referred to as "component (S2)") selected from the group consisting of a propylene glycol monomethyl ether acetate, a propylene glycol monomethyl ether and a cyclohexanone.

[Component (S1)]

In the present descriptions and the claims, the term "alcohol-based organic solvent" refers to a compound in which at least one hydrogen atom within an aliphatic hydrocarbon has been substituted with an hydroxyl group, and is a liquid at normal temperature and normal pressure. The structure of the main chain constituting the aforementioned aliphatic hydrocarbon may be a chain-like structure or a cyclic structure, or may include a cyclic structure within the chain-like structure, or may include an ether bond within the chain-like structure. It should be noted that the alcohol-based organic solvent does not include propylene glycol monomethyl ether.

Examples of the component (S1) include monohydric alcohols and dihydric alcohols. More specifically, propylene glycol (PG) as the component (S1) having a chain-like structure; and 1-butoxy-2-propanol (BP), n-hexanol, 2-heptanol, 3-heptanol, 1-heptanol, 5-methyl-1-hexanol, 6-methyl-2-heptanol, 1-octanol, 2-octanol, 3-octanol, 4-octanol, 2-ethyl-1-hexanol, 2-(2-butoxyethoxy)ethanol, n-pentyl alcohol, s-pentyl alcohol, t-pentyl alcohol, isopentyl alcohol, isobutanol (also known as isobutyl alcohol or 2-methyl-1-propanol), isopropyl alcohol, 2-ethylbutanol, neopentyl alcohol, n-butanol, s-butanol, t-butanol, 1-propanol, 2-methyl-1-butanol, 2-methyl-2-butanol and 4-methyl-2-pentanol can be used.

Further, specific examples of the component (S1) having a ring structure include cyclopentane methanol, 1-cyclopentylethanol, cyclohexanol, cyclohexane methanol, cyclohexane ethanol, 1,2,3,6-tetrahydrobenzyl alcohol, exo-norborneol, 2-methylcyclohexanol, cycloheptanol, 3,5-dimethylcyclohexanol and benzyl alcohol.

As the component (S1), one type may be used alone, or two or more types may be used in combination.

Of these, as the component (S1), monohydric alcohols having a chain-like structure are preferable, and 1-butoxy-2-propanol (BP) is particularly desirable.

[Component (S2)]

The component (S2) is at least one organic solvent selected from the group consisting of propylene glycol monomethyl ether acetate (PGMEA), propylene glycol monomethyl ether (PGME) and cyclohexanone (CH).

Preferable examples of the specific combination for the components (S1) and (S2) include a combination of PGMEA with BP, a combination of PGME with BP and a combination of CH with BP.

Such mixed solvent is particularly desirable as an organic solvent for a second resist composition used in a double patterning process.

In the positive resist composition of the present invention, the amount of the component (S1) in the component (S) is within a range from 60 to 99% by weight, and the amount of the component (S2) in the component (S) is within a range from 1 to 40% by weight.

The amount of the component (S1) in the component (S) is within a range from 60 to 99% by weight, preferably from 70 to 99% by weight, more preferably from 80 to 99% by weight, and most preferably 85 to 99% by weight. When the amount of the component (S1) is at least as large as the lower limit of the above-mentioned range, the first resist pattern becomes less likely to be dissolved during the double patterning process. On the other hand, when the amount of the component (S1) is no more than the upper limit of the above-mentioned range, the solubility of the component (A1) is improved, and excellent lithography properties can be more reliably achieved.

The amount of the component (S2) in the component (S) is within a range from 1 to 40% by weight, preferably from 1 to 30% by weight, more preferably from 1 to 20% by weight, and most preferably 1 to 15% by weight. When the amount of the component (S2) is at least as large as the lower limit of the above-mentioned range, coatability of the resist composition to a substrate becomes satisfactory. Furthermore, the solubility of the component (A1) is improved, and excellent lithography properties can be more reliably achieved. On the other hand, when the amount of the component (S2) is no more than the upper limit of the above-mentioned range, the first resist pattern becomes less likely to be dissolved during the double patterning process. Furthermore, the amount of the structural unit (a2) introduced to the component (A) can be increased, and the adhesion between the resist pattern and the substrate and lithography properties can be improved.

In the component (S), the combined amount of the component (S1) and the component (S2) is preferably at least 60% by weight, more preferably at least 70% by weight, still more preferably at least 80% by weight, may be even 100% by weight, and is most preferably 100% by weight. By making the combined amount of the component (S1) and the component (S2) at least as large as the lower limit of the above-mentioned range, the effects of the present invention are improved.

[Component (S3)]

In addition to the components (S1) and (S2), the component (S) may also include an organic solvent other than the components (S1) and (S2) (hereafter, referred to as "component (S3)"), as long as the effects of the present invention are not impaired.

The component (S3) may be any organic solvent which can dissolve the resist materials used to give a uniform solution, and any one or more kinds of organic solvents can be appropriately selected from those which have been conventionally known as solvents for a chemically amplified resist.

Specific examples of the component (S3) include lactones such as γ-butyrolactone; ketones such as acetone, methyl ethyl ketone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as ethylbenzene, diethylbenzene, pentylbenzene, isopropylbenzene, toluene, xylene, cymene and mesitylene; and dimethyl sulfoxide (DMSO).

Further, as the component (S3), for example, an ether-based organic solvent having no hydroxyl group may also be used.

Here, the expression "ether-based organic solvent having no hydroxyl group" refers to a compound that contains an ether bond (C—O—C) within the molecule but has no hydroxyl group, and is a liquid at normal temperature and normal pressure.

Among the various ether-based organic solvents, it is more preferable that the ether-based organic solvent be a compound having neither a hydroxyl group nor a carbonyl group.

Preferable examples of the ether-based organic solvent include compounds represented by general formula (s1'-1) shown below.

(s1'-1)

[In general formula (s1'-1), $R^{74}$ and $R^{75}$ each independently represents a hydrocarbon group. Alternatively, $R^{74}$ and $R^{75}$ may be bonded to each other to form a ring. —O— represents an ether bond.]

In the aforementioned formula (s1'-1), as the hydrocarbon group for $R^{74}$ and $R^{75}$, for example, an alkyl group, an aryl group or the like can be mentioned, and an alkyl group is preferable. It is more preferable that both of $R^{74}$ and $R^{75}$ represent an alkyl group, and it is particularly desirable that $R^{74}$ and $R^{75}$ represent the same alkyl group.

The alkyl group for $R^{74}$ and $R^{75}$ is not particularly limited and includes, for example, a linear, branched or cyclic alkyl group having 1 to 20 carbon atoms. Part or all of the hydrogen atoms of the alkyl group may or may not be substituted with halogen atoms or the like.

The alkyl group preferably has 1 to 15 carbon atoms, and more preferably 1 to 10 carbon atoms, because coatability of the resist composition becomes satisfactory. Specific examples include an ethyl group, a propyl group, an isopropyl group, a n-butyl group, an isobutyl group, an n-pentyl group, an isopentyl group, a cyclopentyl group and a hexyl group, and a n-butyl group and an isopentyl group are particularly desirable.

The halogen atom, with which hydrogen atoms of the alkyl group may be substituted, is preferably a fluorine atom.

The aryl group for $R^{74}$ and $R^{75}$ is not particularly limited. For example, an aryl group having 6 to 12 carbon atoms may be used in which part or all of the hydrogen atoms of the aryl group may or may not be substituted with alkyl groups, alkoxy groups, or halogen atoms.

The aryl group is preferably an aryl group having 6 to 10 carbon atoms because it can be synthesized at a low cost. Specific examples thereof include a phenyl group, a benzyl group and a naphthyl group.

The alkyl group, with which hydrogen atoms of the aryl group may be substituted, is preferably an alkyl group having 1 to 5 carbon atoms, and more preferably a methyl group, an ethyl group, a propyl group, a n-butyl group, or a tert-butyl group.

The alkoxy group, with which hydrogen atoms of the aryl group may be substituted, is preferably an alkoxy group having 1 to 5 carbon atoms, and more preferably a methoxy group or an ethoxy group.

The halogen atom, with which hydrogen atoms of the aryl group may be substituted, is preferably a fluorine atom.

Alternatively, in general formula (s1'-1) above, $R^{74}$ and $R^{75}$ may be bonded to each other to form a ring.

In this case, $R^{74}$ and $R^{75}$ each independently represents a linear or branched alkylene group (preferably an alkylene group of 1 to 10 carbon atoms) and the terminal of $R^{74}$ and the terminal of $R^{75}$ are bonded to each other to form a ring. Further, a carbon atom of the alkylene group may be substituted with an oxygen atom.

Specific examples of such ether-based organic solvents include 1,8-cineole, tetrahydrofuran and dioxane.

The boiling point (at normal pressure) of the ether-based organic solvent is preferably within a range from 30 to 300° C., more preferably from 100 to 200° C., and still more preferably from 140 to 180° C. When the boiling point of the ether-based organic solvent is at least as large as the lower limit of the above-mentioned temperature range, the component (S) hardly evaporates during the spin coating process when applying the resist composition, thereby suppressing coating irregularities and improving the resulting coatability. On the other hand, when the boiling point of the ether-based organic solvent is no more than the upper limit of the above-mentioned temperature range, the component (S) is satisfactorily removed from the resist film by a prebake (PAB) treatment, thereby improving formability of the resist film. Further, when the boiling point of the ether-based organic solvent is within the above-mentioned temperature range, the effect of reducing the thickness loss of the resist patterns and the stability of the composition upon storage are further improved. The above-mentioned temperature range for the boiling point of the ether-based organic solvent is also preferable from the viewpoints of the heating temperature required in the PAB step and/or post exposure baking (PEB) step.

Specific examples of the ether-based organic solvent include 1,8-cineole (boiling point: 176° C.), dibutyl ether (boiling point: 142° C.), diisopentyl ether (boiling point: 171° C.), dioxane (boiling point: 101° C.), anisole (boiling point: 155° C.), ethylbenzyl ether (boiling point: 189° C.), diphenyl ether (boiling point: 259° C.), dibenzyl ether (boiling point: 297° C.), phenetole (boiling point: 170° C.), butylphenyl ether, tetrahydrofuran (boiling point: 66° C.), ethylpropyl ether (boiling point: 63° C.), diisopropyl ether (boiling point: 69° C.), dihexyl ether (boiling point: 226° C.), dipropyl ether (boiling point: 91° C.), and cresylmethyl ether.

Among various ether-based organic solvents, a cyclic or chain-like, ether-based organic solvent is preferable because the effect of reducing the thickness loss of the resist patterns becomes satisfactory, and it is particularly desirable that the ether-based organic solvent be at least one member selected from the group consisting of 1,8-cineole, dibutyl ether and diisopentyl ether.

The amount of the component (S3) within the component (S) is preferably less than 10% by weight, and more preferably within a range from 0.1 to 5% by weight.

The total amount of the component (S) used is not particularly limited, and is appropriately adjusted to a concentration which enables coating of the positive resist composition of the present invention onto a substrate, depending on the thickness of the coating film. In general, the component (S) is preferably used in an amount such that the solid content of the resist composition becomes within the range from 0.5 to 20% by weight, and more preferably from 1 to 15% by weight.

Dissolving of the resist materials in the component (S) can be conducted by simply mixing and stirring each of the above components together using conventional methods, and where required, the composition may also be mixed and dispersed using a dispersion device such as a dissolver, a homogenizer, or a triple roll mill. Furthermore, following mixing, the composition may also be filtered using a mesh, or a membrane filter or the like.

<Optional Components>

[Component (D)]

In order to improve factors such as the resist pattern shape and the post exposure stability of the latent image formed by the pattern-wise exposure of the resist layer, it is preferable that the positive resist composition of the present invention further include a nitrogen-containing organic compound (D) (hereafter referred to as "component (D)") as an optional component.

As the component (D), there is no particular limitation as long as it functions as an acid diffusion control agent, i.e., a quencher which traps the acid generated from the component (B) upon exposure. A multitude of these components (D) have already been proposed, and any of these known compounds may be used, although an aliphatic amine, and particularly a secondary aliphatic amine or tertiary aliphatic amine is preferable.

Here, an aliphatic amine is an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of no more than 20 carbon atoms (i.e., alkylamines or alkyl alcohol amines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, tri-n-octanolamine, stearyldiethanolamine and lauryldiethanolamine. Among these, trialkylamines and/or alkyl alcohol amines are preferable.

Examples of the cyclic amine include heterocyclic compounds containing a nitrogen atom as a hetero atom. The heterocyclic compound may be an aliphatic monocyclic compound (aliphatic monocyclic amine), or an aliphatic polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of aromatic amines include aniline, pyridine, 4-dimethylaminopyridine, pyrrole, indole, pyrazole, imidazole and derivatives thereof, as well as diphenylamine, triphenylamine and tribenzylamine.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine and tris[2-{2-(2-hydroxyethoxy)ethoxy}ethyl]amine.

These compounds can be used either alone, or in combinations of two or more different compounds.

In the present invention, of the various possibilities, a trialkylamine can be preferably used as the component (D).

The component (D) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

[Component (E)]

Furthermore, in the positive resist composition of the present invention, for preventing any deterioration in sensitivity, and improving the resist pattern shape and the post exposure stability of the latent image formed by the pattern-wise exposure of the resist layer, at least one compound (E) (hereafter referred to as "component (E)") selected from the group consisting of an organic carboxylic acid, or a phosphorus oxo acid or derivative thereof can be added as an optional component.

Examples of suitable organic carboxylic acids, for example, include acetic acid, malonic acid, citric acid, malic acid, succinic acid, benzoic acid, and salicylic acid.

Examples of phosphorus oxo acids, for example, include phosphoric acid, phosphonic acid and phosphinic acid. Among these, phosphonic acid is particularly desirable.

Examples of phosphorus oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

As the component (E), an organic carboxylic acid is preferable, and salicylic acid is particularly desirable.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

The positive resist composition of the present invention described above is a novel composition essentially unknown in the art.

By using a combination of the resin component (A1) having structural units (a0), (a1), (a2) and (a5) and the organic solvent (S) including the aforementioned organic solvent (S1) and the aforementioned organic solvent (S2) at a specific ratio, the positive resist composition of the present invention exhibits excellent solubility of the component (A1) in an organic solvent even when an alcohol-based organic solvent is used, thereby achieving satisfactory lithography properties and storage stability.

Moreover, the positive resist composition of the present invention also exhibits excellent coatability on a substrate and spreadability on the substrate surface, thereby forming a resist film with little variations in the film thickness within the substrate surface, and thus achieving satisfactory uniformity in the resist film thickness.

Furthermore, the positive resist composition of the present invention exhibits excellent wettability when applied to a substrate and satisfactory film formability when forming a resist film on a substrate, and also both coating irregularities and striations can be suppressed.

Further, in the positive resist composition of the present invention, the above-mentioned structural unit (a2) can be added in a larger amount, as compared to the conventional resist compositions containing an alcohol-based organic solvent which were limited in the amount of the structural unit (a2) added. As a result, the adhesion between the resist film and the substrate is enhanced, and the lithographic properties are further improved.

(Method of Forming a Resist Pattern)

As a method of forming a resist pattern using the positive resist composition according to the present invention, a method including the following steps can be preferably used; i.e., a step of applying the positive resist composition of the present invention to a substrate to form a resist film on the substrate; a step of conducting exposure of the resist film; and a step of developing the resist film to form a resist pattern.

For example, firstly, the above-mentioned positive resist composition is applied onto a substrate using a spinner or the like, and a prebake (post applied bake (PAB)) is conducted under temperature conditions of 80 to 150° C. for 40 to 120 seconds, preferably 60 to 90 seconds to form a resist film. Following selective exposure of the thus formed resist film, either by exposure through a mask pattern using an exposure apparatus such as an ArF exposure apparatus, an electron beam lithography apparatus or an EUV exposure apparatus, or by patterning via direct irradiation with an electron beam without using a mask pattern, PEB (post exposure baking) is conducted under temperature conditions of 80 to 150° C. for 40 to 120 seconds, and preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the developing. In this manner, a resist pattern that is faithful to the mask pattern can be obtained.

The substrate is not specifically limited and a conventionally known substrate can be used. For example, the same substrate as that used in the method of forming a resist pattern according to the second aspect of the present invention described later can be used.

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is effective to KrF excimer laser, ArF excimer laser, EB and EUV, and particularly effective to ArF excimer laser.

Further, according to the positive resist composition of the present invention, a resist pattern can be formed by the double patterning process without dissolving the first resist pattern formed using a first resist composition during the double patterning process. Therefore, the positive resist composition is also suitable as a resist composition for the double patterning process.

In other words, the positive resist composition according to the present invention is preferably a positive resist composition used for forming a second resist film in a method of forming a positive resist pattern, including: applying a first positive resist composition to a substrate to form a first resist film on the substrate; subjecting the first resist film to selective exposure and alkali developing to form a first resist pattern; applying a second positive resist composition on the substrate on which the first resist pattern is formed to form a second resist film; and subjecting the second resist film to selective exposure and alkali developing to form a resist pattern.

The steps conducted in the above-mentioned method of forming a positive resist pattern are the same as the steps conducted in the method of forming a resist pattern according to the second aspect of the present invention, which will be described later.

As described above, according to the positive resist composition of the present invention, a fine resist pattern can be stably formed while hardly dissolving the first resist pattern during the double patterning process. Furthermore, the positive resist composition of the present invention exhibits superior solubility in an organic solvent and coatability to a substrate, thereby forming a resist film with excellent lithography properties.

Therefore, the positive resist composition of the present invention enables the formation of fine resist patterns with high accuracy, and is thus useful.

<<Method of Forming a Resist Pattern>>

More specifically, the method for forming a resist pattern according to the present invention includes:

a step of applying a positive resist composition (hereafter, frequently referred to as "first positive resist composition") to a substrate to form a first resist film on the substrate (hereafter, referred to as "film forming step (1)");

a step of subjecting the first resist film to selective exposure and alkali developing to form a first resist pattern (hereafter referred to as "patterning step (1)");

a step of applying the positive resist composition according to the present invention to the substrate on which the first resist pattern is formed to form a second resist film (hereafter, referred to as "film forming step (2)"); and a step of subjecting the second resist film to selective exposure and alkali developing to form a resist pattern (hereafter referred to as "patterning step (2)").

Each of these steps will be described in more detail below.

[Film Forming Step (1)]

The substrate is not specifically limited and a conventionally known substrate can be used. For example, substrates for electronic components, and such substrates having wiring patterns formed thereon can be used. Specific examples of the material of the substrate include a silicon wafer; metals such as copper, chromium, iron and aluminum; and glass. Suitable materials for the wiring pattern include copper, aluminum, nickel and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) can be used.

The first resist film can be formed by a conventional method, for example, by applying a first positive resist composition on a substrate. The first positive resist composition can be applied by a conventional method using a spinner or the like.

The first positive resist composition used for forming the first resist film will be described later in detail.

More specifically, the first resist film can be formed, for example, by applying the first positive resist composition onto a substrate using a spinner or the like, and vaporizing organic solvents by conducting a bake treatment (prebake) at a temperature of 80 to 150° C. for 40 to 120 seconds, preferably 60 to 90 seconds.

The thickness of the resist film is preferably within the range from 50 to 500 nm, and more preferably from 50 to 450 nm. By ensuring that the thickness of the resist film satisfies the above-mentioned range, a resist pattern with a high level of resolution can be formed, and a satisfactory level of etching resistance can be achieved.

[Patterning Step (1)]

The patterning step can be conducted by a conventional method. For example, the first resist film is subjected to selective exposure using a mask having a predetermined pattern (mask pattern), a post exposure bake treatment (PEB) at a temperature of 80 to 150° C. for 40 to 120 seconds, preferably 60 to 90 seconds, and alkali developing using an alkali developing solution such as a 0.1 to 10% by weight aqueous solution of tetramethylammonium hydroxide (TMAH), thereby removing the exposed portions of the first resist film and forming a first resist pattern.

In some cases, the patterning step may include a post bake step following the above alkali developing.

The wavelength to be used for exposure is not particularly limited and the exposure can be conducted using radiation such as KrF excimer laser, ArF excimer laser, $F_2$ excimer laser, extreme ultraviolet rays (EUV), vacuum ultraviolet rays (VUV), electron beam (EB), X-rays, and soft X-rays.

The selective exposure of the first resist film can be either a general exposure (dry exposure) conducted in air or an inert gas such as nitrogen, or immersion exposure (immersion lithography).

In immersion lithography, exposure (immersion exposure) is conducted in a state where the region between the lens and the resist film formed on a wafer (which was conventionally filled with air or an inert gas such as nitrogen) is filled with a solvent (an immersion medium) that has a larger refractive index than the refractive index of air.

More specifically, the immersion lithography is an exposure method in which the region between the resist film formed in the above-described manner and lens at the lowermost portion of the exposure apparatus is filled with a solvent (an immersion medium) that has a larger refractive index than the refractive index of air, and in this state, the resist film is subjected to exposure (immersion exposure) through a desired mask pattern.

The immersion medium preferably exhibits a refractive index larger than the refractive index of air but smaller than the refractive index of the resist film (i.e., the first resist film in the patterning step (1)) to be subjected to immersion exposure. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which preferably have a boiling point within a range from 70 to 180° C. and more preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyltetrahydrofuran) (boiling point: 102° C.), and an example of a suitable perfluoroalkylamine compound is perfluorotributylamine (boiling point: 174° C.).

Furthermore, water is preferably used as an immersion medium in terms of cost, safety, environmental friendliness, versatility and the like.

[Film Forming Step (2)]

Next, by applying the above-mentioned positive resist composition according to the present invention on the substrate on which the first resist pattern is formed, a second resist film is formed which fills in the gaps between a plurality of resist patterns. The positive resist composition of the present invention spreads on a substrate in a favorable manner, thereby forming a resist film with a uniform film thickness. Further, a resist pattern can be formed without dissolving the first resist pattern.

Similar to the first resist film, the second resist film can be formed using a conventional method.

The film thickness of the second resist film is at least as thick as the first resist pattern and is preferably thicker. In other words, when the substrate is viewed from the second resist film side, it is preferable that the substrate surface be flat.

[Patterning Step (2)]

Subsequently, regions within the second resist film other than the region where a plurality of resist patterns is already formed are subjected to selective exposure and developing. Accordingly, the exposed portions of the second resist film are removed, and between a plurality of resist patterns formed previously, a plurality of resist patterns is newly formed. As a result, a resist pattern is formed on the substrate which is composed of a plurality of resist patterns formed of the first resist film, and a plurality of resist patterns newly formed on the second resist film.

In the present invention, when a first resist pattern is formed on a substrate, any region within the substrate which does not completely overlap with a region where the first resist pattern is formed is referred to as "region other than the region where the first resist pattern is formed". In other words, the expression includes a region which does not overlap at all with the region where the first resist pattern is formed, and also includes a region which only partially overlaps with the region where the first resist pattern is formed.

In the present invention, for example, when forming a resist pattern so as to ultimately form a line and space pattern, it is preferable that the region where the first resist pattern is formed and the region exposed selectively in the patterning step (2) do not overlap at all. As a result, a resist pattern can be formed with the spacing (a pitch) of the resist pattern smaller than that of the first resist pattern formed in the patterning step (1).

Selective exposure of "regions other than the region where the first resist pattern is formed" can be conducted, for example, by using a mask pattern which is different from the first mask pattern used in the patterning step (1).

For example, in the case of formation of a resist pattern of line and space pattern, an isolated line and space pattern may be formed in the patterning step (1) using a mask pattern for forming a line and space pattern, in which a plurality of lines are arranged with a constant pitch; and then a line pattern may be formed in intermediate regions between the adjacent line patterns formed in the patterning step (1) by changing the mask pattern in the patterning step (2). Accordingly, a line and space pattern can be newly formed which has a pitch as small as the half size of the pitch of the previously formed line and space pattern. In other words, a dense resist pattern can be formed with a narrower pitch than that of the isolated pattern formed previously.

Here, the term "isolated pattern" refers to a line and space pattern in which the space width is large so that the ratio of the line width to the space width (i.e., line width: space width) is 1: at least 2.

As described above, in the present invention, the first resist pattern is preferably a line and space pattern. As a result, a dense line and space pattern with a small pitch can be formed.

More specifically, for example, a line and space pattern with a line width of 100 nm and the line width:space width ratio of 1:3 (i.e., an isolated pattern) may be first formed; and then another line and space pattern with a line width of 100 nm and the line width:space width ratio of 1:3 may be formed by parallel displacement of the mask pattern by 200 nm in the direction perpendicular to the line direction, thereby ultimately forming a line and space pattern with a line width of 100 nm and the line width:space width ratio of 1:1 (i.e., a dense pattern).

Further, a fine resist pattern with or without various profiles can be formed, for example, through rotational movement of the mask pattern used in the patterning step (1), or by using a mask pattern different from the mask pattern used in the patterning step (1) (for instance, by using a mask with a line and space pattern in the patterning step (1) and then using a mask with a hole pattern in the patterning step (2)). Furthermore, a resist pattern with a hole-like or lattice-like pattern can also be formed by conducting a crossline patterning process in which a first line and space resist pattern is formed in the patterning step (1), followed by exposure and developing processes conducted so as to form a pattern perpendicular to the first resist pattern.

(First Positive Resist Composition)

In the film forming step (1) described above, the first positive resist composition for forming the first resist film is not particularly limited, although a chemically amplified positive resist composition is particularly desirable.

There are no particular limitations on the chemically amplified positive resist composition, and any of the positive resist compositions which have been proposed for conventional ArF resists and the like can be appropriately selected for use depending on the exposure light source, lithographic properties, and the like.

The chemically amplified positive resist composition generally includes a base material component (A') (hereafter, referred to as "component (A')") which exhibits increased solubility in an alkali developing solution by the action of acid and an acid generator component (B') (hereafter, referred to as "component (B')") which generates acid upon exposure.

<Component (A')>

In the first positive resist composition, the component (A') may be a resin component (A1') which exhibits increased solubility in an alkali developing solution under the action of acid (hereafter, frequently referred to as "component (A1')"), a low molecular weight compound (A2') which exhibits increased solubility in an alkali developing solution under the action of acid (hereafter, frequently referred to as "component (A2')"), or a mixture of the component (A1') and the component (A2').

[Component (A1')]

It is preferable that the component (A1') include a structural unit (a1) derived from an acrylate ester containing an acid dissociable, dissolution inhibiting group.

Further, it is preferable that the component (A1') further include a structural unit (a2) derived from an acrylate ester containing a lactone-containing cyclic group, as well as the structural unit (a1).

Moreover, it is preferable that the component (A1') further include a structural unit (a3) derived from an acrylate ester containing a polar group-containing aliphatic hydrocarbon group, or the structural unit (a5) represented by the aforementioned general formula (a5-1), as well as the structural unit (a1), or the structural unit (a1) and the structural unit (a2).

Also, the component (A1') may further include a structural unit (a4) different from the above-mentioned structural units (a2), (a3) and (a5), as well as the structural unit (a1).

The structural units (a1) to (a5) are respectively the same as defined for the structural units (a1) to (a5) for the component (A1) of the positive resist composition according to the first aspect of the present invention.

In the component (A1'), the amount of the structural unit (a1) based on the combined total of all structural units constituting the component (A1') is preferably 10 to 80 mol %, more preferably 20 to 70 mol %, and still more preferably 25 to 50 mol %. When the amount of the structural unit (a1) is at least as large as the lower limit of the above-mentioned range, a pattern can be easily formed using a resist composition prepared from the component (A1'). On the other hand, when the amount of the structural unit (a1) is no more than the upper limit of the above-mentioned range, a good balance can be achieved with the other structural units.

In the component (A1'), the amount of the structural unit (a2) based on the combined total of all structural units constituting the component (A1') is preferably 5 to 60 mol %, more preferably 10 to 50 mol %, and still more preferably 20 to 50 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units.

The amount of the structural unit (a3) or structural unit (a5) within the component (A1') based on the combined total of all structural units constituting the component (A1') is preferably 5 to 50 mol %, more preferably 5 to 40 mol %, and still more preferably 5 to 25 mol %. When the amount of the structural unit (a3) or structural unit (a5) is at least as large as the lower limit of the above-mentioned range, the effect of using the structural unit (a3) or structural unit (a5) can be satisfactorily achieved. On the other hand, when the amount of the structural unit (a3) or structural unit (a5) is no more than the upper limit of the above-mentioned range, a good balance can be achieved with the other structural units.

When the structural unit (a4) is included in the component (A1'), the amount of the structural unit (a4) based on the combined total of all the structural units that constitute the component (A1') is preferably within the range from 1 to 30 mol %, and more preferably from 10 to 20 mol %.

In the first positive resist composition, the component (A1') is preferably a copolymer having the structural unit (a1), and examples of such copolymers include a copolymer consisting of the structural units (a1) and (a2); a copolymer consisting of the structural units (a1) and (a3); a copolymer consisting of the structural units (a1) and (a5); a copolymer consisting of the structural units (a1), (a2) and (a3); a copolymer consisting of the structural units (a1), (a2), (a3) and (a4); a copolymer consisting of the structural units (a1), (a2) and (a5); and a copolymer consisting of the structural units (a1), (a2), (a5) and (a4).

In the component (A'), as the component (A1'), one type may be used alone, or two or more types may be used in combination.

In the first positive resist composition, it is particularly desirable that the component (A1') include a combination of structural units such as that shown in the following general formula (A1'-11).

[Chemical Formula 56]

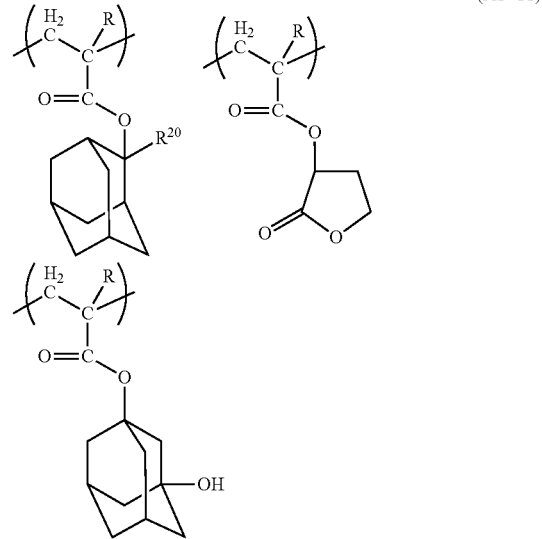

(A1'-11)

[In formula (A1'-11), R is the same as defined above, and the plurality of R may be either the same or different from each other; and $R^{20}$ is the same as defined above for $R^{11}$ in formula (a1-1-01).]

The component (A1') can be obtained, for example, by a conventional radical polymerization or the like of the monomers corresponding with each of the structural units, using a radical polymerization initiator such as azobisisobutyronitrile (AIBN).

Furthermore, in the component (A1'), by using a chain transfer agent such as HS—$CH_2$—$CH_2$—$CH_2$—$C(CF_3)_2$—OH during the polymerization, a —$C(CF_3)_2$—OH group can be introduced at the terminals of the component (A1'). Such a copolymer having introduced a hydroxyalkyl group in which part of the hydrogen atoms of the alkyl group are substituted with fluorine atoms is effective in reducing line width roughness (LWR). Such a copolymer is also effective in reducing developing defects and line edge roughness (LER: unevenness of the side walls of a line pattern).

The weight average molecular weight (Mw) (the polystyrene equivalent value determined by gel permeation chromatography) of the component (A1') is not particularly limited, but is preferably 2,000 to 50,000, more preferably 3,000 to 30,000, and most preferably 5,000 to 20,000.

When the weight average molecular weight is no more than the upper limit of the above-mentioned range, the component (A1') exhibits satisfactory solubility in a resist solvent when used as a resist. On the other hand, when the weight average molecular weight is at least as large as the lower limit of the above-mentioned range, dry etching resistance and cross-sectional shape of the resist pattern becomes satisfactory.

Further, the dispersity (Mw/Mn) is not particularly limited, but is preferably 1.0 to 5.0, more preferably 1.0 to 3.0, and most preferably 1.2 to 2.5.

[Component (A2')]

As the component (A2'), a low molecular weight compound that has a molecular weight of at least 500 but less than 4,000, contains a hydrophilic group, and also contains an acid dissociable, dissolution inhibiting group such as the groups mentioned above in the description of the component (A1) is preferable. Specific examples include compounds containing a plurality of phenol skeletons in which a part of the hydrogen atoms within hydroxyl groups have been substituted with the aforementioned acid dissociable, dissolution inhibiting groups.

Preferable examples of the component (A2') include low molecular weight phenolic compounds that are known, for example, as sensitizers or heat resistance improvers for use in non-chemically amplified g-line or i-line resists, wherein some of the hydroxyl group hydrogen atoms of these compounds have been substituted with the aforementioned acid dissociable, dissolution inhibiting groups, and any of these compounds may be used.

Examples of these low molecular weight phenolic compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol. It goes without saying that the low molecular weight phenolic compound is not limited to these examples.

Also, there are no particular limitations on the acid dissociable, dissolution inhibiting group, and suitable examples include the groups described above.

As the component (A2'), one type may be used alone, or two or more types may be used in combination.

<Component (B')>

As the component (B'), there is no particular limitation, and any of the known acid generators used in conventional chemically amplified resist compositions can be used. As the component (B'), the same acid generators as those for the component (B) described above in relation to the positive resist composition according to the first aspect of the present invention can be used.

As the component (B'), one type of these acid generators may be used alone, or two or more types may be used in combination.

In the present invention, as the component (B'), it is particularly desirable to use an onium salt having a fluorinated alkylsulfonic acid ion as the anion moiety.

The amount of the component (B') within the first positive resist composition is preferably from 0.5 to 60 parts by weight and more preferably from 1 to 40 parts by weight, relative to 100 parts by weight of the component (A'). When the amount of the component (B') is within the above-mentioned range, formation of a resist pattern can be satisfactorily performed. Further, by virtue of the above-mentioned range, a uniform solution can be obtained and the storage stability becomes satisfactory.

<Component (D')>

In order to improve factors such as the resist pattern shape and the post exposure stability of the latent image formed by the pattern-wise exposure of the resist layer, in the first positive resist composition, a nitrogen-containing organic compound (D') (hereafter referred to as "component (D')") can be added as an optional component.

A multitude of these components (D') have already been proposed, and any of these known compounds may be used. As the component (D'), the same compounds as those for the component (D) described above in relation to the positive resist composition according to the first aspect of the present invention can be used.

As the component (D'), one type of these nitrogen-containing organic compounds may be used alone, or two or more types may be used in combination.

The component (D') is typically used in an amount within a range from 0.01 to 5.0 parts by weight, relative to 100 parts by weight of the component (A').

<Component (E')>

In the first positive resist composition, for preventing any deterioration in sensitivity, and improving the resist pattern shape and the post exposure stability of the latent image formed by the pattern-wise exposure of the resist layer, at least one compound (E') (hereafter referred to as "component (E')") selected from the group consisting of an organic carboxylic acid, or a phosphorus oxo acid or derivative thereof can be added as an optional component.

A multitude of these components (E') have already been proposed, and any of these known compounds may be used. As the component (E'), the same compounds as those for the component (E) described above in relation to the positive resist composition according to the first aspect of the present invention can be used.

As the component (E'), one type of these compounds may be used alone, or two or more types may be used in combination.

As the component (E'), an organic carboxylic acid is preferable, and salicylic acid is particularly desirable.

The component (E') is typically used in an amount within a range from 0.01 to 5.0 parts by weight, relative to 100 parts by weight of the component (A').

If desired, other miscible additives can also be added to the first positive resist composition. Examples of such miscible additives include additive resins for improving the performance of the resist film, surfactants for improving the applicability, dissolution inhibitors, plasticizers, stabilizers, colorants, halation prevention agents, and dyes.

<Component (S')>

The first positive resist composition can be prepared by dissolving the materials for the resist composition in an organic solvent (hereafter, frequently referred to as "component (S')").

The component (S') may be any organic solvent which can dissolve the respective components to give a uniform solution, and any one or more kinds of organic solvents can be appropriately selected from those which have been conventionally known as solvents for a chemically amplified resist.

As the component (S'), the same organic solvents as those for the component (S) described above in relation to the positive resist composition according to the first aspect of the present invention can be used.

These components (S') can be used either alone, or in combinations of two or more different solvents.

In the first positive resist composition, as the component (S'), propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range from 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably from 3:7 to 7:3.

Further, as the component (S'), a mixed solvent of at least one of PGMEA and EL with γ-butyrolactone is also preferable. The mixing ratio (former:latter) of such a mixed solvent is preferably from 70:30 to 95:5.

There are no particular limitations on the overall amount used of the component (S'), and an amount that produces a liquid having a concentration that is suitable for application of the first positive resist composition onto a substrate is used.

By employing the <method of forming a positive resist pattern> described above, a resist pattern having a high level of resolution and excellent shape can be formed with minimal dimensional variation in the first resist pattern during the double patterning process.

Further, even when the second positive resist composition of the present invention for forming the second resist film is applied, a resist pattern can be stably formed by the double patterning process while hardly dissolving the first resist pattern formed by the first positive resist composition. Furthermore, there is no need to use a freezing agent or the like, which results in improved workability.

EXAMPLES

As follows is a more detailed description of the present invention based on a series of examples, although the scope of the present invention is by no way limited by these examples.

<Synthesis of Resin Component (A1)>

Copolymers used as the component (A) used in Examples and Comparative Examples, i.e., the copolymers (A1-1-1) to (A1-1-19), (A1-2-1) to (A1-2-4), and (A1-3-1) to (A1-3-3) were synthesized by using the respective monomers (1) to (7) represented by chemical formulas shown below, as described in the following Synthesis Examples.

[Chemical Formula 57]

Monomer (1)

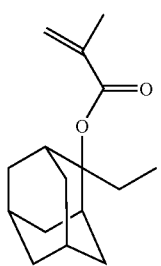

Monomer (2)

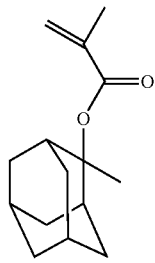

Monomer (3)

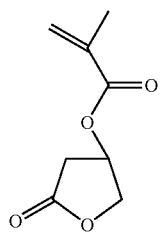

Monomer (4)

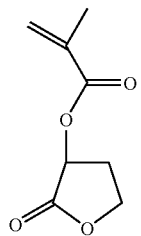

Monomer (5)

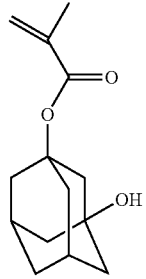

Monomer (6)

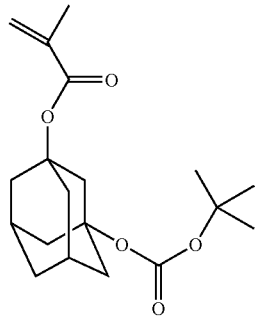

Monomer (7)

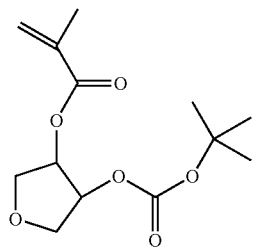

[Synthesis Example of Resin Component (A1)]

This process is described in more detail using the synthesis of the copolymer (A1-1-1) as an example.

9.92 g of a monomer (1), 1.70 g of a monomer (3), 4.72 g of a monomer (5) and 10.1 g of a monomer (6) were dissolved in 106 g of methyl ethyl ketone. Then, 3.02 mmol of dimethyl 2,2'-azobis(isobutyrate) (product name: V-601, manufactured by Wako Pure Chemical Industries, Ltd.) as a polymerization initiator was added and dissolved in the resulting solution. The resulting solution was dropwise added to 30 g of methyl ethyl ketone heated to 75° C. over 6 hours in a nitrogen atmosphere. Following completion of the dropwise addition, the reaction solution was heated for 1 hour while stirring, and was then cooled to room temperature. Subsequently, an operation in which the reaction solution was added dropwise to an excess amount of mixed solution of methanol/water to precipitate a reaction product was repeated three times. The thus obtained reaction product was then dried under reduced pressure at room temperature, thereby obtaining the copolymer (A1-1-1) in the form of a white powder.

Other copolymers, i.e., the copolymers (A1-1-2) to (A1-1-19), (A1-2-1) to (A1-2-4), and (A1-3-1) to (A1-3-3) were synthesized in substantially the same manner as in the above method for synthesizing the copolymer (A1-1-1), except that monomers for deriving the structural units of the respective copolymers were used in a predetermined molar ratio.

Structures of the copolymers obtained in the above-mentioned Synthesis Example are shown below.

[Chemical Formula 58]

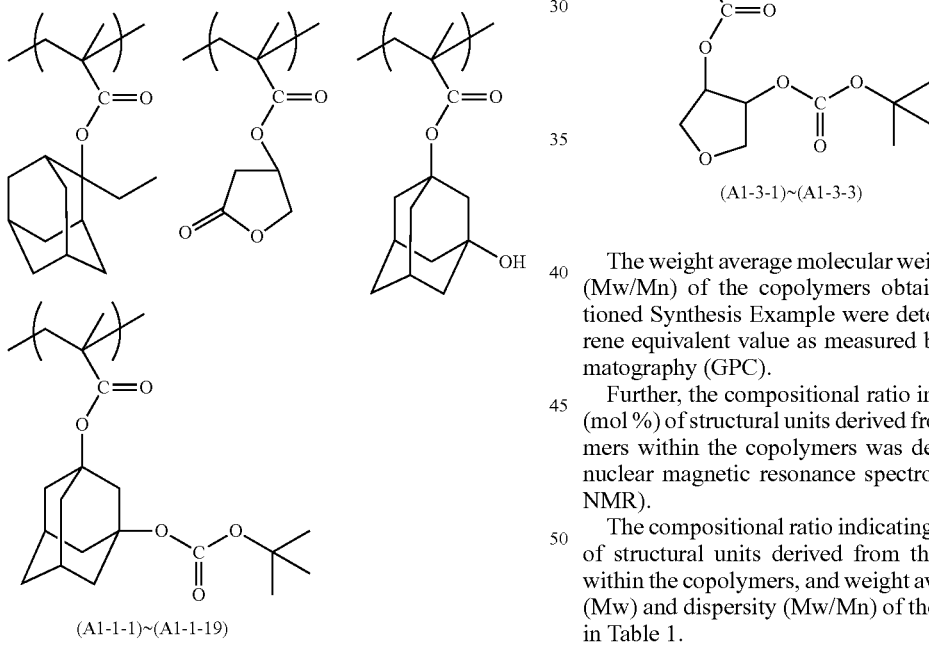

(A1-1-1)~(A1-1-19)

[Chemical Formula 59]

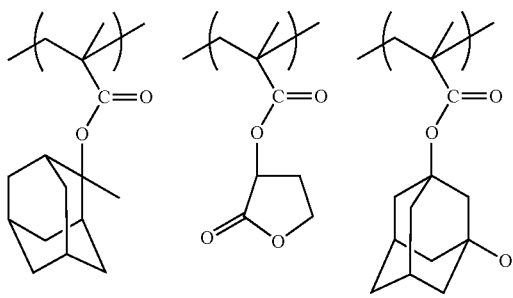

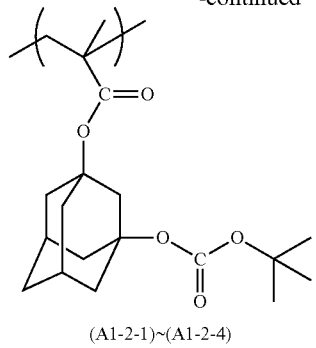

(A1-2-1)~(A1-2-4)

[Chemical Formula 60]

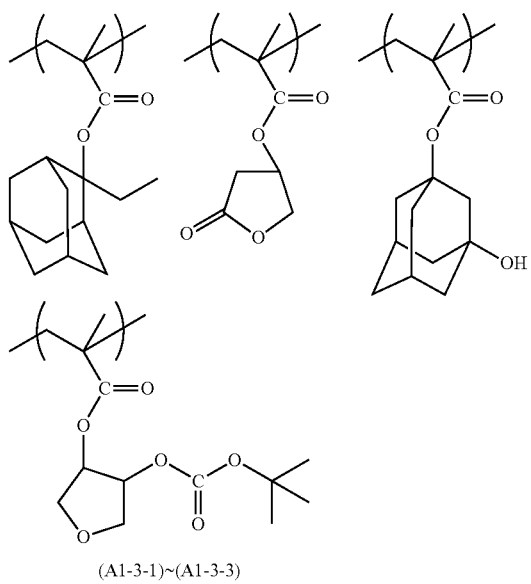

(A1-3-1)~(A1-3-3)

The weight average molecular weight (Mw) and dispersity (Mw/Mn) of the copolymers obtained in the above-mentioned Synthesis Example were determined by the polystyrene equivalent value as measured by gel permeation chromatography (GPC).

Further, the compositional ratio indicating the percentage (mol %) of structural units derived from the respective monomers within the copolymers was determined by carbon 13 nuclear magnetic resonance spectroscopy (600 MHz, $^{13}$C-NMR).

The compositional ratio indicating the percentage (mol %) of structural units derived from the respective monomers within the copolymers, and weight average molecular weight (Mw) and dispersity (Mw/Mn) of the copolymers are shown in Table 1.

TABLE 1

| Copolymer | Percentage of structural units derived from the respective monomers (mol %) | | | | | | | Mw | Mw/Mn |
| | (1) | (2) | (3) | (4) | (5) | (6) | (7) | | |
|---|---|---|---|---|---|---|---|---|---|
| (A1-1-1) | 40 | | 10 | | 20 | 30 | | 7,100 | 1.59 |
| (A1-1-2) | 45 | | 15 | | 20 | 20 | | 6,700 | 1.68 |
| (A1-1-3) | 50 | | 10 | | 20 | 20 | | 6,800 | 1.67 |
| (A1-1-4) | 50 | | 15 | | 15 | 20 | | 6,800 | 1.70 |
| (A1-1-5) | 50 | | 20 | | 15 | 15 | | 6,700 | 1.65 |
| (A1-1-6) | 55 | | 20 | | 10 | 15 | | 6,700 | 1.70 |

TABLE 1-continued

| Copolymer | Percentage of structural units derived from the respective monomers (mol %) | | | | | | | Mw | Mw/Mn |
| --- | --- | --- | --- | --- | --- | --- | --- | --- | --- |
| | (1) | (2) | (3) | (4) | (5) | (6) | (7) | | |
| (A1-1-7) | 60 | 20 | | | 10 | 10 | | 6,700 | 1.81 |
| (A1-1-8) | 35 | 25 | | | 20 | 20 | | 8,000 | 1.60 |
| (A1-1-9) | 45 | 25 | | | 15 | 15 | | 6,900 | 1.64 |
| (A1-1-10) | 50 | 25 | | | 15 | 10 | | 6,300 | 1.60 |
| (A1-1-11) | 55 | 25 | | | 10 | 10 | | 6,700 | 1.68 |
| (A1-1-12) | 45 | 27 | | | 15 | 13 | | 7,000 | 1.63 |
| (A1-1-13) | 48 | 27 | | | 15 | 10 | | 6,800 | 1.65 |
| (A1-1-14) | 45 | 30 | | | 15 | 10 | | 6,800 | 1.60 |
| (A1-1-15) | 40 | 15 | | | 20 | 25 | | 7,100 | 1.61 |
| (A1-1-16) | 40 | 20 | | | 20 | 20 | | 6,900 | 1.61 |
| (A1-1-17) | 35 | 35 | | | 15 | 15 | | 7,400 | 1.62 |
| (A1-1-18) | 40 | 35 | | | 15 | 10 | | 6,900 | 1.60 |
| (A1-1-19) | 35 | 40 | | | 15 | 10 | | 7,000 | 1.58 |
| (A1-2-1) | | 35 | | 25 | 20 | 20 | | 6,800 | 1.70 |
| (A1-2-2) | | 40 | | 30 | 20 | 10 | | 7,000 | 1.63 |
| (A1-2-3) | | 35 | | 35 | 20 | 10 | | 7,400 | 1.69 |
| (A1-2-4) | | 30 | | 40 | 20 | 10 | | 7,400 | 1.64 |
| (A1-3-1) | 50 | | 10 | | 20 | | 20 | 6,500 | 1.64 |
| (A1-3-2) | 50 | | 20 | | 15 | | 15 | 6,400 | 1.63 |
| (A1-3-3) | 45 | | 25 | | 15 | | 15 | 6,500 | 1.67 |

<Evaluation of Solubility of Resin Component (A1) in Organic Solvent>

Evaluations of the solubility of a resin component (A1) in an organic solvent were conducted in accordance with the evaluation method described below, using the aforementioned copolymers and the following organic solvents.

Organic Solvent:
(S)-1: propylene glycol monomethyl ether acetate (PGMEA)
(S)-2: propylene glycol monomethyl ether (PGME)
(S)-3: cyclohexanone (CH)
(S)-4: isobutanol (IBA)
(S)-5: 4-methyl-2-pentanol (MIBC)
(S)-6: 1-butoxy-2-propanol (BP)
(S)-7: a mixed solvent of BP/PGMEA=9/1 (weight ratio)
(S)-8: a mixed solvent of BP/PGME=8/2 (weight ratio)
(S)-9: a mixed solvent of BP/CH=9/1 (weight ratio)
(S)-10: a mixed solvent of BP/CH=8/2 (weight ratio)

[Evaluation Method]

0.1 g of each copolymer powder was added to 0.3 g of an organic solvent, and the resultant was mixed so as to achieve a copolymer solution with a solid content of 25% by weight, and an evaluation of whether the copolymer powder was dissolved or not at room temperature (i.e., 23° C.) was performed.

When the copolymer powder did not dissolve in the above conditions, 0.6 g of an alcohol-based organic solvent was further added and mixed so as to achieve a copolymer solution with a solid content of 10% by weight, and an evaluation of whether the copolymer powder was dissolved or not under the aforementioned condition was performed.

When the copolymer powder still did not dissolve in the above conditions, 1.0 g of an alcohol-based organic solvent was further added and mixed so as to achieve a copolymer solution with a solid content of 5% by weight, and an evaluation of whether the copolymer powder was dissolved or not under the aforementioned condition was performed.

When the copolymer powder still did not dissolve in the above conditions, 3.0 g of an alcohol-based organic solvent was further added and mixed so as to achieve a copolymer solution with a solid content of 2% by weight, and an evaluation of whether the copolymer powder was dissolved or not under the aforementioned condition was performed.

When the copolymer powder still did not dissolve in the above conditions, 5.0 g of an alcohol-based organic solvent was further added and mixed so as to achieve a copolymer solution with a solid content of 1% by weight, and an evaluation of whether the copolymer powder was dissolved or not under the aforementioned condition was performed.

The obtained evaluation results are shown in Tables 2 to 8.

In the Tables, the symbol A indicates that all of the copolymer powder could be dissolved and the solutions appeared transparent and uniform after one day of storage; the symbol B indicates that although all of the copolymer powder could once be dissolved, precipitate formation was observed when the appearance of solutions were inspected after one day of storage; the symbol C indicates that partial dissolution of the copolymer powder was visually observed; and the symbol D indicates that almost all of the copolymer powder could not be dissolved, respectively.

Further, the symbol "Refrigeration1W:A" indicates that the copolymer solutions having the corresponding solid content appeared transparent and uniform after one week of storage under the temperature conditions of refrigeration (−20° C.); and the symbol "Refrigeration1W:B" indicates that precipitate formation was observed when the appearance of the copolymer solutions having the corresponding solid content were inspected after one week of storage under the temperature conditions of refrigeration (−20° C.), respectively.

TABLE 2

| Organic Solvent | | Solid Content of Copolymer (% by weight) | | | | |
| --- | --- | --- | --- | --- | --- | --- |
| (S2) | Copolymer | 1 | 2 | 5 | 10 | 25 |
| (S)-1 | (A1-1-3) | A | A | A Refrigeration1W: A | A | A |
| | (A1-1-5) | A | A | A Refrigeration1W: A | A | A |
| | (A1-1-9) | A | A | A Refrigeration1W: A | A | A |
| | (A1-1-12) | A | A | A Refrigeration1W: A | A | A |
| | (A1-1-14) | A | A | A Refrigeration1W: A | A | A |
| (S)-2 | (A1-1-3) | A | A | A Refrigeration1W: A | A | A |
| | (A1-1-5) | A | A | A Refrigeration1W: A | A | A |
| | (A1-1-9) | A | A | A Refrigeration1W: A | A | A |
| | (A1-1-12) | A | A | A Refrigeration1W: A | A | A |
| | (A1-1-14) | A | A | A Refrigeration1W: A | A | A |
| (S)-3 | (A1-1-3) | A | A | A Refrigeration1W: A | A | A |
| | (A1-1-5) | A | A | A Refrigeration1W: A | A | A |
| | (A1-1-9) | A | A | A Refrigeration1W: A | A | A |
| | (A1-1-12) | A | A | A Refrigeration1W: A | A | A |
| | (A1-1-14) | A | A | A Refrigeration1W: A | A | A |

TABLE 3

| Organic Solvent (S1) | Copolymer | Solid Content of Copolymer (% by weight) | | | | |
|---|---|---|---|---|---|---|
| | | 1 | 2 | 5 | 10 | 25 |
| (S)-4 | (A1-1-1) | A | A | C | D | D |
| | (A1-1-15) | A | B | C | D | D |
| | (A1-1-16) | B | D | D | D | D |
| | (A1-1-2) | A | B | C | D | D |
| | (A1-1-3) | A | A | A | C | D |
| (S)-5 | (A1-1-1) | A | A | C | D | D |
| | (A1-1-15) | A | A | C | D | D |
| | (A1-1-16) | A | C | D | D | D |
| | (A1-1-2) | A | C | D | D | D |
| | (A1-1-3) | A | A | A | C | D |
| | (A1-1-4) | A | C | D | D | D |
| | (A1-1-5) | D | D | D | D | D |
| | (A1-1-6) | D | D | D | D | D |
| | (A1-1-8) | D | D | D | D | D |
| | (A1-1-9) | D | D | D | D | D |

TABLE 4

| Organic Solvent (S1) | Copolymer | Solid Content of Copolymer (% by weight) | | | | | | |
|---|---|---|---|---|---|---|---|---|
| | | 1 | 2 | 5 | 10 | 15 | 20 | 25 |
| (S)-6 | (A1-1-1) | A | A | A Refrigeration1W: A | A | A | A | A |
| | (A1-1-2) | A | A | A Refrigeration1W: A | A | A | A | D |
| | (A1-1-3) | A | A | A Refrigeration1W: A | A | A | A | A |
| | (A1-1-4) | A | A | A Refrigeration1W: A | A | A | A | A |
| | (A1-1-5) | A | A | A Refrigeration1W: A | A | A | A | C |
| | (A1-1-6) | A | A | A Refrigeration1W: A | A | A | A | A |
| | (A1-1-7) | A | A | A Refrigeration1W: A | A | A | A | A |
| | (A1-1-8) | A | A | A Refrigeration1W: A | D | A | A | D |
| | (A1-1-9) | A | A | A Refrigeration1W: A | A | D | D | D |
| | (A1-1-10) | A | A | A Refrigeration1W: A | A | A | A | C |
| | (A1-1-11) | A | A | A Refrigeration1W: B | A | A | A | A |
| | (A1-1-12) | A | A | A Refrigeration1W: A | A | D | D | D |
| | (A1-1-13) | A | A | A Refrigeration1W: B | A | D | D | D |
| | (A1-1-14) | A | A | A Refrigeration1W: B | A | D | D | D |
| | (A1-1-17) | D | D | D | D | D | D | D |
| | (A1-1-18) | D | D | D | D | D | D | D |
| | (A1-1-19) | D | D | D | D | D | D | D |

TABLE 5

| Organic Solvent (S1)/(S2) | Copolymer | Solid Content of Copolymer (% by weight) | | | | | | |
|---|---|---|---|---|---|---|---|---|
| | | 1 | 2 | 5 | 10 | 15 | 20 | 25 |
| (S)-7 | (A1-1-9) | A | A | A Refrigeration1W: A | A | C | D | D |
| | (A1-1-12) | A | A | A Refrigeration1W: A | A | C | D | D |
| | (A1-1-14) | A | A | A Refrigeration1W: A | A | C | D | D |
| | (A1-1-17) | A | A | A Refrigeration1W: A | A | C | D | D |
| | (A1-1-18) | A | A | A Refrigeration1W: B | A | C | D | D |
| | (A1-1-19) | D | D | D | D | C | D | D |
| (S)-8 | (A1-1-9) | A | A | A Refrigeration1W: A | A | A | C | C |
| | (A1-1-12) | A | A | A Refrigeration1W: A | A | A | C | D |
| | (A1-1-14) | A | A | A Refrigeration1W: A | A | A | C | D |
| | (A1-1-17) | A | A | A Refrigeration1W: A | A | A | C | D |
| | (A1-1-18) | A | A | A Refrigeration1W: B | A | A | C | D |
| | (A1-1-19) | D | D | D | D | D | D | D |

TABLE 6

| Organic Solvent (S1)/(S2) | Copolymer | Solid Content of Copolymer (% by weight) | | | | | | |
|---|---|---|---|---|---|---|---|---|
| | | 1 | 2 | 5 | 10 | 15 | 20 | 25 |
| (S)-9 | (A1-1-9) | A | A | A Refrigeration1W: A | A | C | D | D |
| | (A1-1-12) | A | A | A Refrigeration1W: A | A | C | D | D |
| | (A1-1-14) | A | A | A Refrigeration1W: A | A | C | D | D |
| | (A1-1-17) | A | A | A Refrigeration1W: A | A | C | D | D |
| | (A1-1-18) | A | A | A Refrigeration1W: A | A | C | D | D |
| | (A1-1-19) | D | D | D | D | D | D | D |
| (S)-10 | (A1-1-9) | A | A | A Refrigeration1W: A | A | A | A | C |
| | (A1-1-12) | A | A | A Refrigeration1W: A | A | A | A | D |
| | (A1-1-14) | A | A | A Refrigeration1W: A | A | A | A | D |
| | (A1-1-17) | A | A | A Refrigeration1W: A | A | A | A | D |
| | (A1-1-18) | A | A | A Refrigeration1W: A | A | A | A | D |
| | (A1-1-19) | C | D | D | D | D | D | D |

TABLE 7

| Organic Solvent (S1) | Copolymer | Solid Content of Copolymer (% by weight) | | | | |
|---|---|---|---|---|---|---|
| | | 1 | 2 | 5 | 10 | 25 |
| (S)-6 | (A1-2-1) | A | A | A Refrigeration1W: A | A | A |
| | (A1-2-2) | A | A | A Refrigeration1W: B | A | A |
| | (A1-2-3) | D | D | D | D | D |
| | (A1-2-4) | D | D | D | D | D |

TABLE 7-continued

| Organic Solvent | | Solid Content of Copolymer (% by weight) | | | | |
|---|---|---|---|---|---|---|
| (S1) | Copolymer | 1 | 2 | 5 | 10 | 25 |
| | (A1-3-1) | A | A | A<br>Refrigeration1W: A | A | C |
| | (A1-3-2) | A | A | A<br>Refrigeration1W: A | A | D |
| | (A1-3-3) | A | A | A<br>Refrigeration1W: B | A | D |

TABLE 8

| Organic Solvent | | Solid Content of Copolymer (% by weight) | | | | |
|---|---|---|---|---|---|---|
| (S1)/(S2) | Copolymer | 1 | 2 | 5 | 10 | 25 |
| (S)-8 | (A1-2-1) | A | A | A<br>Refrigeration1W: A | A | A |
| | (A1-2-2) | A | A | A<br>Refrigeration1W: A | A | A |
| | (A1-2-3) | A | A | A<br>Refrigeration1W: B | A | A |
| | (A1-2-4) | D | D | D | D | D |
| | (A1-3-1) | A | A | A<br>Refrigeration1W: A | A | A |
| | (A1-3-2) | A | A | A<br>Refrigeration1W: A | A | D |
| | (A1-3-3) | A | A | A<br>Refrigeration1W: A | A | D |

From the results described in the <Evaluation of solubility of resin component (A1) in organic solvent> above, it was confirmed that as shown, in particular, by the examples of the copolymers (A1-1-14), (A1-1-17) and (A1-1-18) indicated in Tables 4 to 6, the more the amount of structural units classified as the structural unit (a2) included in a copolymer, the higher solubility of the copolymer in the organic solvents (S)-7 to (S)-10 as compared to the solubility of the copolymer in the organic solvent (S)-6.

Similar results were confirmed when the appearance of copolymer solutions were inspected after one week of storage under refrigeration conditions.

<Preparation of Positive Resist Composition Solution>

Examples 1 to 10, Comparative Examples 1 to 5

The components shown in Table 9 were mixed together and dissolved to obtain positive resist composition solutions.

TABLE 9

| | Component (A) | Component (B) | | Component (D) | Component (E) | Component (S) |
|---|---|---|---|---|---|---|
| First Positive Resist Composition | (A)-1<br>[100] | (B)-1<br>[1.0] | (B)-2<br>[10.0] | (D)-1<br>[1.00] | (E)-1<br>[1.82] | (S)-11<br>[2,400] |
| Comparative Example 1 | (A)-2<br>[100] | (B)-3<br>[15.0] | — | (D)-1<br>[1.60] | (E)-1<br>[3.00] | (S)-11<br>[2,100] |
| Comparative Example 2 | (A)-2<br>[100] | (B)-3<br>[15.0] | — | (D)-1<br>[1.60] | (E)-1<br>[3.00] | (S)-6<br>[2,100] |
| Comparative Example 3 | (A)-2<br>[100] | (B)-3<br>[15.0] | — | (D)-1<br>[1.60] | (E)-1<br>[3.00] | (S)-1<br>[2,100] |
| Comparative Example 4 | (A)-2<br>[100] | (B)-3<br>[15.0] | — | (D)-1<br>[1.60] | (E)-1<br>[3.00] | (S)-2<br>[2,100] |
| Comparative Example 5 | (A)-2<br>[100] | (B)-3<br>[15.0] | — | (D)-1<br>[1.60] | (E)-1<br>[3.00] | (S)-3<br>[2,100] |
| Example 1 | (A)-2<br>[100] | (B)-3<br>[15.0] | — | (D)-1<br>[1.60] | (E)-1<br>[3.00] | (S)-12<br>[2,100] |
| Example 2 | (A)-2<br>[100] | (B)-3<br>[15.0] | — | (D)-1<br>[1.60] | (E)-1<br>[3.00] | (S)-8<br>[2,100] |
| Example 3 | (A)-2<br>[100] | (B)-3<br>[15.0] | — | (D)-1<br>[1.60] | (E)-1<br>[3.00] | (S)-13<br>[2,100] |
| Example 4 | (A)-2<br>[100] | (B)-3<br>[15.0] | — | (D)-1<br>[1.60] | (E)-1<br>[3.00] | (S)-14<br>[2,100] |
| Example 5 | (A)-2<br>[100] | (B)-3<br>[15.0] | — | (D)-1<br>[1.60] | (E)-1<br>[3.00] | (S)-7<br>[2,100] |
| Example 6 | (A)-2<br>[100] | (B)-3<br>[15.0] | — | (D)-1<br>[1.60] | (E)-1<br>[3.00] | (S)-15<br>[2,100] |
| Example 7 | (A)-2<br>[100] | (B)-3<br>[15.0] | — | (D)-1<br>[1.60] | (E)-1<br>[3.00] | (S)-16<br>[2,100] |
| Example 8 | (A)-2<br>[100] | (B)-3<br>[15.0] | — | (D)-1<br>[1.60] | (E)-1<br>[3.00] | (S)-17<br>[2,100] |
| Example 9 | (A)-2<br>[100] | (B)-3<br>[15.0] | — | (D)-1<br>[1.60] | (E)-1<br>[3.00] | (S)-9<br>[2,100] |
| Example 10 | (A)-2<br>[100] | (B)-3<br>[15.0] | — | (D)-1<br>[1.60] | (E)-1<br>[3.00] | (S)-10<br>[2,100] |

The meanings of the abbreviations used in Table 9 are as shown below. The numerical values within the brackets [ ] represent blend quantities (parts by weight).

(A)-1: a copolymer represented by chemical formula (A1'-11-1) shown below having a weight average molecular weight (Mw) of 7,000 and a dispersity (Mw/Mn) of 1.56.

In the formula, the subscript numerals shown to the bottom right of the parentheses ( ) indicate the percentage (mol %) of the respective structural units within the copolymer.

[Chemical Formula 61]

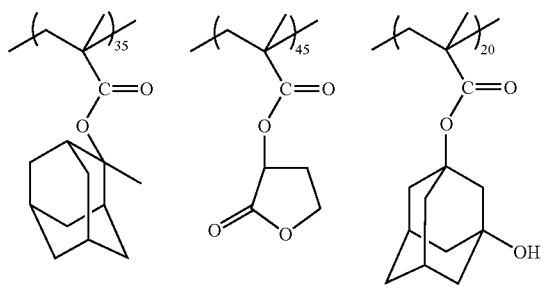

(A1'-11-1)

(A)-2: the aforementioned copolymer (A1-1-9)

(B)-1: a compound represented by chemical formula (b-3-1) shown below (B)-2: a compound represented by chemical formula (b3-1) shown below (B)-3: a compound represented by chemical formula (b-1-1) shown below

[Chemical Formula 62]

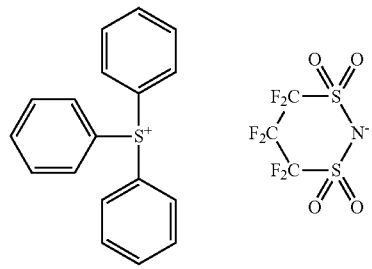

(b-3-1)

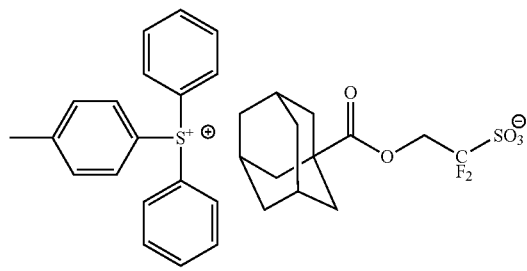

(b3-1)

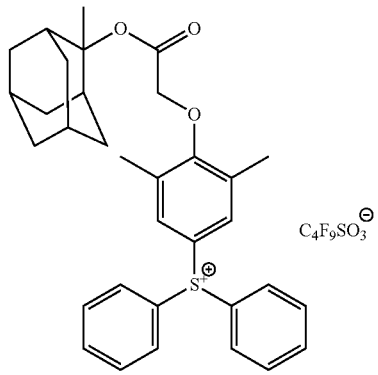

(b-1-1)

(D)-1: tri-n-pentylamine
(E)-1: salicylic acid
(S)-1: propylene glycol monomethyl ether acetate (PGMEA)
(S)-2: propylene glycol monomethyl ether (PGME)
(S)-3: cyclohexanone (CH)
(S)-6: 1-butoxy-2-propanol (BP)
(S)-7: a mixed solvent of BP/PGMEA=9/1 (weight ratio)
(S)-8: a mixed solvent of BP/PGME=8/2 (weight ratio)
(S)-9: a mixed solvent of BP/CH=9/1 (weight ratio)
(S)-10: a mixed solvent of BP/CH=8/2 (weight ratio)
(S)-11: a mixed solvent of PGMEA/PGME=6/4 (weight ratio)
(S)-12: a mixed solvent of BP/PGME=9/1 (weight ratio)
(S)-13: a mixed solvent of BP/PGME=7/3 (weight ratio)
(S)-14: a mixed solvent of BP/PGME=6/4 (weight ratio)
(S)-15: a mixed solvent of BP/PGMEA=85/15 (weight ratio)
(S)-16: a mixed solvent of BP/PGMEA=8/2 (weight ratio)
(S)-17: a mixed solvent of BP/PGMEA=7/3 (weight ratio)

[Evaluation of Coatability on a Substrate]

Formation of Resist Film

Each positive resist composition solution obtained in Comparative Examples 1 to 2 and Examples 1 and 10 was applied onto a 12-inch silicon wafer (in a disc shape) using an applicator TEL ACT12 (product name, manufactured by Tokyo Electron Limited), and was then baked and dried, thereby forming a resist film having a film thickness of 100 nm.

In terms of the specific method used for applying the positive resist composition solutions, 10 mL of the positive resist composition solutions was dropwise added from the nozzle of the aforementioned applicator onto the aforementioned silicon wafer close to the center thereof, while rotating the silicon wafer with a rotational frequency of 1,500 rpm and the rotation time indicated in Table 10, thereby forming a coating film on the entire surface of the silicon wafer.

Subsequently, the coating film was dried on a hotplate at 120° C. for 60 seconds, thereby forming a resist film having a film thickness of 100 nm.

Evaluation of Coatability on a Substrate

With respect to the resist films formed, the film thickness (A) at 25 points which were equally spaced between both ends of the diameter of the aforementioned silicon wafer were measured using the Nanospec 7001-0066XPW (product name, manufactured by Nanometrics Japan, Ltd.), and the average of the film thickness measured at 25 points and the value of 3 times the standard deviation 3σ of the film thickness measured at 25 points were determined. The results are shown in Table 10.

The smaller this "3σ" value is, the smaller the variations in the film thickness within the silicon wafer surface, indicating that a resist film exhibiting high uniformity in the film thickness was obtained.

TABLE 10

|  | Organic solvent | Amount added (mL) | Rotation time (seconds) | Average of film thickness (nm) | 3σ |
|---|---|---|---|---|---|
| Comparative Example 1 | PGMEA/PGME | 10 | 15 | 100.8 | 0.6 |
| Comparative Example 2 | BP | 10 | 15 | 103.9 | 2.5 |
|  |  | 10 | 30 | 100.2 | 0.7 |
| Example 1 | BP/PGME = 9/1 | 10 | 15 | 100.1 | 1.6 |
| Example 2 | BP/PGME = 8/2 | 10 | 15 | 101.1 | 1.3 |
| Example 3 | BP/PGME = 7/3 | 10 | 15 | 100.7 | 1.1 |
| Example 4 | BP/PGME = 6/4 | 10 | 15 | 102.2 | 1.1 |
| Example 5 | BP/PGMEA = 9/1 | 10 | 15 | 100.3 | 1.4 |
| Example 6 | BP/PGMEA = 85/15 | 10 | 15 | 100.9 | 1.1 |
| Example 7 | BP/PGMEA = 8/2 | 10 | 15 | 101.5 | 0.9 |
| Example 8 | BP/PGMEA = 7/3 | 10 | 15 | 101.2 | 0.8 |
| Example 9 | BP/CH = 9/1 | 10 | 15 | 102.4 | 1.8 |
| Example 10 | BP/CH = 8/2 | 10 | 15 | 100.7 | 1.7 |

From the results shown in Table 10, it was confirmed that the positive resist composition obtained in Comparative Example 2 in which the component (S1) was used alone had a large 3σ value when the rotation time was 15 seconds, and thus exhibited larger variations in the film thickness within the resist film surface which indicated lower uniformity in the film thickness, as compared to the positive resist composition obtained in Comparative Example 1.

In order to obtain results as satisfactory as those obtained for the positive resist composition of Comparative Example 1 by using the positive resist composition of Comparative Example 2, it was necessary to increase the rotation time by about two-fold (i.e., 30 seconds), and thus it is evident that the positive resist composition of Comparative Example 2 was inferior to that of Comparative Example 1 in terms of coatability on a substrate.

The positive resist compositions obtained in Examples 1 to 10 had 3σ values of 0.8 to 1.8 when the rotation time was 15 seconds, and thus exhibited smaller values than that of the positive resist composition obtained in Comparative Example 2 at the same rotation time. Therefore, it was confirmed that by using the components (S1) and (S2) at the same time, uniformity in the film thickness was enhanced.

Furthermore, in terms of the average of the film thickness, the positive resist compositions obtained in Examples 1 to 10 had about the same values as that of the positive resist composition obtained in Comparative Example 1, and thus it is evident that they exhibit excellent coatability on a substrate.
<Evaluation of Dimensional Variation in the First Resist Pattern Due to Double Patterning Process>

Resist patterns were formed by the following double patterning process by using, as indicated above in Table 9, the first positive resist composition as a positive resist composition for forming a first resist film (hereafter, referred to as "first resist") and the positive resist compositions obtained in Comparative Examples 2 to 5 and Examples 1 to 10 as positive resist compositions for forming a second resist film (hereafter, referred to as "second resist"), and dimensional variation in the first resist pattern was evaluated.
Double Patterning Process
[Film Forming Step (1)]

First, an organic antireflection film composition (product name: ARC-29, manufactured by Brewer Science Ltd.) was applied onto an 8-inch silicon wafer using a spinner, and the composition was then baked and dried on a hotplate at 205° C. for 60 seconds, thereby forming an organic antireflection film having a thickness of 82 nm.

Then, the first resist composition solution as a positive resist composition solution for forming a first resist film was applied onto the organic antireflection film using a spinner, and was then prebaked (PAB) and dried on a hotplate at 110° C. for 60 seconds, thereby forming a resist film (the first resist film) having a film thickness of 100 nm.

[Patterning Step (1)]

Subsequently, the first resist film was selectively irradiated with an ArF excimer laser (193 nm) through a mask pattern (6% half tone) targeting a line and space resist pattern with a line width of 120 nm and a pitch of 240 nm, using an ArF exposure apparatus NSR-5302 (manufactured by Nikon Corporation; NA (numerical aperture)=0.60, ⅔ annular illumination).

Thereafter, a post exposure bake (PEB) treatment was conducted at 110° C. for 60 seconds, followed by development for 30 seconds at 23° C. in a 2.38% by weight aqueous solution of tetramethylammonium hydroxide (TMAH) (product name: NMD-3, manufactured by Tokyo Ohka Kogyo Co., Ltd.). Then, the resist film was washed for 30 seconds with pure water, followed by drying by shaking. Then, a bake treatment (post bake) and drying were conducted at 150° C. for 60 seconds, thereby forming a first resist pattern.

In the formation of the first resist pattern, the optimum exposure dose (Eop) for formation of a line and space pattern with a line width of 120 nm and a pitch of 240 nm (hereafter, referred to as "L/S pattern") was 23.0 (mJ/cm$^2$).

When the case where the post bake treatment was conducted at 150° C. for 60 seconds and the case where the post bake treatment was conducted at 100° C. for 60 seconds were compared, it was confirmed that no major differences were observed between the line widths of the formed LS patterns.

[Film Forming Step (2)]

Then, on the silicon wafer where the L/S pattern was formed, each of the positive resist composition solutions obtained in Comparative Examples 2 to 5 and Examples 1 to 10 for forming a second resist film was applied using a spinner, and was then prebaked (PAB) and dried on a hotplate at 120° C. for 60 seconds, thereby forming a positive resist film (the second resist film) having a film thickness of 100 nm.

[Patterning Step (2)]

Subsequently, an open frame exposure (exposure without a mask) was conducted on the second resist film with an ArF excimer laser (193 nm) at an exposure dose of 15.0 (mJ/cm$^2$), using an ArF exposure apparatus NSR-5302 (manufactured by Nikon Corporation; NA (numerical aperture)=0.60, ⅔ annular illumination). Thereafter, a post exposure bake (PEB) treatment was conducted at 90° C. for 60 seconds, followed by development for 30 seconds at 23° C. in a 2.38% by weight aqueous solution of tetramethylammonium hydroxide (TMAH) (product name: NMD-3, manufactured by Tokyo Ohka Kogyo Co., Ltd.). Then, the resist film was washed for 30 seconds with pure water, followed by drying by shaking.

As a result, the second resist film was dissolved in the alkali developing solution and was washed away by the rinsing with water or the like, thereby forming a line and space pattern based on the first resist pattern on the silicon wafer.

Evaluation of Dimensional Variation in the First Resist Pattern

A patterning process was conducted in the same manner as the double patterning process described above except that in the above-mentioned [Patterning step (1)], the first resist film was selectively irradiated with an ArF excimer laser (193 nm) using an ArF exposure apparatus NSR-5302 by setting the exposure conditions at the aforementioned optimum exposure dose (Eop) of 23.0 (mJ/cm$^2$), through a mask pattern (6% half tone) targeting a line and space pattern with a line width of 130 nm and a pitch of 260 nm; a line and space pattern with a line width of 140 nm and a pitch of 280 nm; or a line and space pattern with a line width of 150 nm and a pitch of 300 nm.

In the above-mentioned double patterning process, the line width (a) (nm) of the first resist pattern formed following the [Patterning step (1)] and the line width (b) (nm) of the resist pattern formed following the [Patterning step (2)] were measured using a measuring SEM ((product name: S-9220, manufactured by Hitachi, Ltd.)).

Then the difference between the line width (a) and the line width (b), that is, "(a)-(b)" which indicated the dimensional variation (nm) in the first resist pattern due to the double patterning process was calculated. The results are shown in Table 11.

From the results shown in Table 11, it was confirmed that by employing the method of forming a resist pattern using the positive resist compositions of Examples 1 to 10 as resist compositions for forming a second resist film, adverse effects on the first resist pattern during the double patterning process were minimal, which was comparable to the level achieved when using the positive resist composition of Comparative Example 2 which only contained alcohol-based organic solvents.

When the positive resist compositions of Comparative Examples 3 to 5 were used as resist compositions for forming a second resist film, the first resist patterns were completely dissolved and were washed away in all cases.

Therefore, it is evident that by using the positive resist composition of the present invention for forming a second resist film, a resist pattern can be stably formed by the double patterning process without dissolving the first resist pattern formed on a substrate.

What is claimed is:

1. A positive resist composition comprising:

a base material component (A) which exhibits increased solubility in an alkali developing solution under the action of acid; and an acid generator component (B) which generates acid upon exposure; dissolved in an organic solvent (S), wherein said base material component (A) includes a resin component (A1) having a structural unit (a0) represented by general formula (a0-1) shown below, a structural unit (a1) derived from an acrylate ester containing an acid dissociable, dissolution inhibiting group, a structural unit (a2) derived from an acrylate ester containing a lactone-containing cyclic group and a structural unit (a5) represented by general formula (a5-1) shown below, and said organic solvent (S) includes butoxypropanol, and at least one organic solvent (S2) selected from the group consisting of propylene glycol monomethyl ether acetate, propylene glycol monomethyl ether and cyclohexanone, with the proviso that the amount of butoxypropanol is from 60 to 99% by weight and the amount of the component (S2) is from 1 to 40% by weight within the component (S),

TABLE 11

| Targetted line width (nm) | First resist Second resist | Comp. Ex. 2 | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|---|
| | | First positive resist composition | | | | | | | | | | |
| 120 | Line width (a) | 121.7 | 121.7 | 121.7 | 121.7 | 121.7 | 121.7 | 121.7 | 121.7 | 121.7 | 121.7 | 121.7 | 121.7 |
| | Line width (b) | | 113.6 | 112.6 | 112.0 | 110.7 | 103.3 | 112.4 | 117.1 | 115.0 | 100.5 | 107.8 | 112.1 |
| | (a)-(b) | | 8.1 | 9.1 | 9.7 | 11.0 | 18.4 | 9.3 | 4.6 | 6.7 | 21.2 | 13.9 | 9.6 |
| 130 | Line width (a) | 131.8 | 131.8 | 131.8 | 131.8 | 131.8 | 131.8 | 131.8 | 131.8 | 131.8 | 131.8 | 131.8 | 131.8 |
| | Line width (b) | | 126.4 | 125.0 | 122.6 | 124.5 | 116.7 | 125.3 | 127.6 | 126.6 | 119.1 | 123.4 | 118.5 |
| | (a)-(b) | | 5.4 | 6.8 | 9.2 | 7.3 | 15.1 | 6.5 | 4.2 | 5.2 | 12.7 | 8.4 | 13.3 |
| 140 | Line width (a) | 140.0 | 140.0 | 140.0 | 140.0 | 140.0 | 140.0 | 140.0 | 140.0 | 140.0 | 140.0 | 140.0 | 140.0 |
| | Line width (b) | | 131.2 | 133.2 | 129.6 | 129.6 | 122.5 | 130.4 | 136.0 | 136.4 | 126.4 | 128 | 123.8 |
| | (a)-(b) | | 8.8 | 6.8 | 10.4 | 10.4 | 17.5 | 9.6 | 4.0 | 3.6 | 13.6 | 12.0 | 16.2 |
| 150 | Line width (a) | 150.7 | 150.7 | 150.7 | 150.7 | 150.7 | 150.7 | 150.7 | 150.7 | 150.7 | 150.7 | 150.7 | 150.7 |
| | Line width (b) | | 145.0 | 145.5 | 143.4 | 145.3 | 134.8 | 140.2 | 147.6 | 151.0 | 137.7 | 138.1 | 136.2 |
| | (a)-(b) | | 5.7 | 5.2 | 7.3 | 5.4 | 15.9 | 10.5 | 3.1 | −0.3 | 13.0 | 12.6 | 14.5 |

(a0-1)

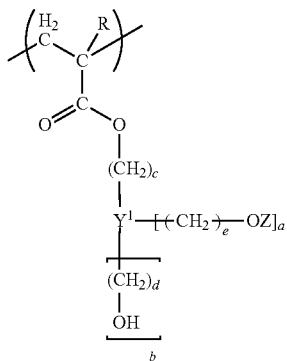

wherein R represents a hydrogen atom, a lower alkyl group of 1 to 5 carbon atoms or a halogenated lower alkyl group of 1 to 5 carbon atoms; $Y^1$ represents an aliphatic hydrocarbon group which may have a substituent; Z represents a monovalent organic group; a represents an integer of 1 to 3, and b represents an integer of 0 to 2, with the provision that a+b=1 to 3; and each of c, d and e independently represents an integer of 0 to 3, (a5-1)

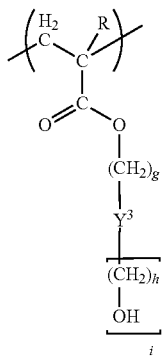

wherein R represents a hydrogen atom, a lower alkyl group of 1 to 5 carbon atoms or a halogenated lower alkyl group of 1 to 5 carbon atoms; $Y^3$ represents an aliphatic hydrocarbon group which may have a substituent; each of g and h independently represents an integer of 0 to 3; and i represents an integer of 1 to 3.

2. The positive resist composition according to claim 1 which is used for forming a second resist film in a method of forming a positive resist pattern, the method comprising:
applying a positive resist composition to a substrate to form a first resist film on the substrate;
subjecting the first resist film to selective exposure and alkali developing to form a first resist pattern;
applying a positive resist composition on the substrate on which the first resist pattern is formed to form a second resist film; and
subjecting the second resist film to selective exposure and alkali developing to form a resist pattern.

3. The positive resist composition according to claim 1, wherein the amount of said structural unit (a0) based on the combined total of all structural units constituting said resin component (A1) is within a range from 10 to 50 mol %.

4. The positive resist composition according to claim 1, wherein the amount of said structural unit (a1) based on the combined total of all structural units constituting said resin component (A1) is within a range from 10 to 60 mol %.

5. The positive resist composition according to claim 1, wherein the amount of said structural unit (a2) based on the combined total of all structural units constituting said resin component (A1) is within a range from 5 to 35 mol %.

6. The positive resist composition according to claim 1, wherein the amount of said structural unit (a5) based on the combined total of all structural units constituting said resin component (A1) is within a range from 10 to 30 mol %.

7. The positive resist composition according to claim 1, which further comprises a nitrogen-containing organic compound (D).

8. A method of forming a resist pattern comprising:
applying a positive resist composition on a substrate to form a first resist film on the substrate;
subjecting the first resist film to selective exposure and alkali developing to form a first resist pattern;
applying a positive resist composition on the substrate on which the first resist pattern is formed to form a second resist film; and
subjecting the second resist film to selective exposure and alkali developing to form a resist pattern,
wherein the positive resist composition for the second resist film comprises:
a base material component (A) which exhibits increased solubility in an alkali developing solution under the action of acid; and
an acid generator component (B) which generates acid upon exposure; dissolved in an organic solvent (S),
wherein said base material component (A) includes a resin component (A1) having a structural unit (a0) represented by general formula (a0-1) shown below, a structural unit (a1) derived from an acrylate ester containing an acid dissociable, dissolution inhibiting group, a structural unit (a2) derived from an acrylate ester containing a lactone-containing cyclic group and a structural unit (a5) represented by general formula (a5-1) shown below, and
wherein said organic solvent (S) includes an alcohol-based organic solvent (S1) and at least one organic solvent (S2) selected from the group consisting of propylene glycol monomethyl ether acetate, propylene glycol monomethyl ether and cyclohexanone, with the proviso that the amount of the component (S1) is from 60 to 99% by weight and the amount of the component (S2) is from 1 to 40% by weight within the component (S),

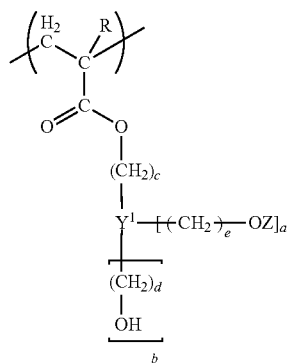

(a0-1)

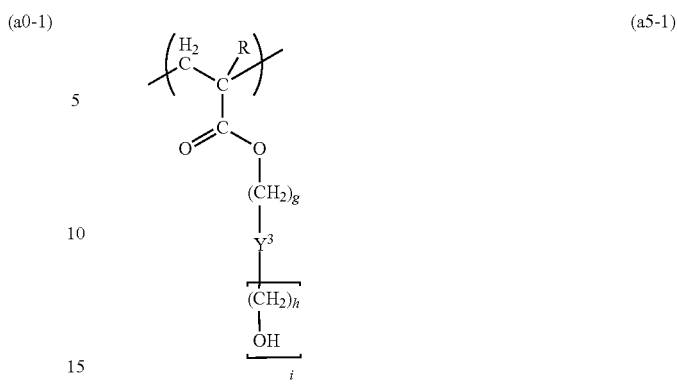

(a5-1)

wherein R represents a hydrogen atom, a lower alkyl group of 1 to 5 carbon atoms or a halogenated lower alkyl group of 1 to 5 carbon atoms; $Y^1$ represents an aliphatic hydrocarbon group which may have a substituent; Z represents a monovalent organic group; a represents an integer of 1 to 3, and b represents an integer of 0 to 2, with the provision that a+b=1 to 3; and each of c, d and e independently represents an integer of 0 to 3, wherein R represents a hydrogen atom, a lower alkyl group of 1 to 5 carbon atoms or a halogenated lower alkyl group of 1 to 5 carbon atoms; $Y^3$ represents an aliphatic hydrocarbon group which may have a substituent; each of g and h independently represents an integer of 0 to 3; and i represents an integer of 1 to 3.

* * * * *